United States Patent
Tani et al.

(10) Patent No.: US 9,780,322 B2
(45) Date of Patent: Oct. 3, 2017

(54) ORGANIC ELECTROLUMINESCENT ELEMENT

(71) Applicant: Konica Minolta, Inc., Tokyo (JP)

(72) Inventors: Kunio Tani, Hachioji (JP); Eisaku Katoh, Hachioji (JP); Hiroto Ito, Yokohama (JP); Kunimasa Hiyama, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 771 days.

(21) Appl. No.: 14/352,472

(22) PCT Filed: Oct. 2, 2012

(86) PCT No.: PCT/JP2012/075508
§ 371 (c)(1),
(2) Date: Apr. 17, 2014

(87) PCT Pub. No.: WO2013/058098
PCT Pub. Date: Apr. 25, 2013

(65) Prior Publication Data
US 2014/0339529 A1 Nov. 20, 2014

(30) Foreign Application Priority Data

Oct. 21, 2011 (JP) ................................. 2011-231404

(51) Int. Cl.
| | |
|---|---|
| H01L 51/54 | (2006.01) |
| H01L 51/50 | (2006.01) |
| C09K 11/06 | (2006.01) |
| H05B 33/10 | (2006.01) |
| H01L 51/00 | (2006.01) |

(52) U.S. Cl.
CPC .......... *H01L 51/5064* (2013.01); *C09K 11/06* (2013.01); *H01L 51/0072* (2013.01); *H01L 51/0073* (2013.01); *H01L 51/0085* (2013.01); *H01L 51/5004* (2013.01); *H01L 51/5016* (2013.01); *H01L 51/5072* (2013.01); *H01L 51/5088* (2013.01); *H05B 33/10* (2013.01); *C09K 2211/1007* (2013.01); *C09K 2211/1011* (2013.01); *C09K 2211/1029* (2013.01); *C09K 2211/1033* (2013.01); *C09K 2211/1044* (2013.01); *C09K 2211/1059* (2013.01); *C09K 2211/1088* (2013.01); *C09K 2211/1092* (2013.01); *C09K 2211/185* (2013.01); *H01L 51/0059* (2013.01); *H01L 51/0094* (2013.01); *H01L 2251/55* (2013.01)

(58) Field of Classification Search
CPC .................................................. H01L 51/5064
See application file for complete search history.

(56) References Cited

U.S. PATENT DOCUMENTS

| | | | | |
|---|---|---|---|---|
| 6,097,147 | A | 8/2000 | Baldo et al. | |
| 2003/0209972 | A1* | 11/2003 | Holmes et al. | ........... H01S 5/36 313/504 |
| 2004/0004215 | A1* | 1/2004 | Iechi et al. | .......... H01L 51/5296 257/40 |
| 2011/0057559 | A1 | 3/2011 | Xia et al. | |
| 2012/0326141 | A1* | 12/2012 | Pflumm et al. | ........ C09K 11/06 257/40 |
| 2013/0241400 | A1* | 9/2013 | Kwong et al. | ....... C07D 405/14 313/504 |
| 2013/0241401 | A1* | 9/2013 | Kwong et al. | ....... C07D 405/04 313/504 |

FOREIGN PATENT DOCUMENTS

| | | |
|---|---|---|
| JP | 2005-112765 A | 4/2005 |
| JP | 2005-294187 | 10/2005 |
| JP | 2008-542203 A | 11/2008 |
| JP | 2010-040830 A | 2/2010 |
| JP | 2010-114180 A | 5/2010 |
| WO | WO 2008/035571 A1 | 3/2008 |
| WO | WO 2009/008367 A1 | 1/2009 |
| WO | WO 2009/041635 A1 | 4/2009 |

OTHER PUBLICATIONS

International Preliminary Report on Patentability and Written Opinion, International Application No. PCT/JP2012/075508. Dated Apr. 22, 2014 (Apr. 22, 2014) in Japanese and English (total of 9 pages).

(Continued)

*Primary Examiner* — Marie R. Yamnitzky
(74) *Attorney, Agent, or Firm* — Lucas & Mercanti, LLP

(57) ABSTRACT

An organic electroluminescent element includes a hole injection layer (HI), a first hole transport layer (HT1), a second hole transport layer (HT2), and a light-emitting layer containing a host compound (H) and a phosphorescence emitting dopant compound (D), which are laminated in this order, between and an anode and a cathode. The phosphorescence emitting dopant compound has a partial structure represented by Formula (1):

[Chemical Formula 1]

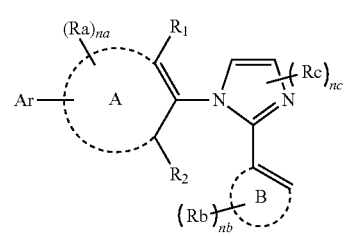

Formula(1)

The "highest occupied molecular orbital" HOMO of the second hole transport layer satisfies the expression: −5.4<HOMO (HT2)<−4.8; and the relationship of triplet excitation energies (T1) between the phosphorescence emitting dopant compound and a hole transport material contained in the second hole transport layer satisfies the expression: T1 (HT2)−T1 (D)≥0.1.

13 Claims, 5 Drawing Sheets

(56) References Cited

OTHER PUBLICATIONS

M.A. Baldo, et al; Highly efficient phosphorescent emission from organic . . . ; Nature; vol. 395; Sep. 1998; pp. 151-154.
M.A. Baldo, et al; High-efficiency fluorescent organic light-emittingdevices using a . . . ; Nature; vol. 403; Feb. 2000; pp. 750-753.
S. Lamansky, et al; Highly phosphorescent bis-cyciometalated iridium complexes: synthesis . . . ; J. Am. Chem. Soc.; 2001; vol. 123; pp. 4304-4312.

* cited by examiner

ORGANIC ELECTROLUMINESCENT ELEMENT

CROSS-REFERENCE TO RELATED APPLICATION

This Application is a 371 of PCT/JP2012/075508 filed on Oct. 2, 2012 which, in turn, claimed the priority of Japanese Patent Application No. JP2011-231404 filed on Oct. 21, 2011 both applications are incorporated herein by reference.

TECHNICAL FIELD

The present invention relates to an organic electroluminescent element.

BACKGROUND ART

An organic electroluminescent element (hereinafter, also referred to as an organic EL element) has a structure including a light emitting layer, which is composed of a light emitting compound, and a cathode and an anode which sandwich the light emitting layer. The organic EL element emits light (fluorescence or phosphorescence) generated as a result of deactivation of excitons formed by the recombination of holes and electrons injected in the light emitting layer from the anode and the cathode, respectively, in an applied electric field. The organic EL element is an entire solid element including a layer of organic material having a thickness of several sub-microns between the electrodes, and can emit light at a voltage of only several to several tens volts. Accordingly, the organic EL element is expected to be used in next-generation flat displays or illuminations.

On development of organic EL elements for practical use, an organic EL element involving phosphorescence emission from an excited triplet state was reported by Princeton University (refer to, for example, Non-Patent Literature 1). Studies on materials exhibiting phosphorescence at room temperature have become more active since then (refer to, for example, Patent Literature 1 and Non-Patent Literature 2).

Furthermore, an organic EL element involving recently discovered phosphorescence emission has a light emitting efficiency, in principle, about four times higher than that of the element involving conventional fluorescence emission, leading to not only development of materials but also worldwide research and development on layer structures and electrodes for the organic EL element. For example, many compounds, primarily heavy metal complexes, such as iridium complexes, have been synthesized and investigated (refer to, for example, Non-Patent Literature 3).

Although such system has significantly high potential, quite unlike the organic EL devices utilizing fluorescence emission, the organic EL devices utilizing phosphorescence emission has an important technical problem which is to control the position of the emission center, in particular to achieve recombination and stable light-emission inside the light emitting layer, from the viewpoint of efficiency and lifetime of the elements.

Nowadays, there are well known multilayer elements each including a hole transport layer (located on an anode side of a light emitting layer) and an electron transport layer (located on an cathode side of the light emitting layer) which adjoin the light emitting layer (refer to, for example, Patent Literature 2). Mixture layers using host compounds and phosphorescence emitting compounds as dopants have been widely used for light emitting layers.

Requirements for application of organic EL elements to displays and illuminations are highly stable chromaticity for environmental temperature in the case that the organic EL element continuously emits light for long hours, the case that the organic EL element is under high temperature and high humidity, or other cases. In applications to illumination light sources, the demand for the stability of the emission color is especially severe. Accordingly, it is an important issue how to ensure stable chromaticity in order to put the organic EL element into practice in the illumination light sources.

Metal complexes having specific ligands have been recently disclosed as blue phosphorescence emitting compounds having high potentiality in Patent Literature 3. Patent Literature 3 also discloses dibenzofuran and dibenzothiophene derivatives as host compounds which are used together with blue phosphorescence emitting compounds and are combined with conventional hole transport layers and electron transport materials. Unfortunately, the organic EL element composed of metal complexes as described in Patent Literature 3 is still insufficient in light emitting efficiency, lifetime and stable chromaticity.

For example, Patent Literature 4 discloses a method of providing an element having high efficiency achieved by electron blocking of a hole transport layer composed of laminated hole transport sublayers, of which the hole transport sublayer closest to the light emitting layer contains a carbazole derivative, dibenzofuran derivative, dibenzothiophene derivative, or fluorene derivative of triphenylamine.

Patent Literature 5 discloses a method for reducing the degree of hole injection to a light emitting layer by defining the structure, the mobility, and the HOMO level of the hole injection layer to provide an element with high efficiency and long lifetime.

CITATION LIST

Patent Literature

Patent Literature 1: U.S. Pat. No. 6,097,147
Patent Literature 2: Japanese Patent Application Laid-open No. 2005-112765
Patent Literature 3: U.S. Patent Publication No. 2011/0057559
Patent Literature 4: WO 2009/041635
Patent Literature 5: Japanese Patent Application Laid-open No. 2005-294187

Non Patent Literature

Non-Patent Literature 1: M. A. Baldo et al., Nature 395, 151-154 (1998)
Non-Patent Literature 2: M. A. Baldo et al., Nature 403 (17) 750-753 (2000)
Non-Patent Literature 3: S. Lamansky et al., J. Am. Chem. Soc., vol. 123, p. 4304 (2001)

SUMMARY OF THE INVENTION

Problem to be Solved by the Invention

In Patent Literature 3, the efficiency and lifetime of light emission have still room for improvement, and no description is found on stable chromaticity over time, which is required for application in the illumination field. No example white element is disclosed.

An object of the present invention, which has been made in view of the above circumstances, is to provide an organic electroluminescent element having high light emitting efficiency, a long emission lifetime and highly stable chromaticity over time.

Means to Solve the Problem

Aspect 1 of the present invention provides an organic electroluminescent element comprising a hole injection layer (HI), a first hole transport layer (HT1), a second hole transport layer (HT2), and light emitting layer containing a host compound (H) and a phosphorescence emitting dopant compound (D), which are laminated in this order, between an anode and a cathode;

wherein the phosphorescence emitting dopant compound has a partial structure represented by Formula (1);

the "highest occupied molecular orbital" HOMO of the second hole transport layer satisfies the expression: −5.4<HOMO (HT2)<−4.8; and the relationship of triplet excitation energies between the phosphorescence emitting dopant compound and a hole transport material contained in the second hole transport layer satisfies the expression: T1 (HT2)−T1 (D)>0.1.

[Chemical Formula 1]

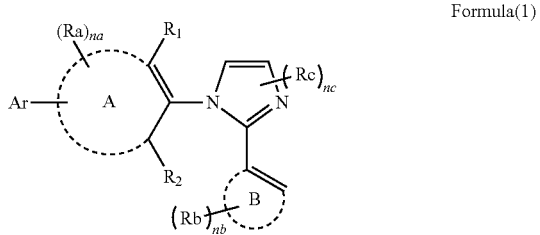

Formula(1)

where Ring A and Ring B each represent a five- or six-membered aromatic cyclic hydrocarbon or aromatic heterocycle; Ar represents an aromatic cyclic hydrocarbon, an aromatic heterocycle, a non-aromatic cyclic hydrocarbon, or a non-aromatic heterocycle. $R_1$ and $R_2$ each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group; the groups may each have a substituent; and at least one of $R_1$ and $R_2$ is an alkyl group having 2 or more carbon atoms or a cycloalkyl group.

Ra, Rb and Rc each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group; the groups may each have a substituent; na and nc each represent 1 or 2; and nb represents an integer of 1 to 4.

Aspect 2 of the present invention provides the organic electroluminescent element of Aspect 1, wherein the relationship of the HOMOs between the first hole transport layer (HT1) and the second hole transport layer (HT2) satisfies the expression: −0.5<HOMO (HT2)−HOMO (HT1)<−0.1.

Aspect 3 of the present invention provides the organic electroluminescent element of Aspect 1 or 2, wherein the hole transport material used in the second hole transport layer is represented by Formula (2):

where X and Y each represent O, S, or N—R (R represents a hydrogen atom or a substituent), and $A_1$ and $A_2$ each represent a hydrogen atom or a substituent. $L_1$ and $L_2$ each represent a divalent linking group; n represents an integer of 1 or more, n1 and n2 represent an integer 0 or more, and n3 and n4 each represent 0 or 1 (where n1+n2≥2).

Aspect 4 of the present invention provides the organic electroluminescent element of any one of Aspects 1 to 3, further comprising an electron transport layer (ET) provided at least between the light emitting layer and the cathode, wherein the relationship of the "lowest unoccupied molecular orbit" LUMOs between the host compound and an electron transport material contained in the electron transport layer satisfies the expression: −0.4<LUMO (H)−LUMO (ET)<0.8.

Aspect 5 of the present invention provides the organic electroluminescent element of Aspect 4, wherein the electron transport material is represented by Formula (3):

[Chemical Formula 3]

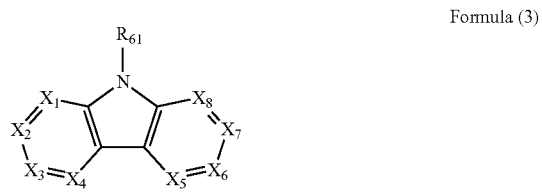

Formula (3)

where $R_{61}$ represents a hydrogen atom, an alkyl group, an aryl group, or a heteroaryl group, and $X_1$ to $X_8$ each represent N or —$CR_{62}$, and $R_{62}$ represents a hydrogen atom, an alkyl group, an aryl group or a heteroaryl group.

Aspect 6 of the present invention provides the organic electroluminescent element of Aspect 4, wherein the electron transport material is represented by Formula (4):

[Chemical Formula 4]

Formula (4)

where A represents Li, Be or Al.

Aspect 7 of the present invention provides the organic electroluminescent element of any one of Aspects 1 to 6, wherein $R_1$ and $R_2$ in Formula (1) each represent an alkyl group having 2 or more carbon atoms or a cycloalkyl group.

Aspect 8 of the present invention provides the organic electroluminescent element of any one of Aspects 1 to 6,

[Chemical Formula 2]

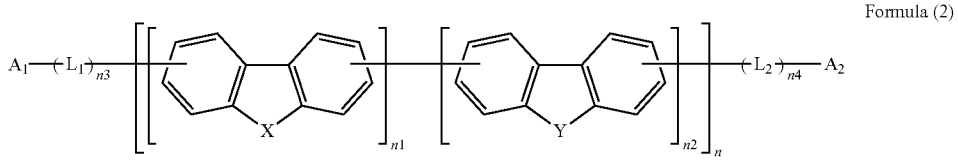

Formula (2)

wherein at least one of $R_1$ and $R_2$ in Formula (1) is a branched alkyl group having 3 or more carbon atoms.

Aspect 9 of the present invention provides the organic electroluminescent element of any one of Aspects 1 to 6, wherein both $R_1$ and $R_2$ in Formula (1) represent a branched alkyl group having 3 or more carbon atoms.

Aspect 10 of the present invention provides the organic electroluminescent element of any one of Aspects 1 to 9, wherein Ring B in Formula (1) is a benzene ring.

Aspect 11 of the present invention provides the organic electroluminescent element of any one of Aspects 1 to 10, wherein Ar in Formula (1) is a benzene ring.

Aspect 12 of the present invention provides the organic electroluminescent element of any one of Aspects 1 to 11, wherein Formula (1) is represented by Formula (1-1):

[Chemical Formula 5]

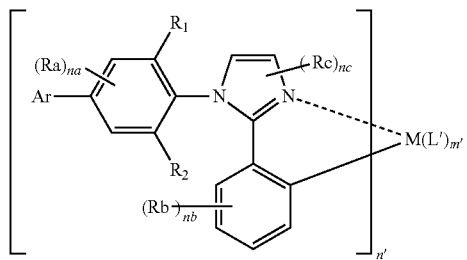

Formula (1-1)

where Ar represents an aromatic cyclic hydrocarbon, aromatic heterocycle, non-aromatic cyclic hydrocarbon, or non-aromatic heterocycle. $R_1$ and $R_2$ each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group or a non-aromatic heterocycle group; the groups may each have a substituent; and at least one of $R_1$ and $R_2$ is an alkyl group having 2 or more carbon atoms or a cycloalkyl group.

Ra, Rb and Rc each independently represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group or a non-aromatic heterocycle group, the groups may each have a substituent; na and nc represent 1 or 2, and nb represents an integer of 1 to 4.

L' represents one or more monoanionic bidentate ligands which are coordinated with M; M represents a transition metal atom having an atomic number of 40 or more and belonging to groups 8 to 10 in the periodic table; m' represents an integer of 0 to 2, n' represents at least 1, and m'+n' is equal to 2 or 3.

Aspect 13 of the present invention provides the organic electroluminescent element of any one of Aspects 1 to 12, wherein the organic electroluminescent element emits white light.

Advantageous Effects of the Invention

The present invention can provide an organic electroluminescent element having highly stable chromaticity over time, high light emitting efficiency, and a long emission lifetime.

EMBODIMENTS OF THE INVENTION

Figure 1:
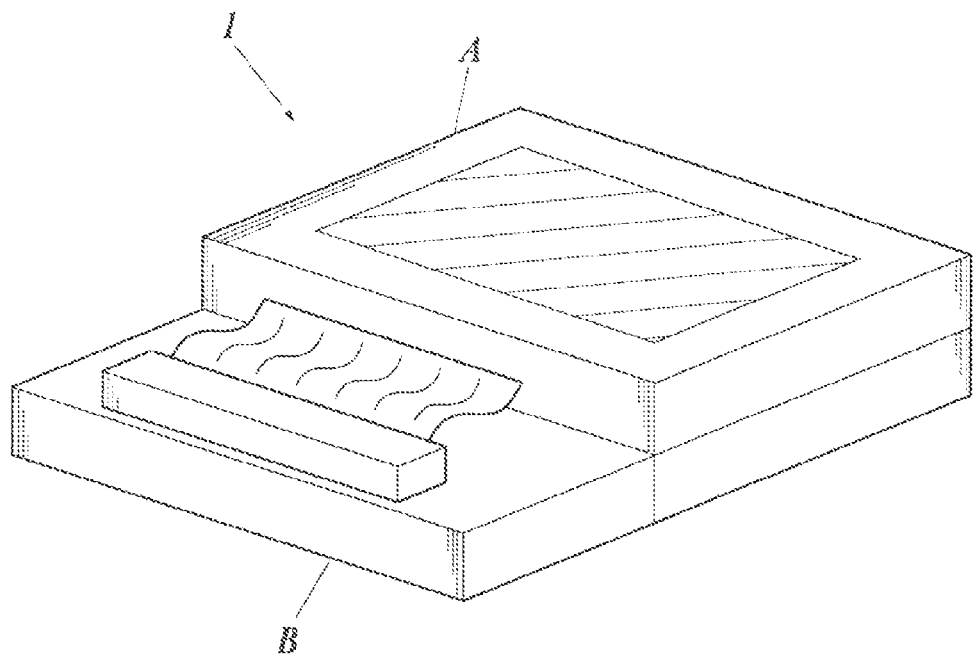
FIG. 1 is a schematic view of an example display device including an organic EL element.

The preferred embodiments to carry out the present invention will be described in detail below, but the present invention should not be limited to these embodiments.

In the present invention, further improved efficiency, lifetime, and stable chromaticity over time are achieved by using a metal complex dopant having high efficiency and a long lifetime represented by Formula (1), making a hole transport layer include multiple layers, and using a compound having a specific energy level and structure as the second transport layer. It is assumed that a low probability of recombination due to high hole trapping characteristics of a compound of Formula (1) causes low light emitting efficiency and electron flow into the hole transport layer, resulting in a short lifetime. The control of the HOMO value by the second hole transport layer of the present invention is believed to reduce the hole trapping characteristics to expand the light emitting area, leading to the improvement in efficiency, lifetime, and stable chromaticity.

<Energy Levels of HOMO and LUMO>

LUMO and HOMO are calculated in the following manner: The structural optimization of a target molecular structure is carried out with Gaussian 03 (Gaussian 03, Revision D02, M. J. Frisch, et al, Gaussian, Inc., Wallingford Conn., 2004), which is molecular orbital calculation software, manufactured by Gaussian Co. (USA), using B3LYP/6-31G* as a key word in the case of a host compound, a hole transport material, and an electron transport material, and using B3LYP/LanL2DZ in the case of a phosphorescence emitting dopant compound to calculate the LUMO and HOMO (in terms of corresponding eV unit). This calculated value is reliable because the calculated values are known to have a high correlation with the experimental values.

<Excited Triplet Energy T1>

The value T1 is calculated by TDDFT with the conditions of the functional and basis function applied to the host compounds or the dopant compounds with respect to the optimized structures for calculation of the above-described energy level of LUMO.

The compounds of the present invention will now be described below.

<Phosphorescence Emitting Dopant Compound Represented by Formula (1)>

[Chemical Formula 6]

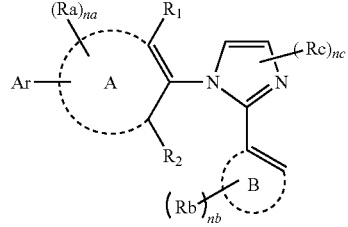

Formula (1)

where Ring A and Ring B each represent a five- or six-membered aromatic cyclic hydrocarbon or aromatic heterocycle; Ar represents an aromatic cyclic hydrocarbon, an aromatic heterocycle, a non-aromatic cyclic hydrocarbon, or a non-aromatic heterocycle; $R_1$ and $R_2$ each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group; these groups may each have a substituent; and at least one of $R_1$ and $R_2$ is an alkyl group having 2 or more carbon atoms or a cycloalkyl group.

Ra, Rb and Rc each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group; these groups may each have a substituent; na and nc each represent an integer of 1 or 2; and nb represents an integer of 1 to 4.

In Formula (1), an example of the 5- or 6-membered aromatic cyclic hydrocarbon represented by Ring A or Ring B is a benzene ring.

In Formula (1), examples of the 5- or 6-membered aromatic cyclic hydrocarbon represented by Ring A or B include a furan ring, a thiophene ring, an oxazole ring, a pyrrole ring, a pyridine ring, a pyridazine ring, a pyrimidine ring, a pyrazine ring a triazine ring, an oxadiazole ring a triazole ring, an imidazole ring, a pyrazole ring, and a thiazole ring. More preferably, Ring B is a benzene ring, and most preferably, Ring A is a benzene ring.

In Formula (1), examples of the aromatic cyclic hydrocarbon represented by Ar include a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoanthene ring, a naphthacene ring, a pentacene ring, a perylene ring, a pentaphene ring, a picene ring, a pyrene ring, a pyranthrene ring, and an anthraanthrene ring.

In Formula (1), examples of an aromatic heterocycle represented by Ar include a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring a pyrazole ring, a thiazole ring, an indole ring, a benzimidazole ring, a benzothiazole ring, a benzoxazole ring, a quinoxaline ring, a quinazoline ring, a phthalazine ring, a thienothiophene ring, a carbazole ring, an azacarbazole ring (indicating a ring in which any one or more carbon atoms constituting the carbazole ring is replaced with one or more nitrogen atoms), a dibenzosilole ring, a dibenzofuran ring, a dibenzothiophene ring, a ring in which any one or more carbon atoms constituting the benzothiophene or dibenzofuran ring are replaced with one or nitrogen atoms, a benzodifuran ring, a benzodithiopbene ring, an acridine ring, a benzoquinoline ring, a phenazine ring, a phenanthridine ring, a phenanthroline ring, a cycladiene ring, a quindoline ring, a thebenidine ring, a quinindoline ring, a triphenodithiazine ring, a triphenodioxazine ring, a phenanthrazine ring, and anthrazine ring, a perimidine ring, a naphthofuran ring, a naphthothiophene ring, a naphthodifuran ring, a naphthodithiophene ring, an anthrafuran ring, an anthradifuran ring, an anthathiophene ring, anthradithiophene ring, a thianthrene ring, a phenoxathiine ring, a dibenzocarbazole ring, an indrocarbazole ring and a dithienobenzene ring.

In Formula (1), examples of the non-aromatic cyclic hydrocarbon represented by Ar include cycloalkanes (e.g., a cyclopentane ring and a cyclohexane ring), cycloalkoxy groups (e.g., a cyclopentyloxy group and a cyclohexyloxy group), cycloalkylthio groups (e.g., a cyclopentylthio group and a cyclohexylthio group), a cyclohexylaminosulfonyl group, a tetrahydronaphthalene ring, a 9,10-dihydroanthracene ring, and a biphenylene ring.

In Formula (1), examples of a non-aromatic heterocycle represented by Ar include an epoxy ring, an aziridine ring, a thiirane ring, an oxetane ring, an azetidine ring, a thiethane ring, a tetrahydrofuran ring, a dioxolane ring, a pyrolidine ring, a pyrazolidine ring, an imidazolidine ring, an oxazolidine ring, a tetrahydrothiophene ring, a sulfolane ring, a thiazolidine ring, an ϵ-caprolactone ring, an ϵ-caprolactam ring, a piperidine ring, a hexahydropyridazine ring, a hexahydropyrimidine ring, a piparazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, a phenoxazine ring, a phenothiazine ring, an oxanthrene ring, a thioxanthene ring, and a phenoxathiin ring.

In Formula (1), these rings represented by Ar may each have a substituent represented by R' or R" in Formula (H2), which will be described later, and a plurality of substituents may be further joined to form a ring.

Preferably, Ar is an aromatic cyclic hydrocarbon or an aromatic heterocycle, more preferably, Ar is an aromatic cyclic hydrocarbon, and still more preferably, Ar is a benzene ring.

In Formula (1), $R_1$ and $R_2$ each independently represent a hydrogen atom, a halogen atom, a cyano group, an alkyl group, an alkenyl group, an alkynyl group, an alkoxy group, an amino group, a silyl group, an arylalkyl group, an aryl group, a hetero aryl group, a non-aromatic cyclic hydrocarbon group, or non-aromatic heterocycle group; these groups may each have a substituent; and at least one of $R_1$ and $R_2$ represents an alkyl group having 2 or more carbon atoms or a cycloalkyl group.

In Formula (1), the aryl group and the heteroaryl group represented by $R_1$ and $R_2$ each include a monovalent group derived from an aromatic cyclic hydrocarbon or an aromatic heterocycle represented by Ar in Formula (1). In Formula (1), the non-aromatic cyclic hydrocarbon group and non-aromatic heterocycle group represented by $R_1$ and $R_2$ each include monovalent groups derived from a non-aromatic cyclic hydrocarbon or a non-aromatic heterocycle represented by Ar in Formula (1).

Preferably, $R_1$ and $R_2$ are each an alkyl group having 2 or more carbon atoms or a cycloalkyl group. Furthermore, at least one of $R_1$ and $R_2$ represents preferably a branched alkyl group having 3 or more carbon atoms. More preferably, $R_1$ and $R_2$ each represent a branched alkyl group having 3 or more carbon atoms.

In Formula (1), Ra, Rb, and Rc each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group. These groups may each have a substituent.

In Formula (1), the aryl group and the heteroaryl group represented by Ra, Rb, and Rc include monovalent groups derived from aromatic cyclic hydrocarbons or aromatic heterocycles represented by Ar in Formula (1).

In Formula (1), the non-aromatic cyclic hydrocarbon group and the non-aromatic heterocycle group represented by Ra, Rb, and Rc include monovalent groups derived from a non-aromatic cyclic hydrocarbon or non-aromatic heterocycle represented by Ar in Formula (1).

In Formula (1), na and nc each represent an integer of 1 or 2, and nb represents an integer of 1 to 4.

<Phosphorescence Emitting Dopant Compound Represented by Formula (1-1)>

[Chemical Formula 7]

Formula (1-1)

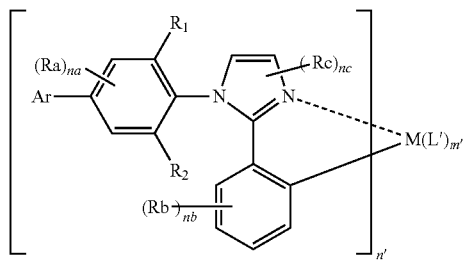

In Formula (1-1), Ar, $R_1$, $R_2$, Ra, Rb, Rc, na, nb, and nc each are synonymous with Ar, $R_1$, $R_2$, Ra, Rb, Rc, na, nb, and nc in Formula (1), respectively.

In Formula (1-1), specific examples of the monoanionic bidentate ligand coordinated with M represented by L' include ligands having the following structures:

[Chemical Formula 8]

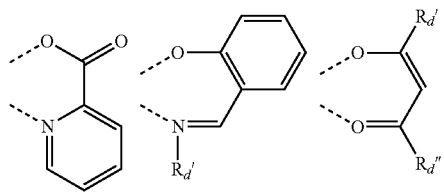

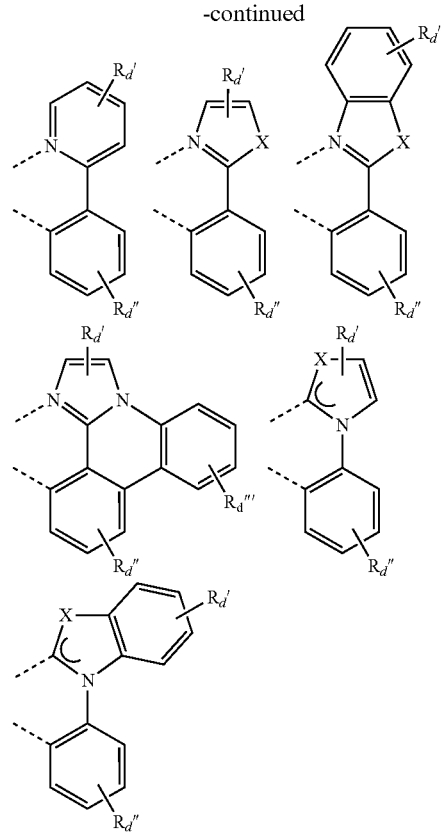

In the formula, Rd', Rd", and Rd'" each represent a hydrogen atom or a substituent; the substituents represented by Rd', Rd", and Rd'" include the same groups as substituent Rx represented by Ar in Formula (1).

In Formula (1-1), M represents a transition metal atom having an atomic number of 40 or more and belonging to groups 8 to 10 in the periodic table. In particular, M is preferably Os, Ir, or Pt, and more preferably M is Ir.

In Formula (1-1), m' represents an integer of 0 to 2, n' represents at least 1, and m'+n' is equal to 2 or 3. Preferably, n' represents 3 or 2, and m' represents 0.

The compounds represented by Formulae (1) and (1-1) of the present invention can be synthesized by any known method described, for example, in WO 2006/121811.

Hereinafter specific examples of the dopant compound preferably used in the present invention are shown, though the present invention is not limited to those:

[Chemical Formula 9]

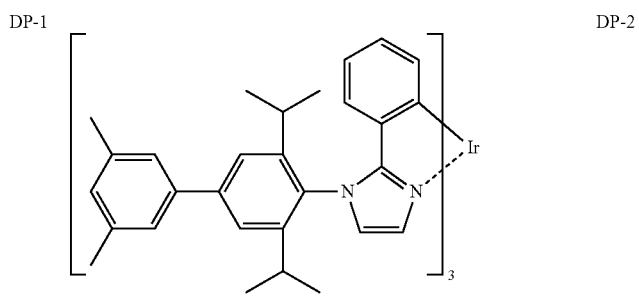

-continued
DP-3
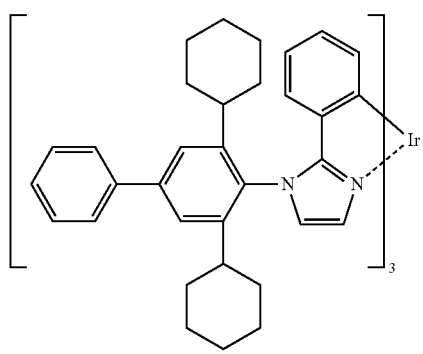
DP-4
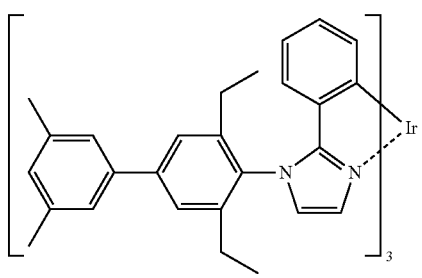
DP-5
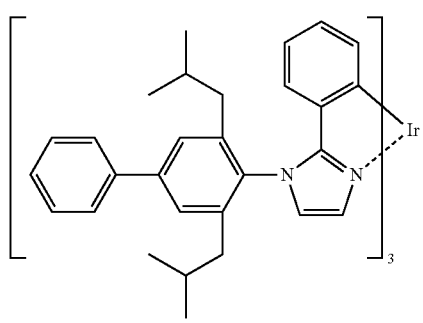
DP-6
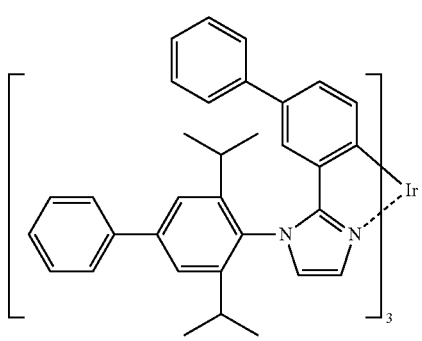
DP-7
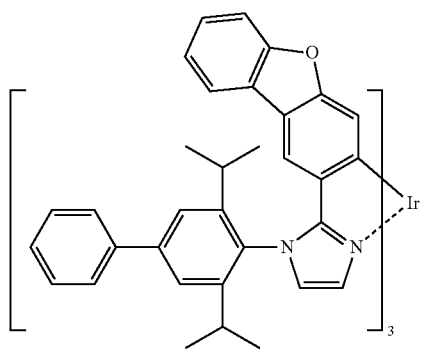
DP-8
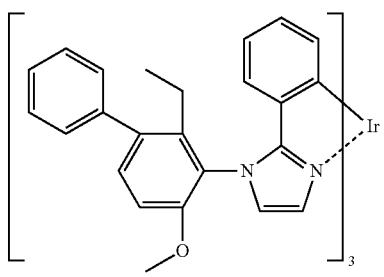
[Chemical Formula 10]
DP-9
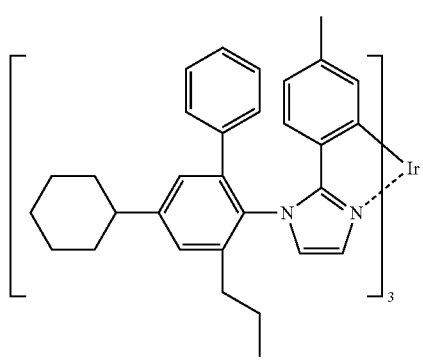
DP-10
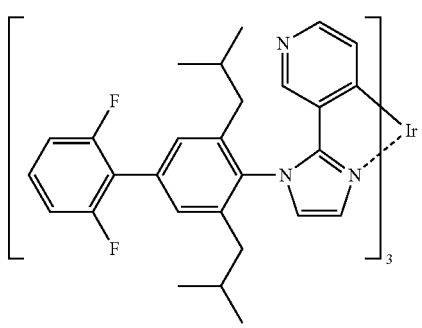

DP-11
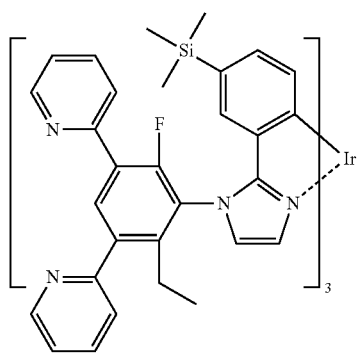
DP-12
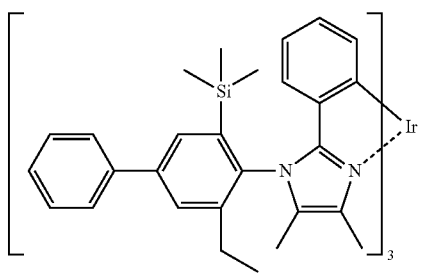
DP-13
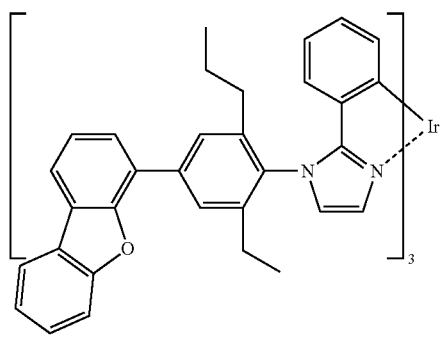
DP-14
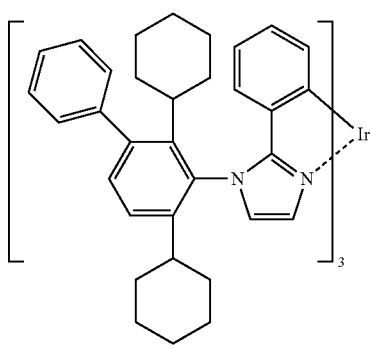
DP-15
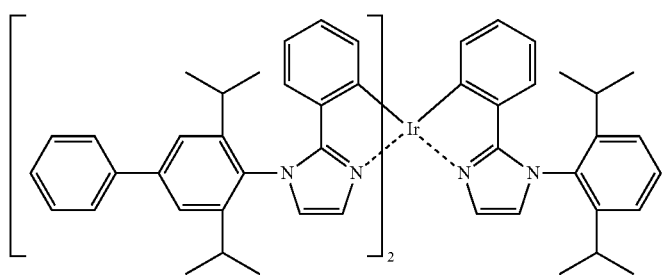
[Chemical Formula 11]
DP-16
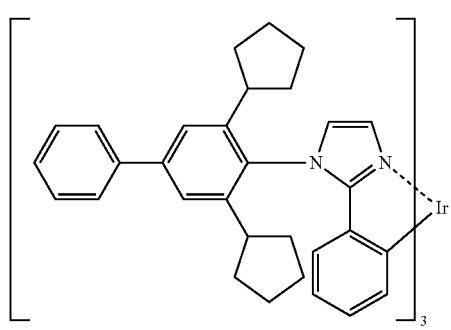
DP-17
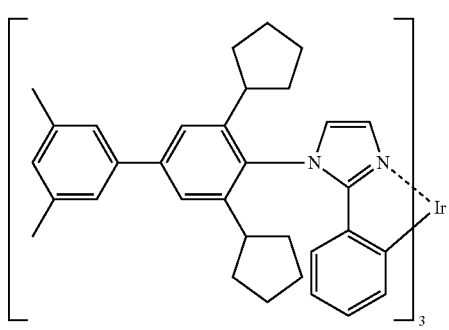

-continued
DP-18 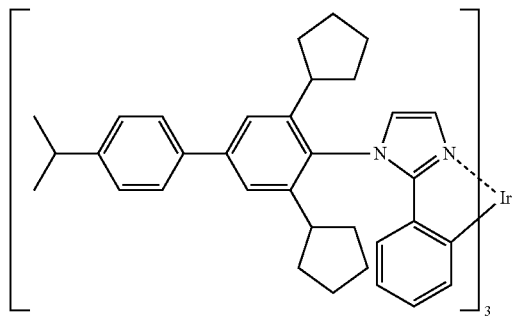
DP-19 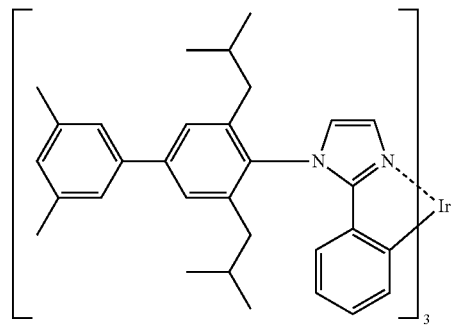
DP-20 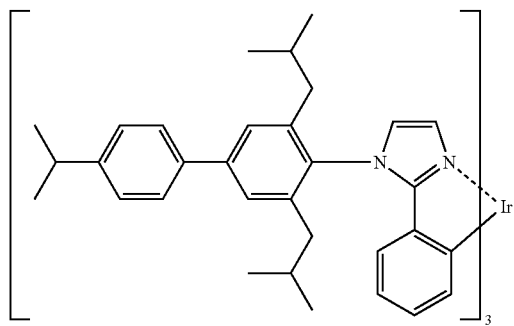
DP-21 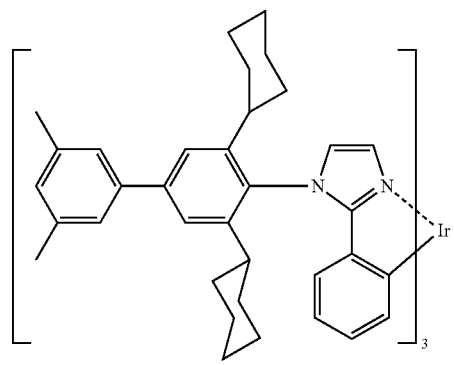
DP-22 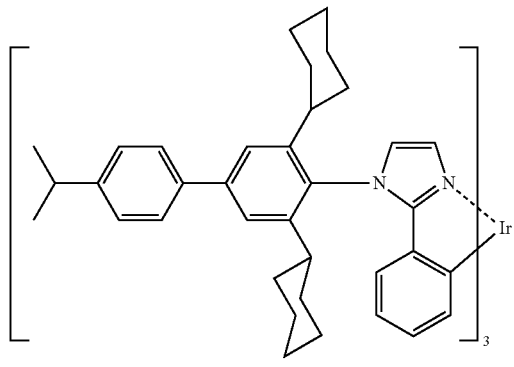
DP-23 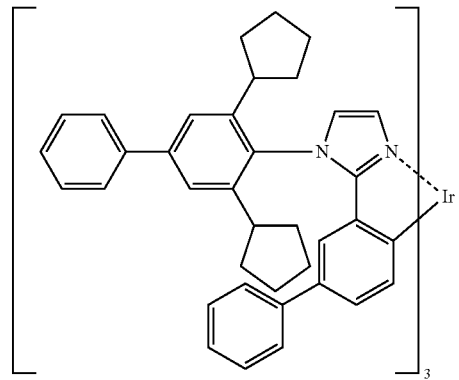

[Chemical Formula 12]
-continued
DP-24
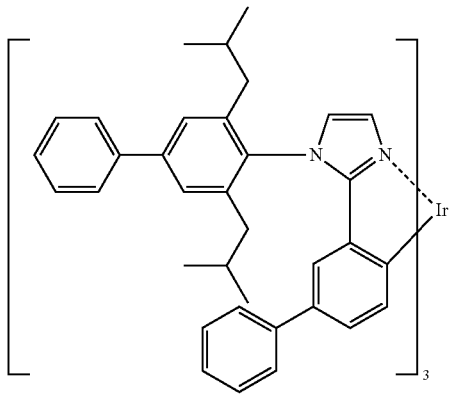
DP-25
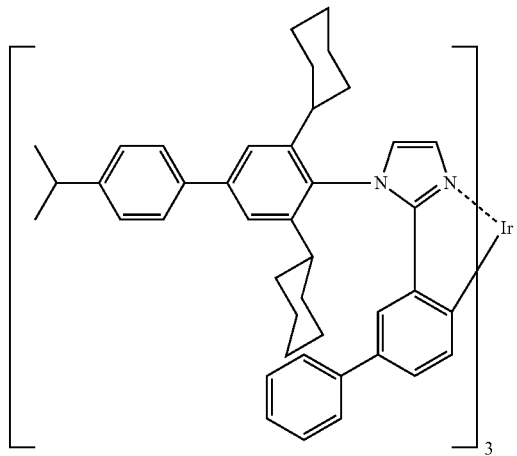
DP-26
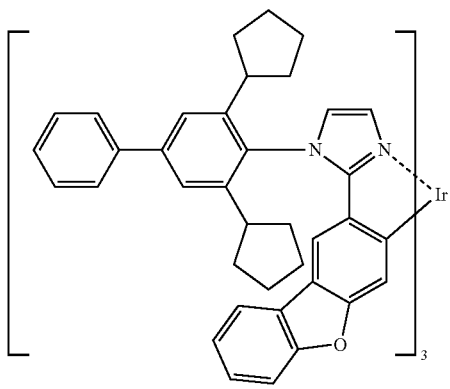
DP-27
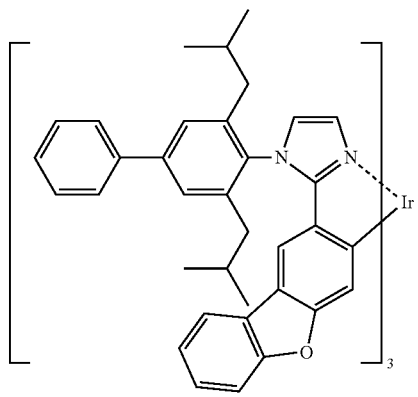
DP-28
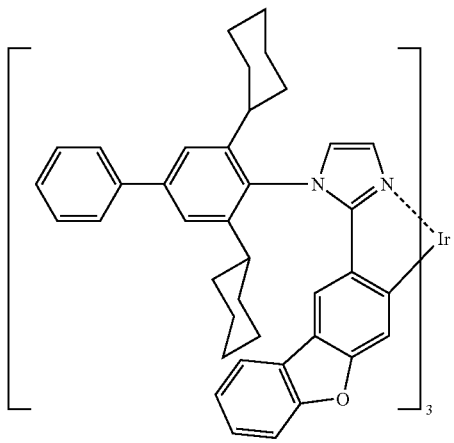
DP-29
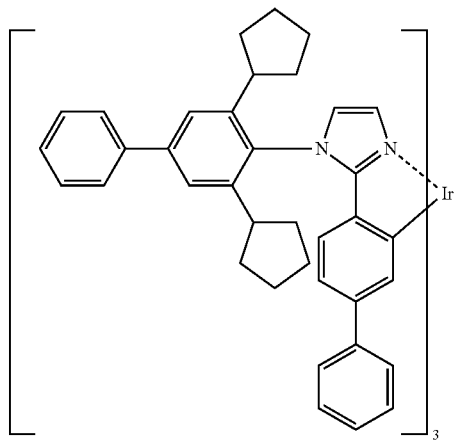

[Chemical Formula 13]
DP-30 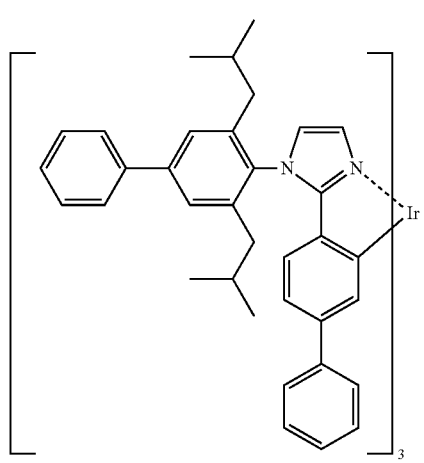
DP-31 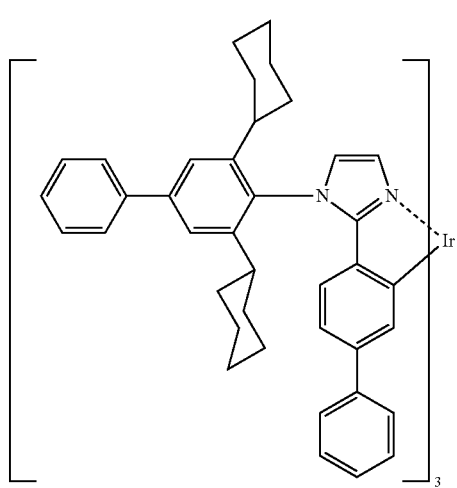
DP-32 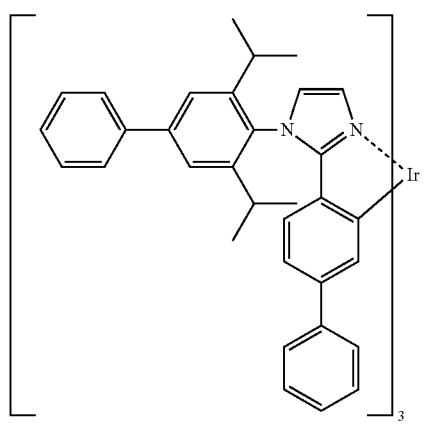
DP-33 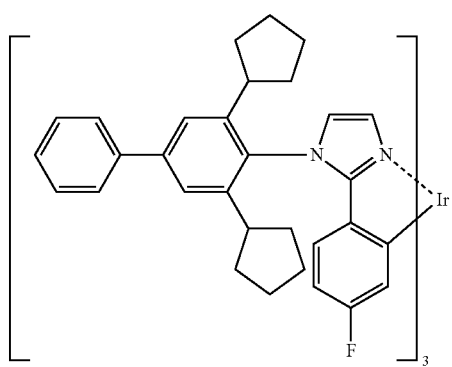
DP-34 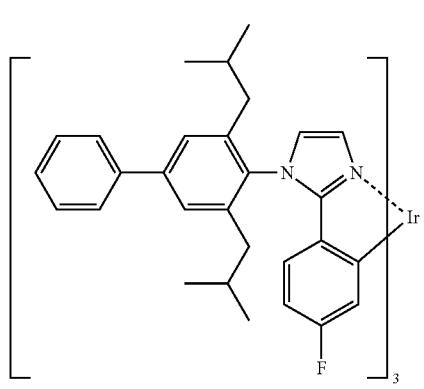
DP-35 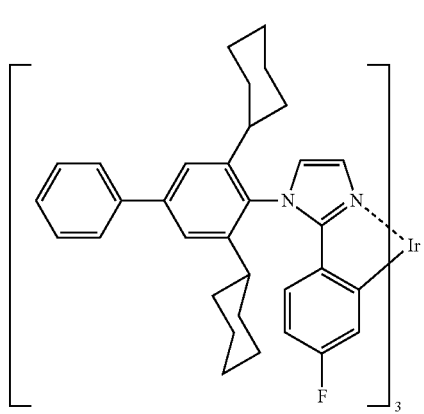

-continued
[Chemical Formula 14]
DP-36
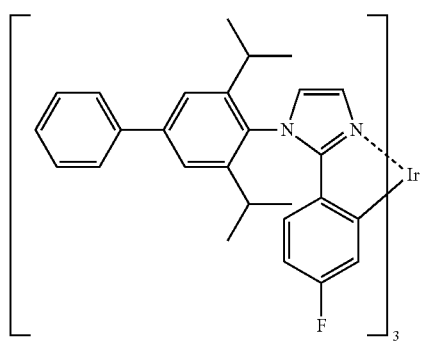
DP-37
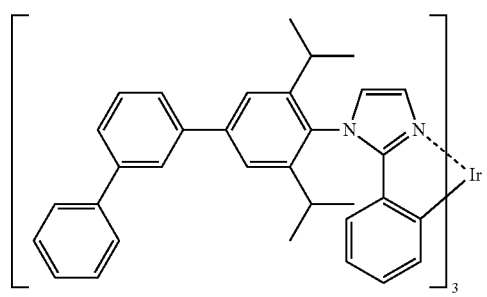
DP-38
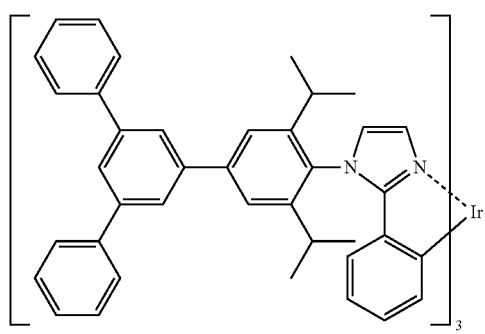
DP-39
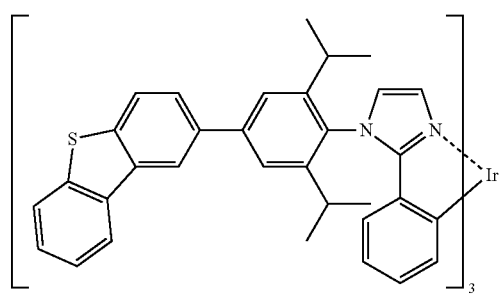
DP-40
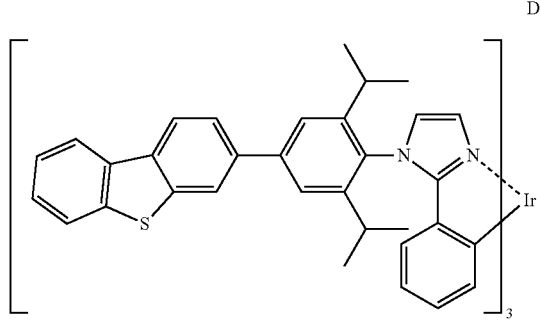
DP-41
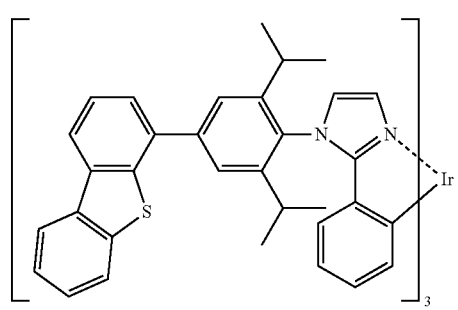
DP-42
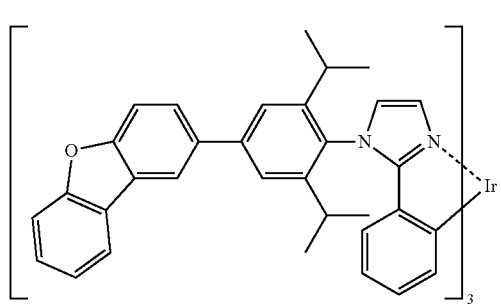
DP-43
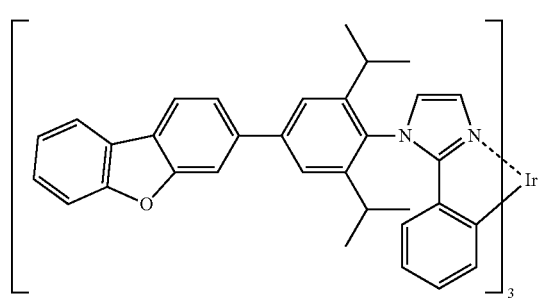

[Chemical Formula 15]
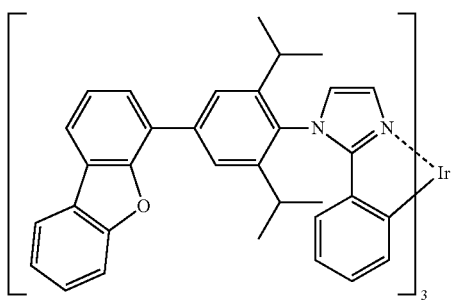
DP-44
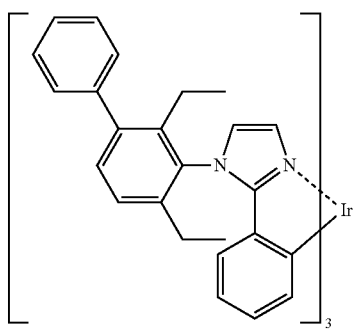
DP-45
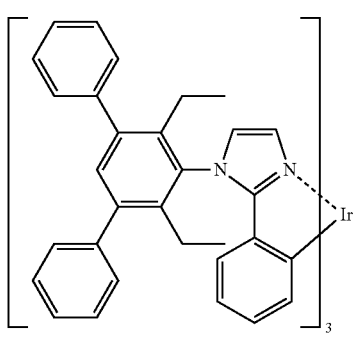
DP-46
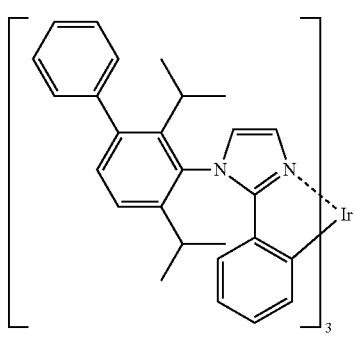
DP-47
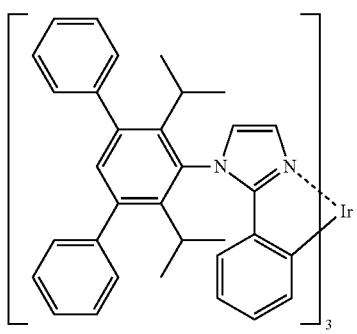
DP-48
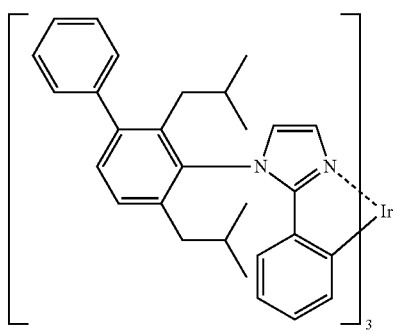
DP-49
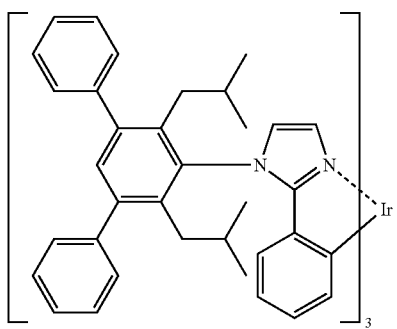
DP-50
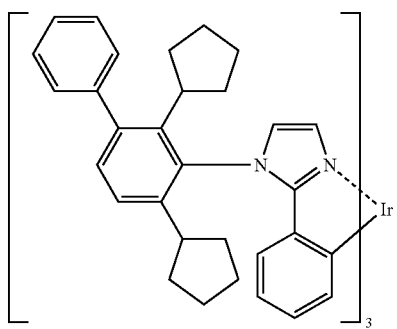
DP-51

[Chemical Formula 16]
DP-52
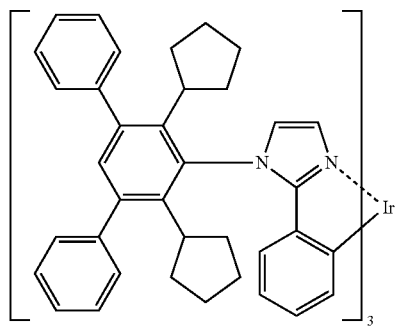
DP-53
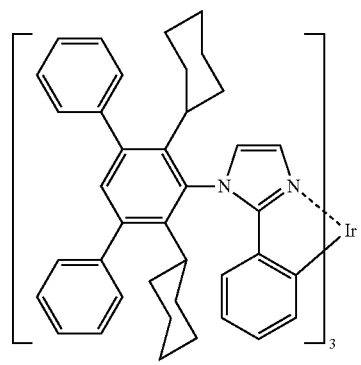
DP-54
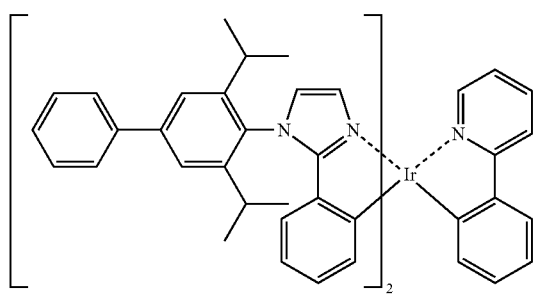
DP-55
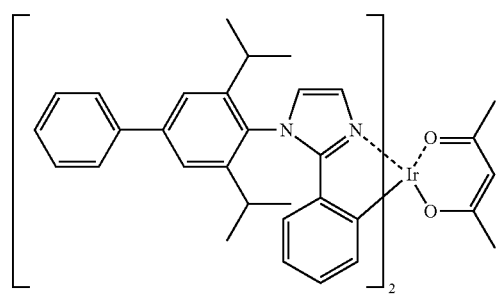
DP-56
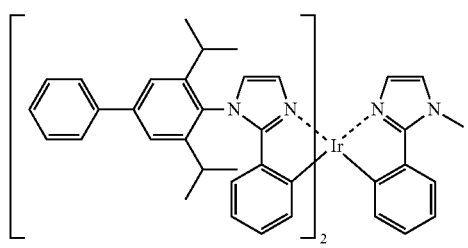
DP-57
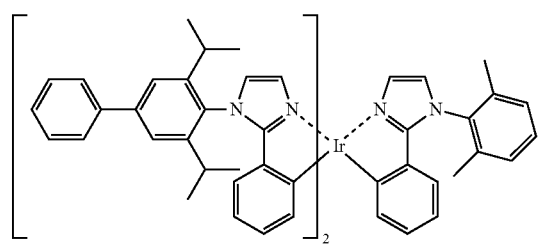
[Chemical Formula 17]
DP-58
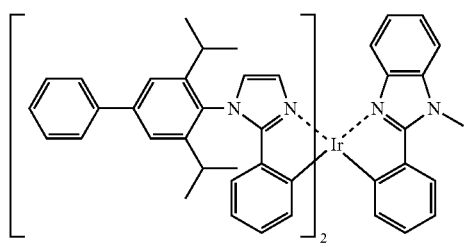
DP-59
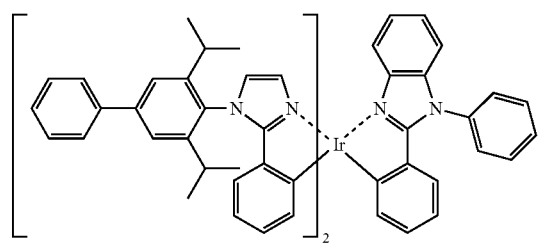
DP-60
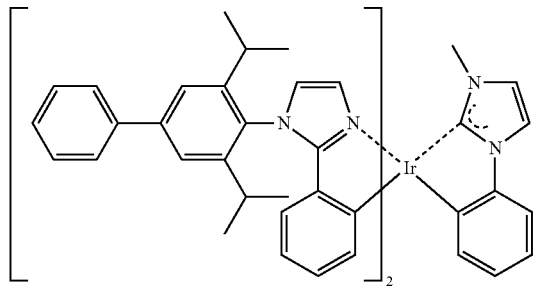
DP-61
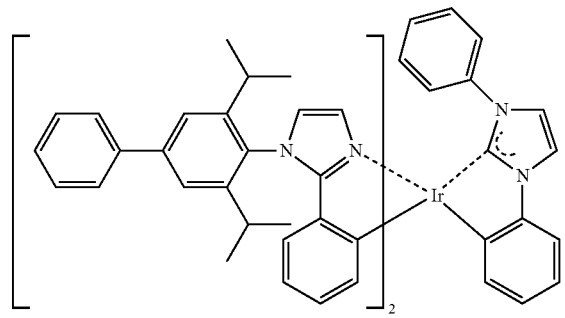

-continued
DP-62
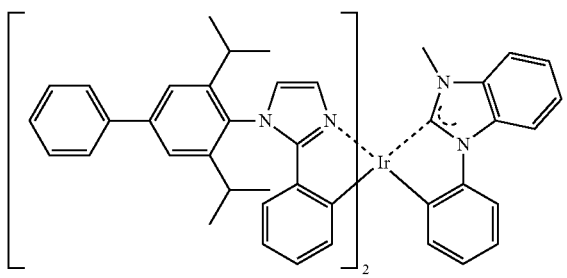
[Chemical Formula 18]
DP-63
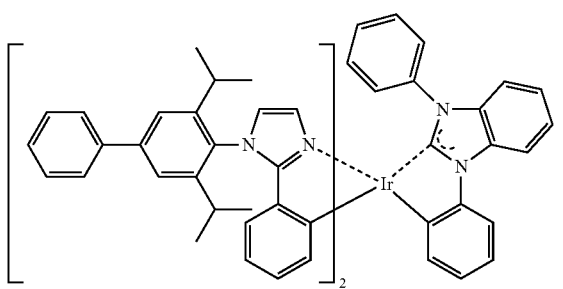
DP-64
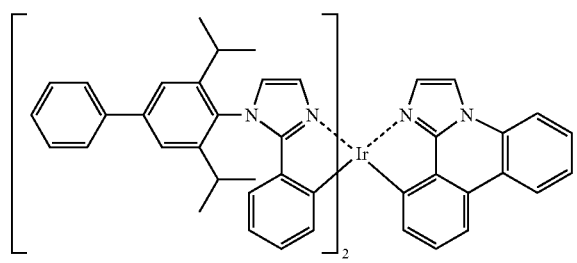
DP-65
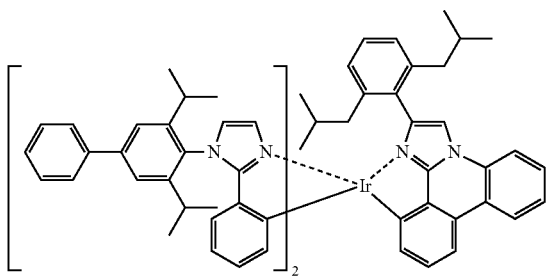
DP-66
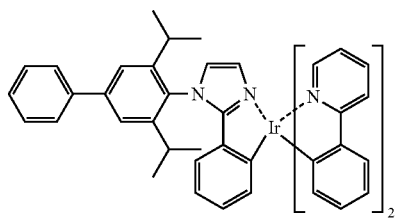
DP-67
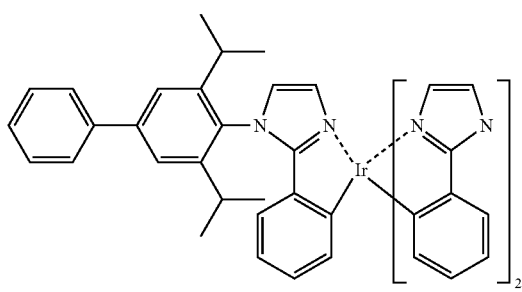
[Chemical Formula 19]
DP-68
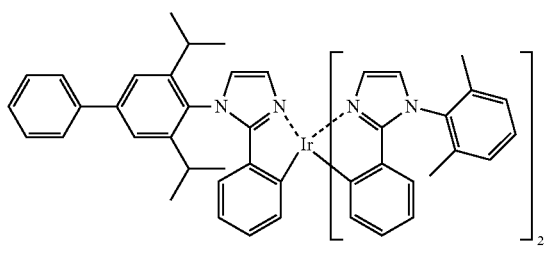
DP-69
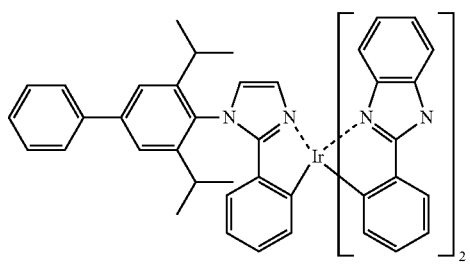

-continued
DP-70
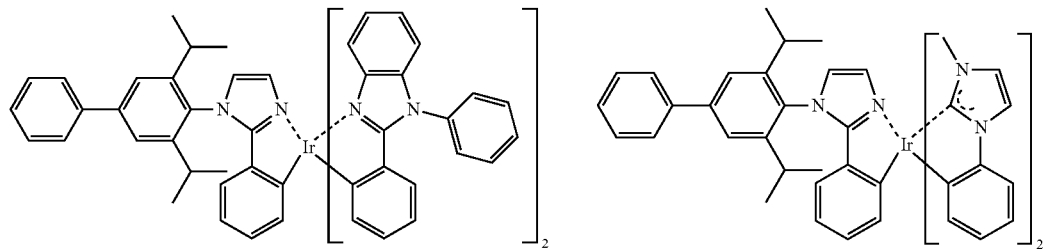
DP-71
DP-72
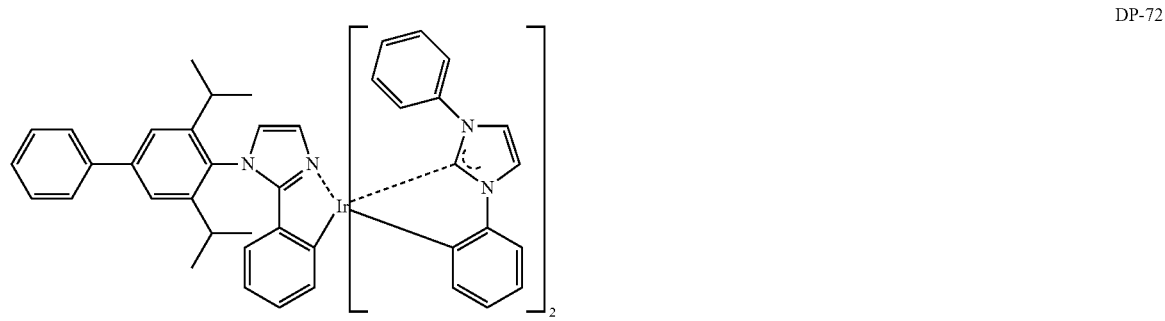
[Chemical Formula 20]
DP-73
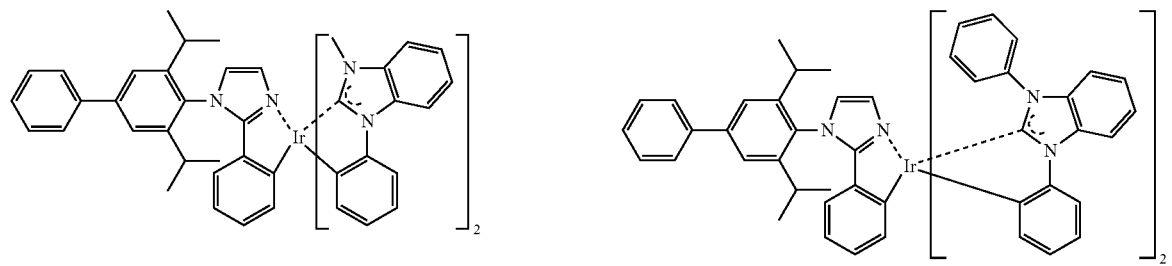
DP-74
DP-75
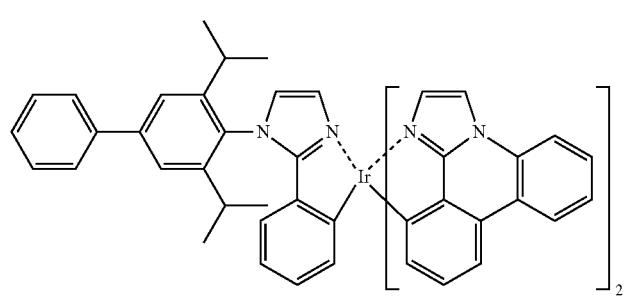
DP-76
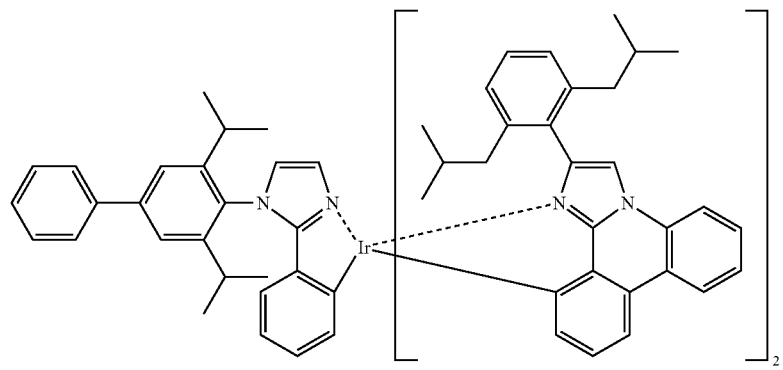

[Chemical Formula 21]

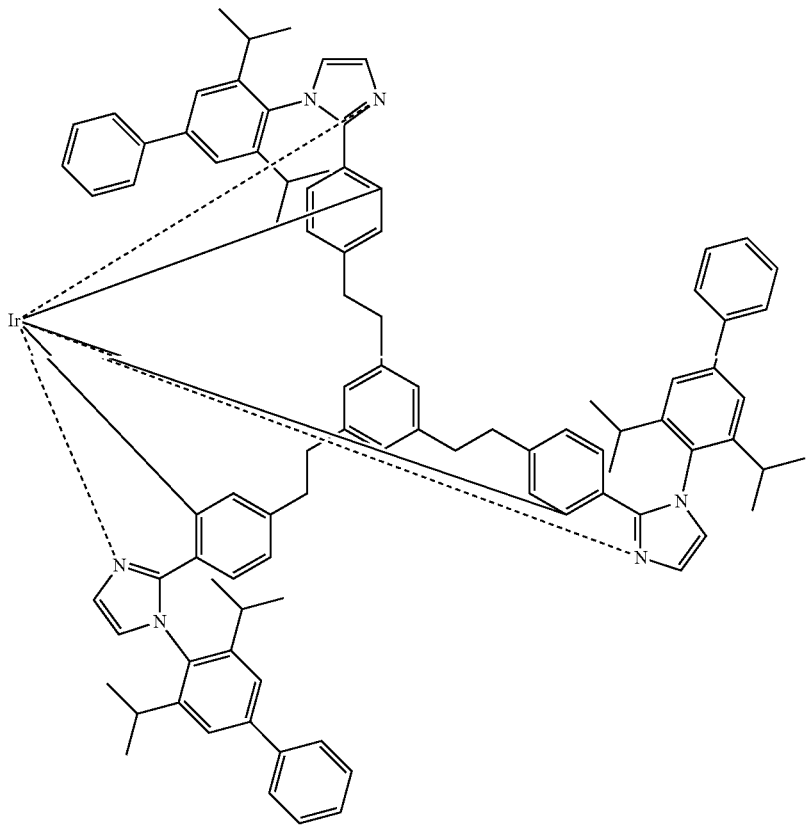

DP-77

[Constituting Layers of Organic EL Element]

The constituting layers of the organic EL element of the present invention will now be described in detail. Preferred examples of layer composition of the organic EL element of the present invention include, but not limited to, the following list:

(i) Anode/light emitting layer/electron transport layer/cathode (ii) Anode/hole transport layer/light emitting layer/electron transport layer/cathode (iii) Anode/hole transport layer/light emitting layer/hole blocking layer/electron transport layer/cathode (iv) Anode/hole transport layer/light emitting layer/hole blocking layer/electron transport layer/cathode buffer layer/cathode (v) Anode/anode buffer layer/hole transport layer/light emitting layer/hole blocking layer/electron transport layer/cathode buffer layer/cathode (vi) Anode/hole transport layer/anode buffer layer/light emitting layer/hole blocking layer/electron transport layer/cathode buffer layer/cathode (vii) Anode/anode buffer layer/hole transport layer/light emitting layer/electron transport layer/cathode buffer layer/cathode If including a plurality of light emitting layers, the organic EL element may be provided with a non-light emitting intermediate layer between any two adjacent light emitting layers. Furthermore, the organic EL element may include a plurality of laminated light emitting units, each composed of organic layers including light emitting layers other than the anode and cathode in the above-described layer composition. In the plurality of laminated light emitting units, a non-light emitting intermediate layer may be provided between any two adjacent light emitting units, and the intermediate layer may contain a charge generating layer.

The organic EL element of the present invention preferably has a white-light emitting layer, and an illumination device including this element is preferred.

Each of the layers which constitute the organic EL element of the present invention will now be described in detail.

<<Light Emitting Layer>>

The light emitting layer of the present invention emits light by recombination of electrons injected from the electrodes or the electron transportation layer and holes injected from the hole transportation layer. The portion that emits light may be the inside of the light emitting layer or the interface between the light emitting layer and an adjoining layer.

The light emitting layer may have any total thickness, which is preferably adjusted to a range of 2 nm to 5 μm, more preferably 2 nm to 200 nm, and most preferably 5 nm to 100 nm in order to maintain the homogeneity of films, to avoid application of excess high voltage for light emission, and to enhance the stability of the emitted light color with respect to a drive current.

The light emitting layer can be prepared by forming a film composed of a luminescent dopant and a host compound, which will be described later, for example, by vacuum evaporation method or wet method (also referred to as a wet process, and examples thereof include spin coating method, casting method, die coating method, blade coating method, roll coating method, inkjetting method, printing method, spray coating method, curtain coating method, and a Langmuir Blodgett method (LB method)). The light emitting layer of the organic EL element of the present invention contains a luminescent dopant (such as a phosphorescence emitting dopant (also referred to a phosphorescent dopant or a phosphorescence emitting dopant group) or a fluorescent dopant) compound and a host compound. At least one of the luminescent dopants is a blue phosphorescence emitting organic metal complex represented by Formula (1) described above, and the host compound will be described later.

(Luminescent Dopant Compound)

The luminescent dopant compounds (also referred to as luminescent dopants) of the present invention will now be described.

As the luminescent dopants, there can be used fluorescent dopants (also referred to as fluorescent compounds) and phosphorescent dopants (also referred to as phosphorescence emitting dopant compounds, phosphorescent emitters, phosphorescent compounds, or phosphorescence emitting compounds, etc.).

(Phosphorescent Dopant (also Referred to as Phosphorescence Emitting Dopant))

The phosphorescent dopant of the present invention will now be described.

The phosphorescent dopant compound of the present invention emits light from an excited triplet, specifically, is a compound that exhibits phosphorescence emission at room temperature (25° C.), and is defined by a compound having a phosphorescence quantum yield of 0.01 or more at 25° C., preferably 0.1 or more.

The phosphorescence quantum yield can be determined by a method described in page 398 of Bunko II of Dai 4 Han Jikken Kagaku Koza 7 (The Fourth Series of the Experimental Chemistry 7, Spectroscopy II) (1992, published by Maruzen Co., Ltd.). The phosphorescence quantum yield in a solution can be determined with a variety of solvents. The essential factor for the phosphorescent dopant of the present invention is the phosphorescence quantum yield (0.01 or more) in any of arbitrary solvents.

There are two types of luminescence mechanisms for the phosphorescent dopant. One is an energy transfer type, in which carrier recombination occurs on the host compound to which the carriers are transported, an excited state of the light emitting host compound is generated, and this energy is transferred to the phosphorescent dopant, whereby light is emitted from the phosphorescent dopant. The other is a carrier trap type, in which the phosphorescent dopant serves as a carrier trap and the recombination of the carriers occurs on the phosphorescent dopant to emit light from the phosphorescent dopant compound. In each case, the excited energy of the phosphorescent dopant should be lower than the excited energy of the host compound.

The phosphorescent dopant of the present invention, which is represented by Formula (1), may be used in combination with compounds described in the following patents:

WO00/70655, Japanese Patent Application Laid-open Nos. 2002-280178, 2001-181616, 2002-280179, 2001-181617, 2002-280180, 2001-247859, 2002-299060, 2001-313178, 2002-302671, 2001-345183, and 2002-324679, WO02/15645, Japanese Patent Application Laid-open Nos. 2002-332291, 2002-50484, 2002-332292, and 2002-83684, Japanese Translation of PCT International Application Publication No. 2002-540572, Japanese Patent Application Laid-open Nos. 2002-117978, 2002-338588, 2002-170684, and 2002-352960, WO 01/93642, Japanese Patent Application Laid-open Nos. 2002-50483, 2002-100476, 2002-173674, 2002-359082, 2002-175884, 2002-363552, 2002-184582, and 2003-7469, Japanese Translation of PCT International Application Publication No. 2002-525808, Japanese Patent Application Laid-open No. 2003-7471, Japanese Translation of PCT International Application Publication No. 2002-525833, Japanese Patent Application Laid-open Nos. 2003-31366, 2002-226495, 2002-234894, 2002-235076, 2002-241751, 2001-319779, 2001-319780, 2002-62824, 2002-100474, 2002-203679, 2002-343572, and 2002-203678.

(Fluorescent Dopant (also Referred to as Fluorescent Compound))

Examples of the fluorescent dopant include coumarin dyes, pyran dyes, cyanine dyes, croconium dyes, squarylium dyes, oxobenzanthracene dyes, fluorescein dyes, rhodamine dyes, pyrylium dyes, perylene dyes, stilbene dyes, polythiophene dyes, rare earth complex fluorescent substances and compounds having a high fluorescence quantum yield such as laser dyes.

The luminescent dopant of the present invention may be a mixture of two or more compounds, for example, a combination of phosphorescent dopants having different structures or a combination of a phosphorescent dopant and a fluorescent dopant.

Hereinafter specific examples of known phosphorescent dopant compounds preferably used in the present invention are shown below. It should be understood that the present invention is not limited to these examples.

[Chemical Formula 22]

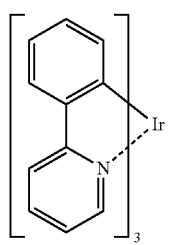

D-1

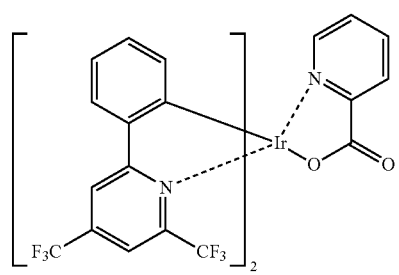

D-2

-continued
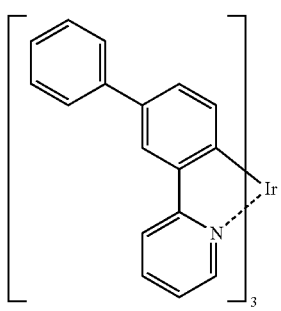
D-3
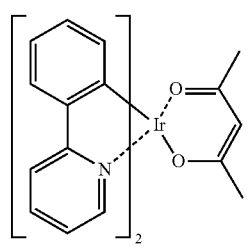
D-4
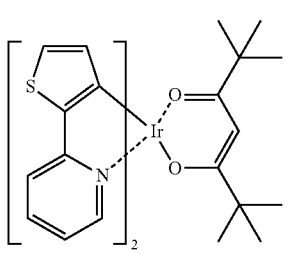
D-5
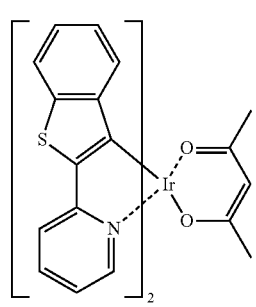
D-6
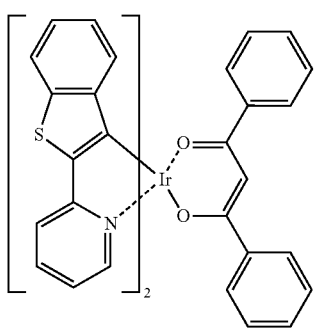
D-7
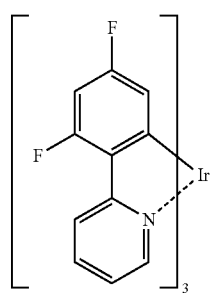
D-8
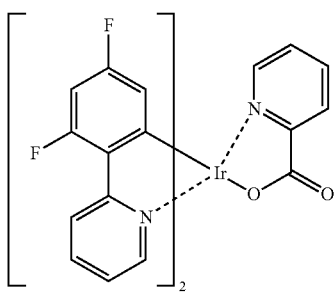
D-9
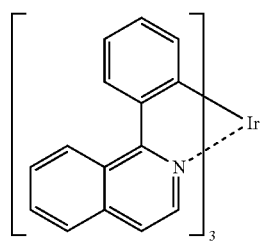
D-10
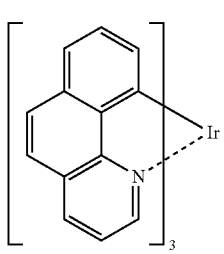
D-11
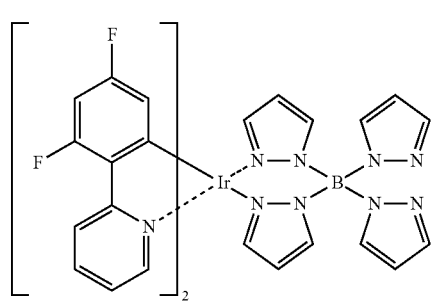
D-12

-continued
[Chemical Formula 23]
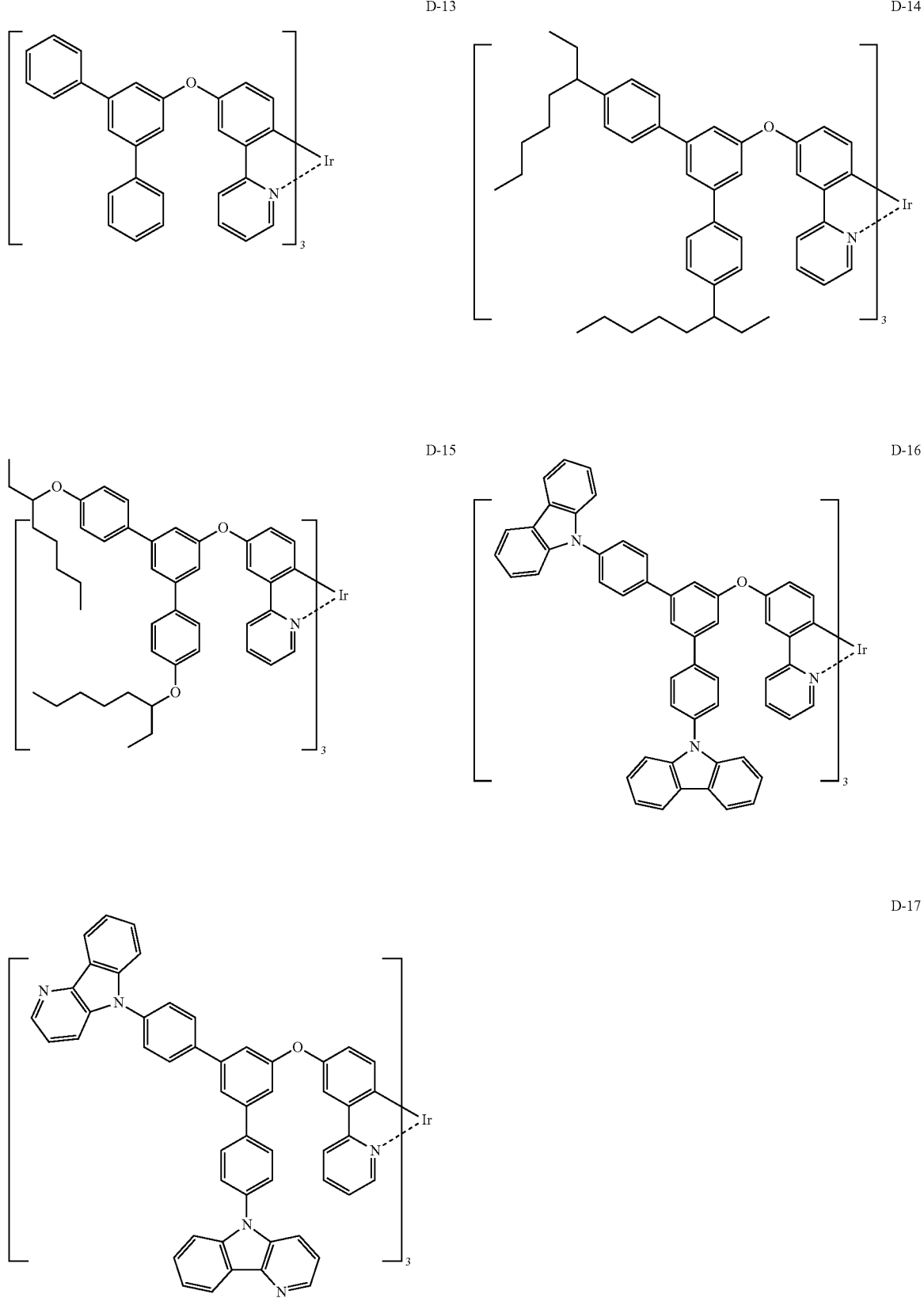

[Chemical Formula 24]
D-18
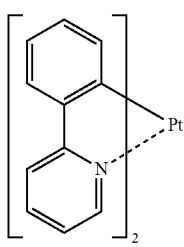
D-19
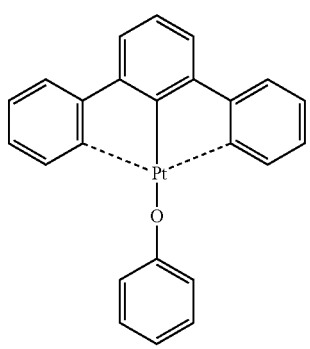
D-20
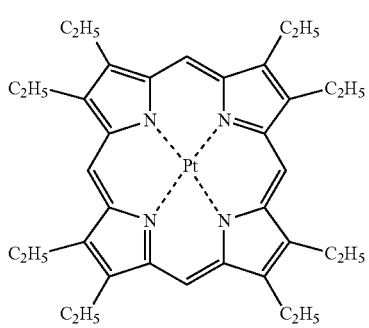
D-21
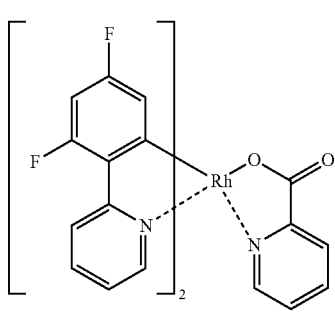
D-22
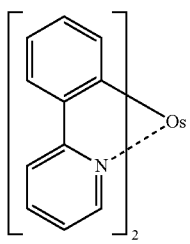
D-23
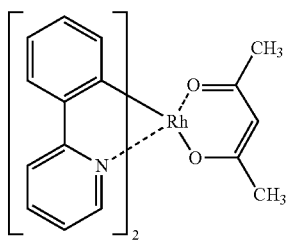
D-24
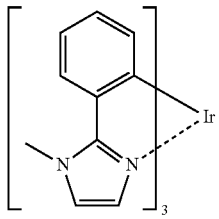
D-25
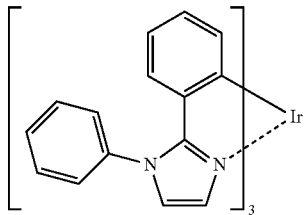
D-26
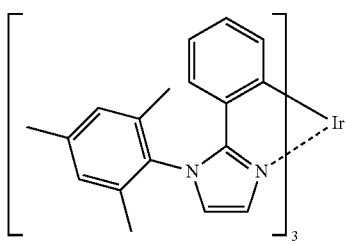
D-27
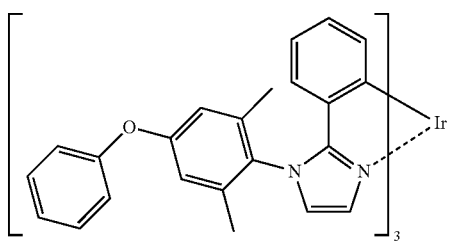

-continued
D-28
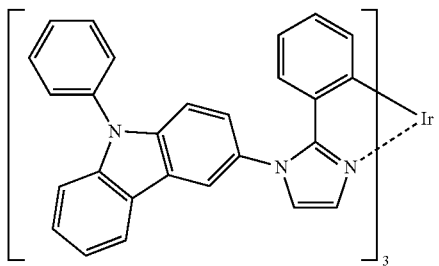
D-29
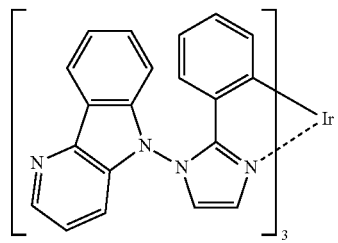
D-30
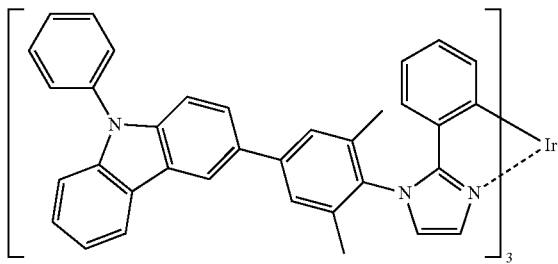
[Chemical Formula 25]
D-31
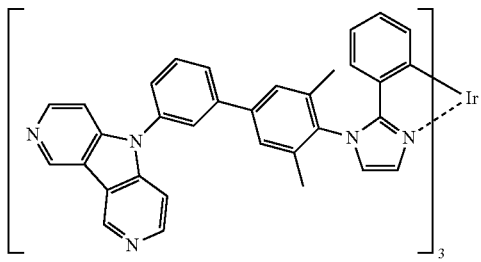
D-32
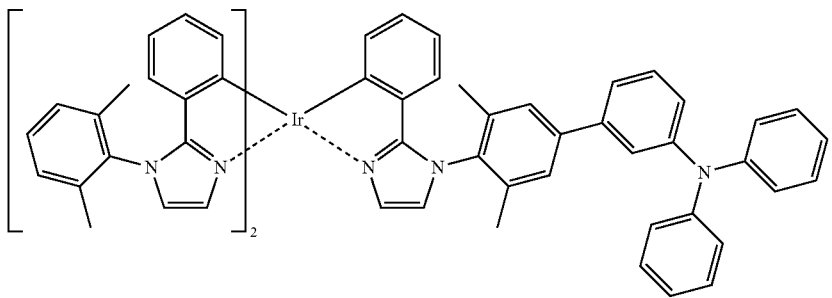
D-33
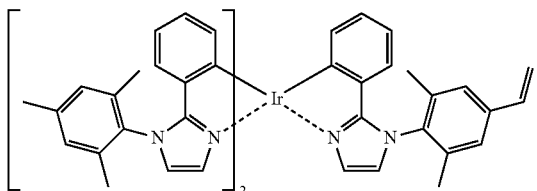
D-34
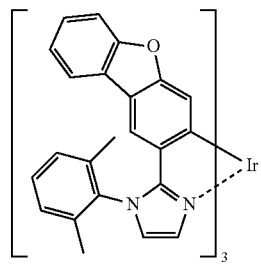

-continued
D-35
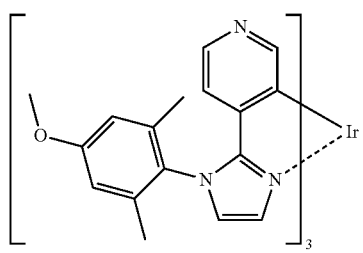
D-36
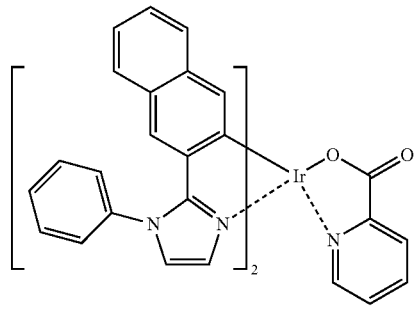
D-37
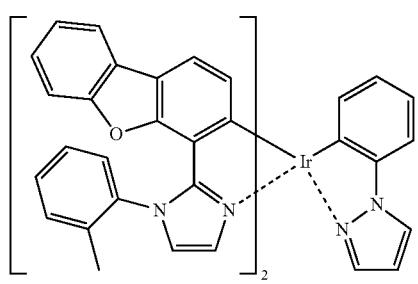
D-38
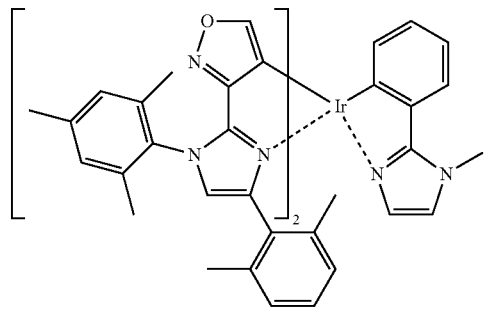
[Chemical Formula 26]
D-39
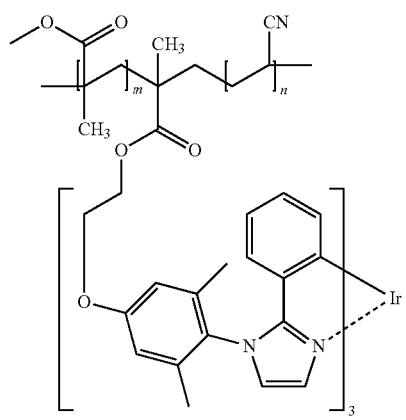
D-40
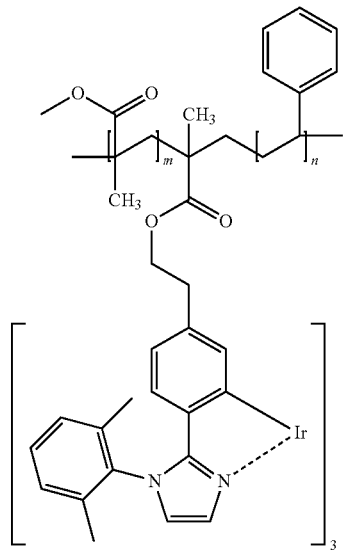
D-41
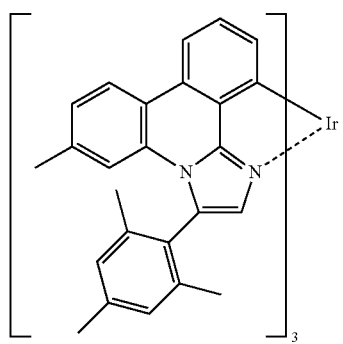
D-42
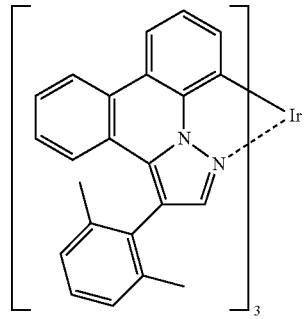

-continued
D-43
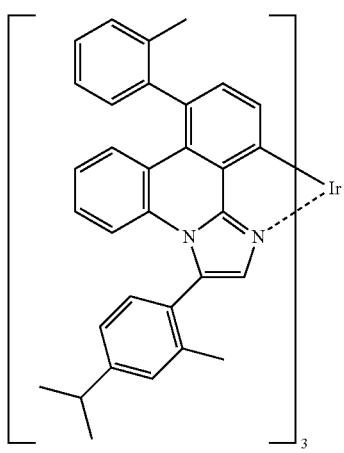
D-44
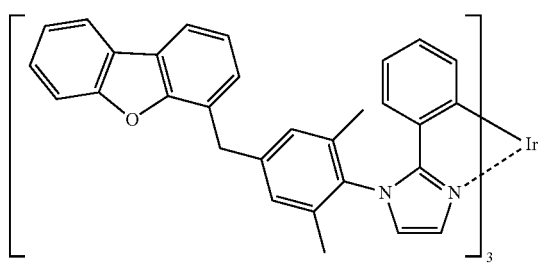
D-45
[Chemical Formula 27]
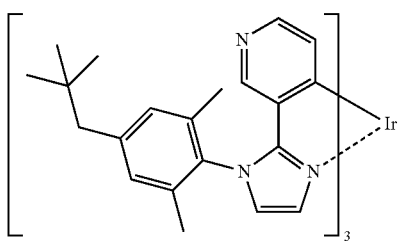
D-46
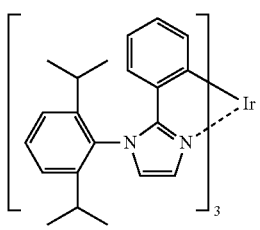
D-47
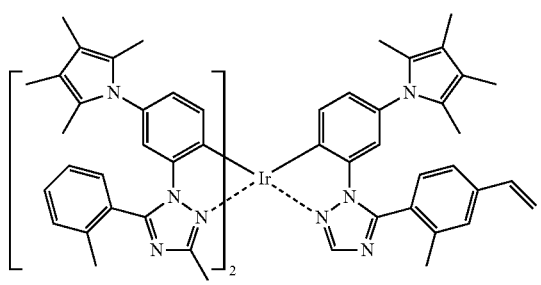
D-48
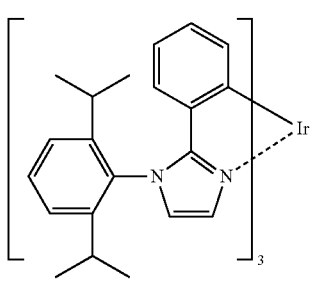
D-49
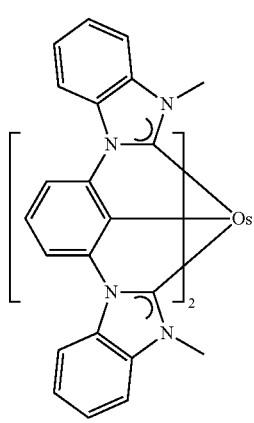

(Luminescent Host Compound (also Referred to as Luminescent Host))

Host compounds of the present invention are defined as a compound having a mass ratio of 20% or more among compounds contained in the light emitting layer and having a phosphorescence quantum yield of less than 0.1 in phosphorescence emission at room temperature (25° C.). Preferably, the phosphorescence quantum yield is less than 0.01. The mass ratio of the host compound in the light emitting layer is preferably 20% or more to the compounds contained in the layer.

The luminescent host used in the present invention is not particularly limited, and compounds conventionally used in the organic EL elements can be used. Particularly preferable host used with the blue phosphorescence emitting dopant in the light emitting layer of the organic EL element the present invention is a compound represented by Formula (H1).

[Chemical Formula 28]

$Q_m\text{-}L_n$  Formula (H1)

where L is a fused aromatic heterocycle which may have been substituted; Q is an aromatic cyclic hydrocarbon or aromatic heterocycle which may have been substituted; n and m each represent an integer of 1 to 3; when n is 2 or more, a plurality of Ls may be different from each other, and when m is 2 or more, a plurality of Qs may be different from each other.

In Formula (H1), examples of the aromatic cyclic hydrocarbon or aromatic heterocycle, which is represented by Q and may have been substituted, include the aromatic cyclic hydrocarbons or aromatic heterocycles represented by Ar in Formula (1).

Examples of the substituent of Q include the substituents represented by R' and R" in Formula (H2) which will be described later.

In Formula (H1), examples of the fused aromatic heterocycle, which is represented by L and may have been substituted, include an indole ring, a benzimidazole ring, a benzothiazole ring, a benzoxazole ring, a quinoxaline ring, a quinazoline ring, a phthalazine ring, a thienothiophene ring, aromatic heterocycles composed of fused 3 or more rings. (Preferable examples of fused aromatic heterocycles composed of fused 3 or more rings include aromatic heterocyclic fused rings containing at least one hetero atom selected from N, O and S as an element to form a fused ring, specifically including a carbazole ring, and an azacarbazole ring (indicating a ring in which any one or more carbon atoms constituting the carbazole ring is replaced with one or more nitrogen atoms), a dibenzosilole ring, a dibenzofuran ring, a dibenzothiophene ring, a ring in which any one or more carbon atoms constituting a benzothiophene ring or a dibenzofuran ring are replaced with one or more nitrogen atoms, a benzodifuran ring, a benzodithiophene ring, an acridine ring, a benzoquinoline ring, a phenazine ring, a phenanthridine ring, a phenanthroline ring, a cyclazine ring, a quindoline ring, a thepenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, a dibenzocarbazole ring, an indolocarbazole ring and a dithienobenzene ring, etc.)

Examples of the substituent in L include the substituents represented by R' and R" in Formula (H2) which will be described later.

In Formula (H1), n and m each represent an integer of 1 to 3; when n is 2 or more, a plurality of Ls may be different from each other; and when m is 2 or more, a plurality of Qs may be different from each other. Preferably, m+n is equal to 3 or more.

The compound represented by Formula (H1) includes a structure represented by Formula (H2) in the molecule.

[Chemical Formula 29]

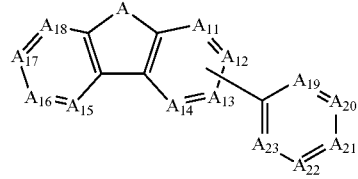

Formula (H2)

In Formula (H2), A represents an oxygen atom, a sulfur atom, NR' group, or CR"=CR"; and $A_{11}$ to $A_{23}$ each represent a nitrogen atom or CR". Preferably, A represents an oxygen atom, a sulfur atom, or NR' group. Preferably all of $A_{11}$ to $A_{23}$ represent CR".

In Formula (H2), R' and R" each represent a linking position to any other group, a hydrogen atom, or a substituent. When there are a plurality of CR"s, each CR" may be the same or different, and the plurality of R"s may be joined to form a ring.

In Formula (H2), examples of the substituent represented by R' and R" include alkyl groups (e.g., a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); alkenyl groups (e.g., a vinyl group and an allyl group); alkynyl groups (e.g., an ethynyl group and a propargyl group); non-aromatic cyclic hydrocarbon groups (such as cycloalkyl groups (e.g., a cyclopentyl group and cyclohexyl group), cycloalkoxy groups (e.g., a cyclopentyloxy group and a cyclohexyloxy group), cycloalkylthio groups (e.g., a cyclopentylthio group and a cyclohexylthio group), monovalent groups derived from a tetrahydronaphthalene ring, a 9,10-dihydroanthracene ring, and a biphenylene ring); non-aromatic heterocycle groups (such as monovalent rings derived from an epoxy ring, an aziridine ring, a thiirane ring, an oxetane ring, an azetidine ring, a thiethane ring, a tetrahydrofuran ring, a dioxolane ring, a pyrrolidine ring, a pyrazolidine ring, an imidazolidine ring, an oxazolidine ring, a tetrahydrothiophene ring, a sulfolane ting, a thiazolidine ring, an ε-caprolactone ring, an ε-caprolactam ring, a piperidine ring, a hexahydropyridazine ring, a hexahydropyrimidine ring, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, phenoxazine ring, a phenothiazine ring, an oxanthrene ring, a thioxanthene ring, and a phenoxathiin ring); aromatic hydrocarbon groups (such as monovalent groups derived from a benzene ring, a biphenyl ring, a naphthalene ring, an azulene ring, an anthracene ring, a phenanthrene ring, a pyrene ring, a chrysene ring, a naphthacene ring, a triphenylene ring, o-terphenyl ring, m-terphenyl ring, p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, and an anthraanthrene ring); aromatic heterocycle groups (such as monovalent groups derived from a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzothiazole ring, a benzoxazole ring, a quinoxaline ring a quinazoline ring, a phthalazine ring, a thienothiophene ring, a carbazole ring, and an azacarbazole ring (indicating a ring in which any one or more carbon atoms constituting the carbazole ring is replaced with one or more nitrogen atoms), a dibenzosilole ring, a dibenzofuran ring, a dibenzothiophene ring, a ring in which any one or more carbon atoms constituting a benzothiophene ring or a dibenzofuran ring are replaced with nitrogen atoms, a benzodifuran ring, a benzodithiophene ring, an acridine ring, a benzoquinoline ring, a phenazine ring, a phenanthridine ring, a phenanthroline ring, a cyclazine ring, a quindoline ring, a thepenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxathiine ring, a dibenzocarbazole ring, an indolocarbazole ring and a dithienobenzene ring); alkoxy groups (e.g., a methoxy group, an ethoxy group, a propyloxy group, a pentyloxy group, an hexyloxy group, an octyloxy group, and a dodecyloxy group); aryloxy groups (e.g., a phenoxy group and a naphthyloxy group); alkylthio groups (e.g., a methylthio group, an ethylthio group, a propylthio group, a pentylthio group, a hexylthio group, an octylthio group, and a dodecylthio group); arylthio groups (e.g., a phenylthio group and a naphthylthio group); alkoxycarbonyl groups (e.g., a methyloxycarbonyl group, an ethyloxycarbonyl group, a butyloxycarbonyl group, an octyloxycarbonyl group, and a dodecyloxycarbonyl group); aryloxycarbonyl groups (e.g., a phenyloxycarbonyl group and a naphthyloxycarbonyl group); sulfamoyl groups (e.g., an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group); acyl groups (e.g., an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); acyloxy groups (e.g., an acetyloxy group, an ethylcarbonyloxy group, a butylcarbonyloxy group, an octylcarbonyloxy group, a dodecylcarbonyloxy group, and a phenylcarbonyloxy group); amido groups (e.g., a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); carbamoyl groups (e.g., an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); ureido groups (e.g., a methylureido group, an ethylureido group, a pentylureido group, a cyclohexylureido group, an octylureido group, a dodecylureido group, a phenylureido group, a naphthylureido group, and a 2-pyridylaminoureido group); sulfinyl groups (e.g., a methylsulfonyl group, an ethylsulfinyl group, a butylsufinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); alkylsulfonyl groups (e.g., a methylsulfonyl group, an ethylsulfonyl group, a butylsulfinyl group, a cyclohexylsulfonyl group, a 2-ethylhexylsulfonyl group, and a dodecylsulfonyl group), arylsulfonyl groups and heteroarylsulfonyl groups (e.g., a phenylsulfonyl group, a naphthylsulfonyl group, and a 2-pyridylsulfonyl group); amino groups (e.g., an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group); halogen atoms (e.g., a fluorine atom, a chlorine atom, and a bromine atom); fluorohydrocarbon groups (e.g., a fluoromethyl group, trifluoromethyl group, a pentafluoroethyl group, and a pentafluorophenyl group); a cyano group; a nitro group; a hydroxy group; a mercapto group; silyl groups (e.g., a trimethylsilyl group, a triisopropylsilyl group, a triphenylsilyl group, and a phenyldiethylsilyl group); and a phosphono group.

The host compound preferably has a high glass transition temperature (Tg) from the viewpoints of aging stability and ease of production of the element, and the compound represented by Formula (H1) preferably has a Tg of 100° C. or more, more preferably 120° C. or more, and most preferably 130° C. or more.

The compound represented by Formula (H1) preferably has a minimum excited triplet energy (T1) higher than that of the blue phosphorescence emitting organic metal complex concurrently used in combination, specifically, has a T1 of preferably 2.7 eV or more, more preferably 2.75 eV or more, and most preferably 2.8 eV or more.

The value of T1 of the compound represented by Formula (H1) is defined as a value (in terms of eV unit) calculated with Gaussian 98 (Gaussian 98, Revision A.11.4, M. J. Frisch, et al, Gaussian, Inc., Pittsburgh Pa., 2002), which is molecular orbital calculation software, manufactured by Gaussian Co. (USA), through the optimization of the structure using B3LYP/6-31G* as a key word. The calculated values determined by this method are considered to be reliable since the calculated values have a high correlation with the experimental values.

The molecular weight of the compound represented by Formula (H1) is preferably 500 to 2,000, and it is more preferably 700 to 1,500.

Hereinafter specific examples of the compound represented by Formula (H1) of the present invention are shown, but the present invention is not limited to these examples.

[Chemical Formula 30]
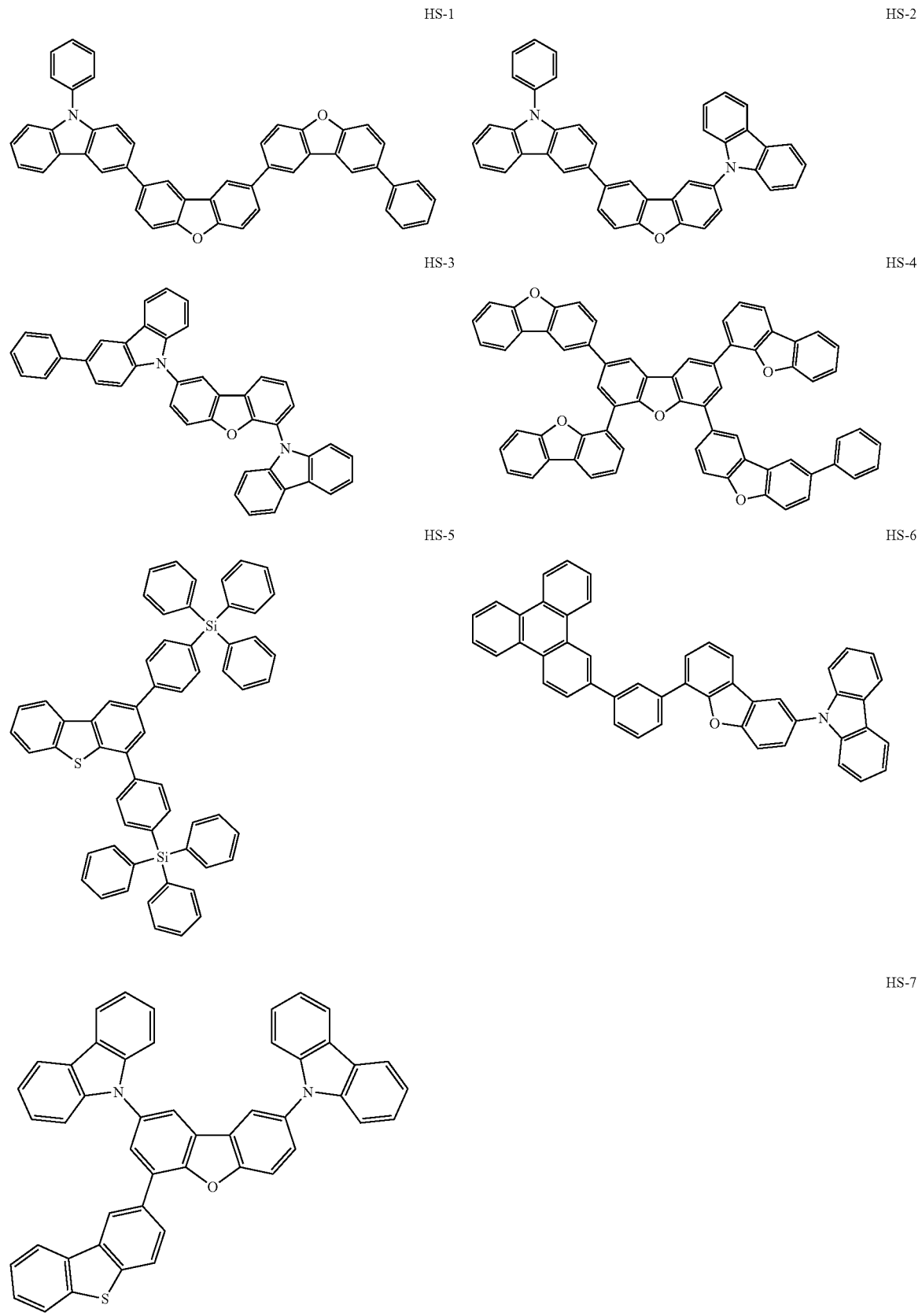

-continued
[Chemical Formula 31]
HS-8
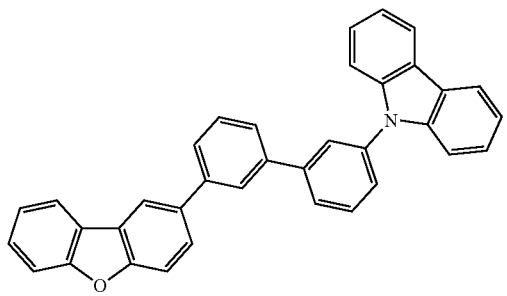
HS-9
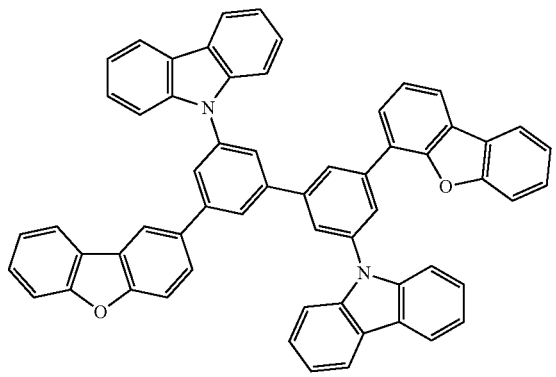
HS-10
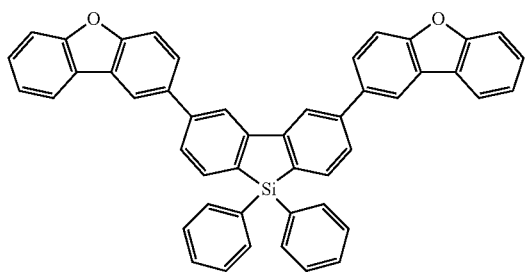
HS-11
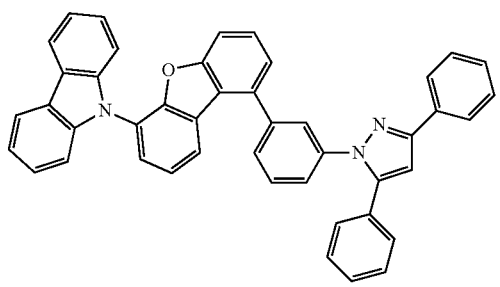
HS-12
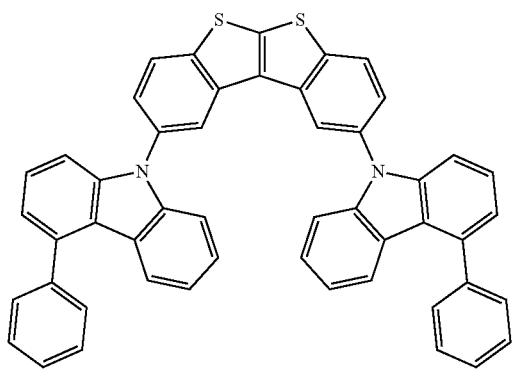
HS-13
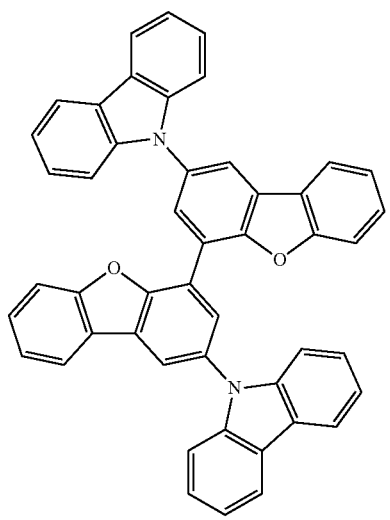
HS-14
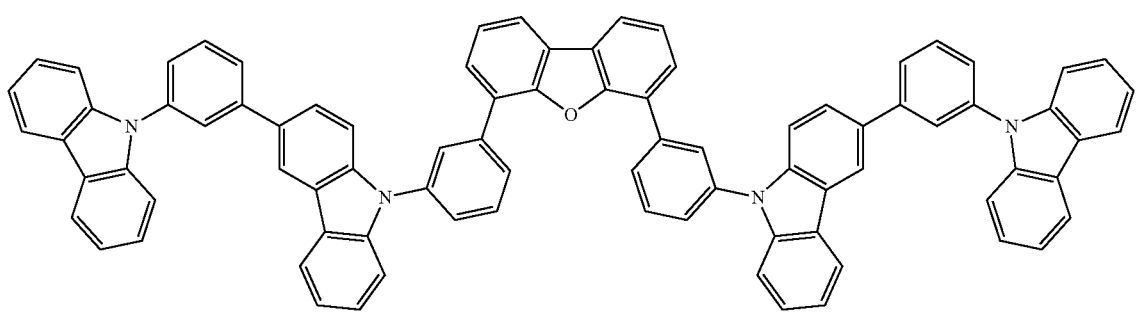

[Chemical Formula 32]
HS-15
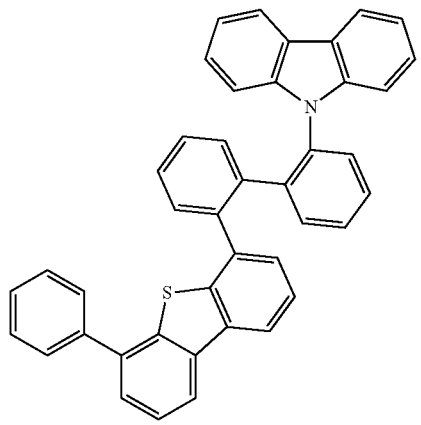
HS-16
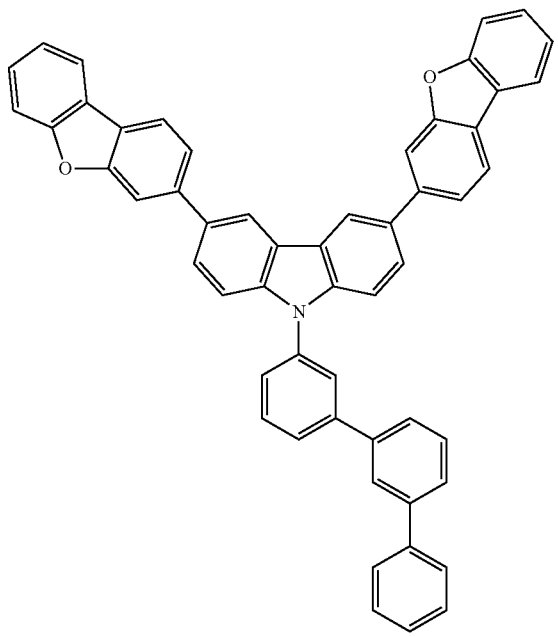
HS-17
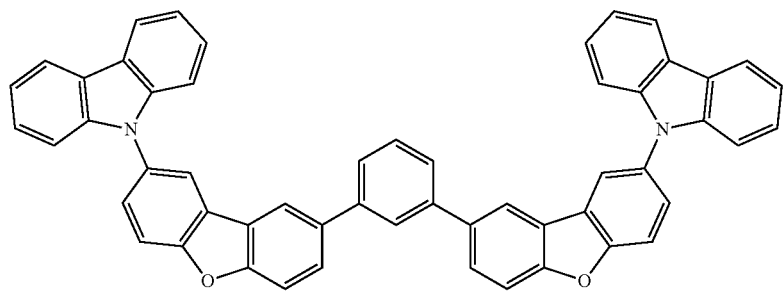
HS-18
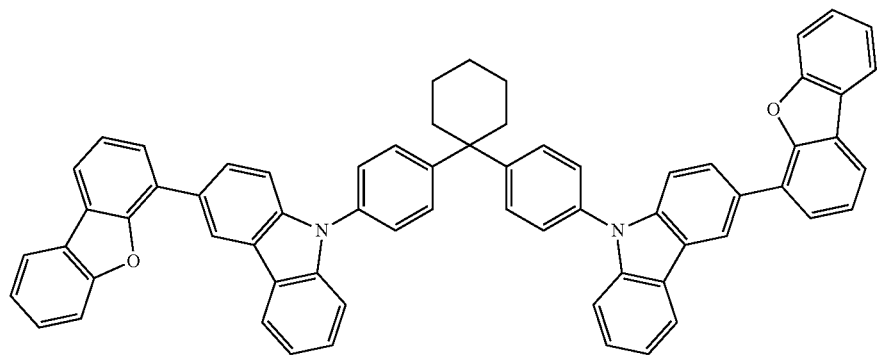

-continued
HS-19
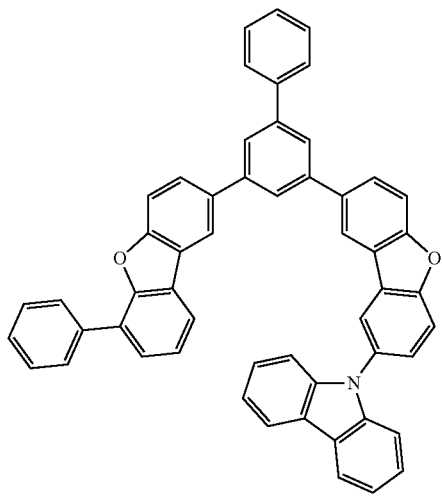
[Chemical Formula 33]
HS-20
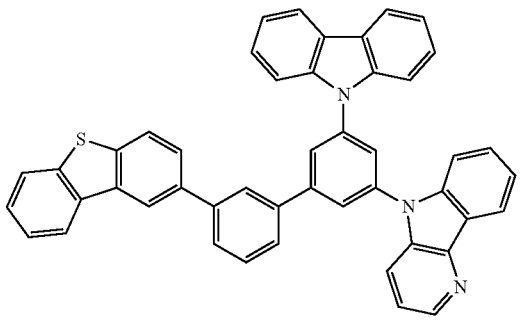
HS-21
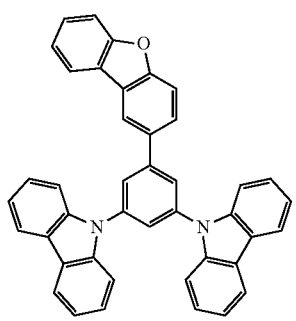
HS-22
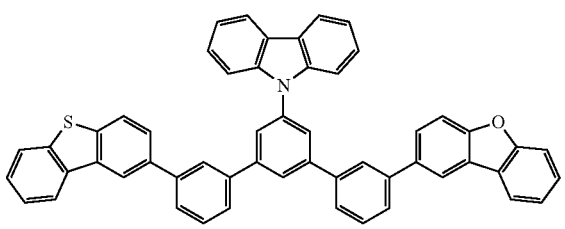
HS-23
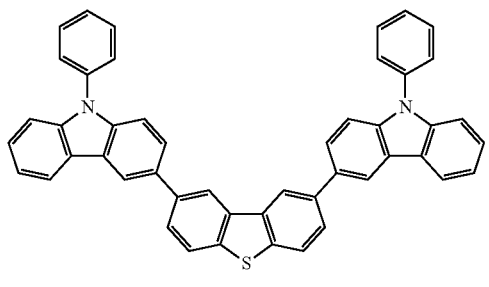
HS-24
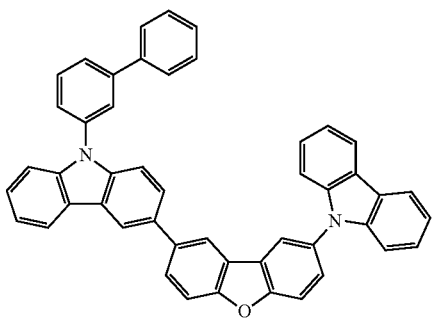
HS-25
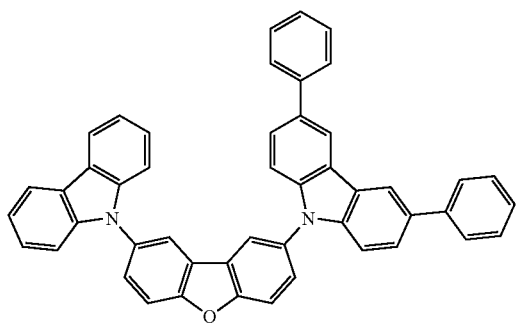
HS-26
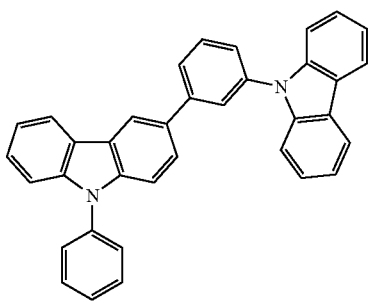

-continued
HS-27
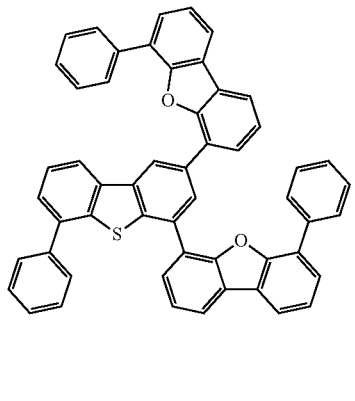
HS-28
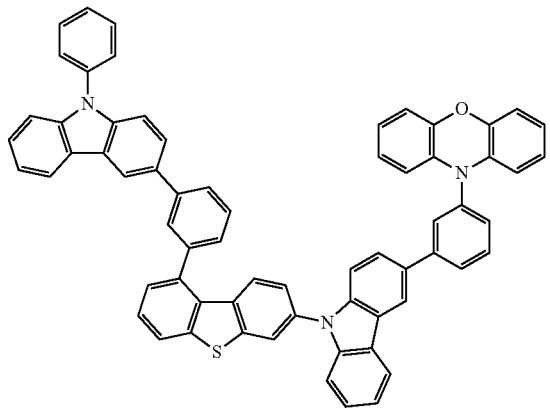
[Chemical Formula 34]
HS-29
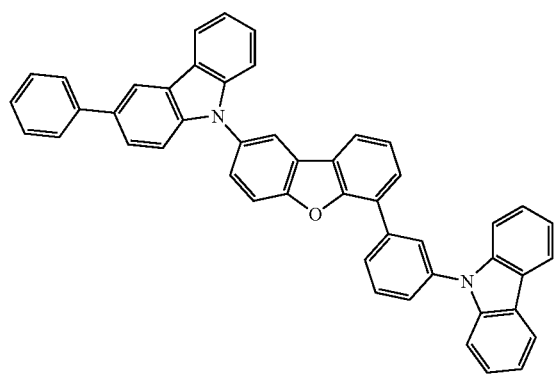
HS-30
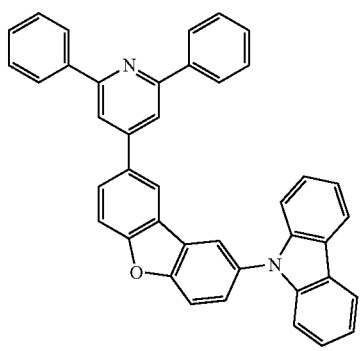
HS-31
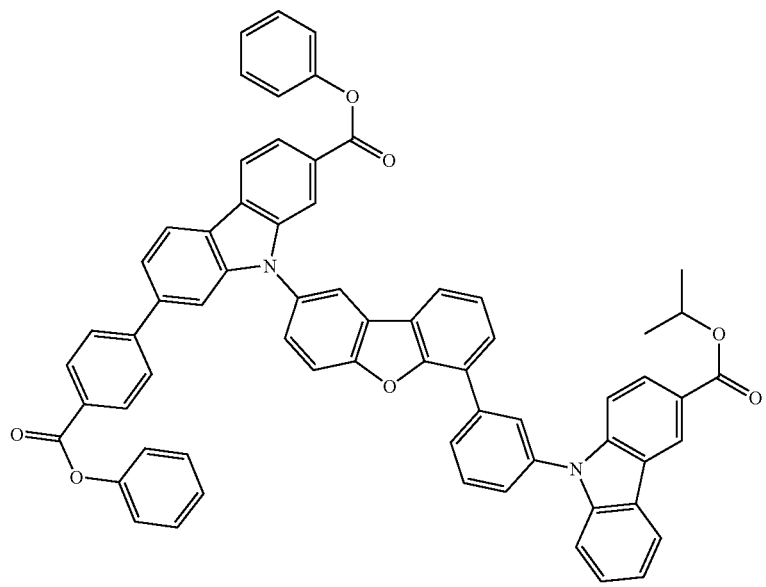

HS-32
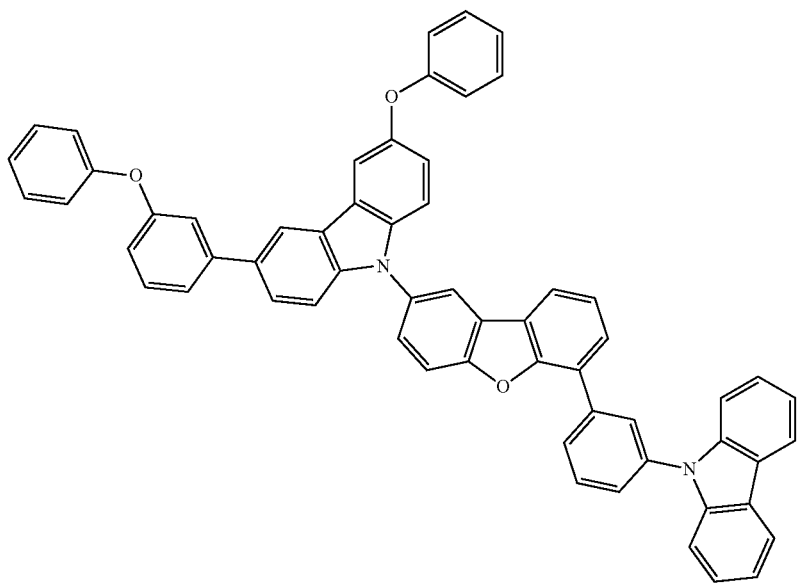
HS-33
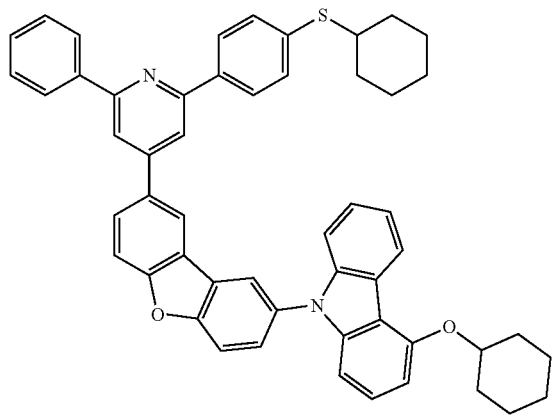
[Chemical Formula 35]
HS-34
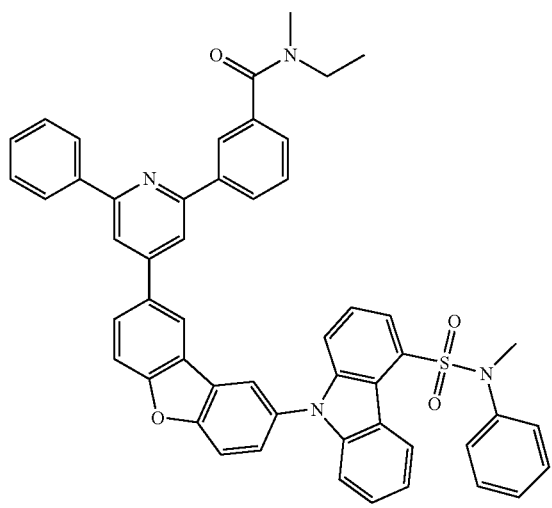

-continued
HS-35
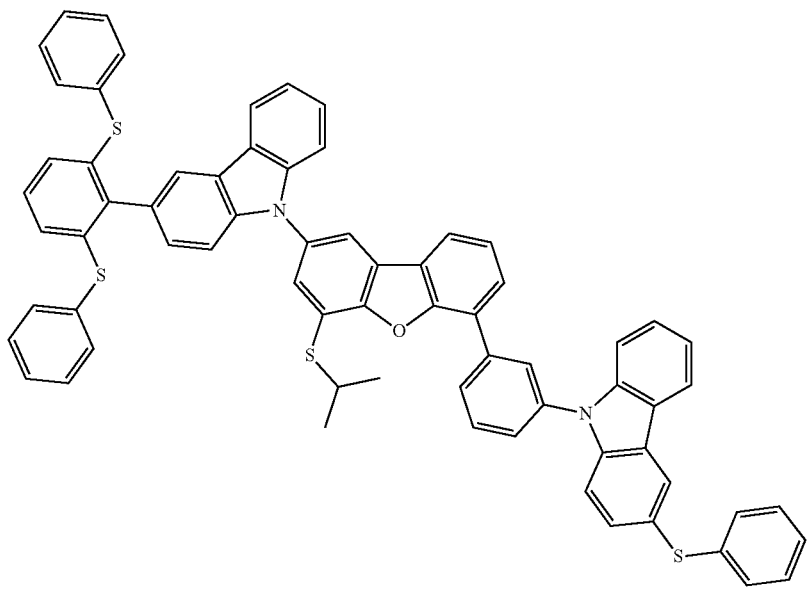
HS-36
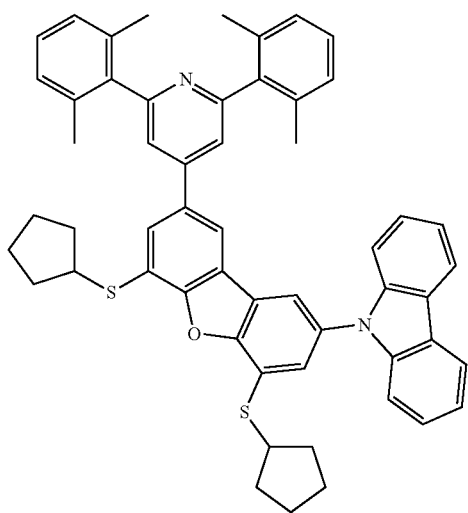
HS-37
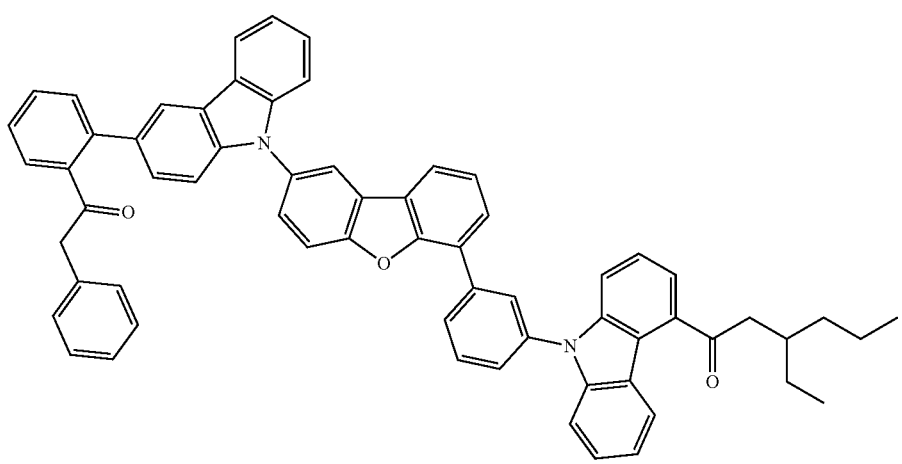

HS-38
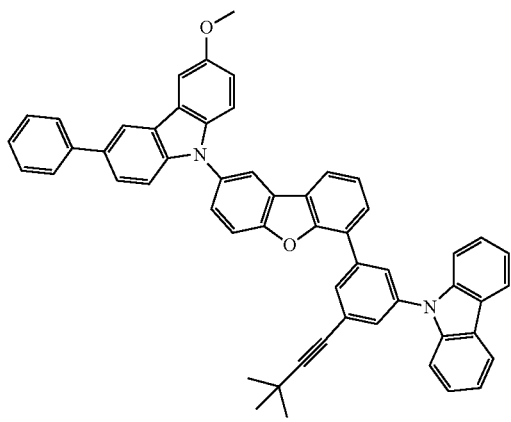
[Chemical Formula 36]
HS-39
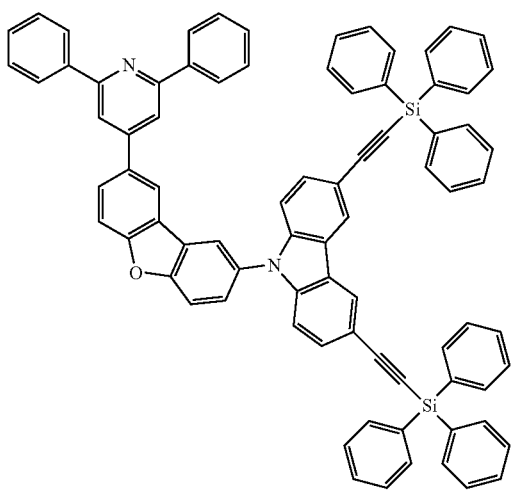
HS-40
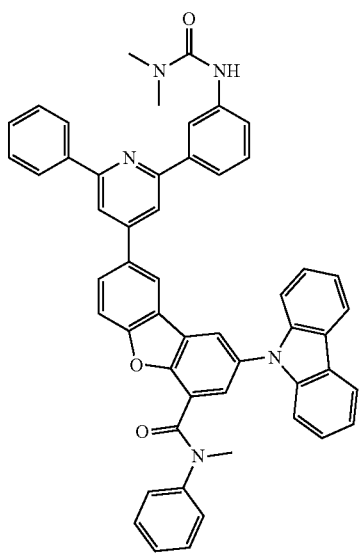
HS-41
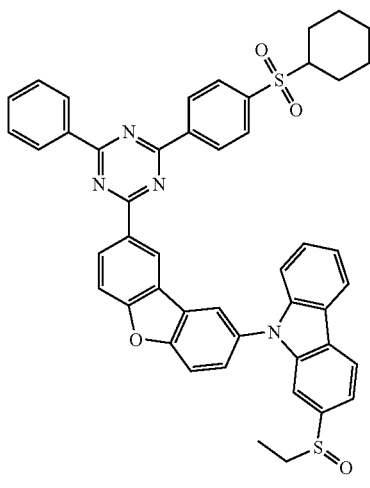
HS-42
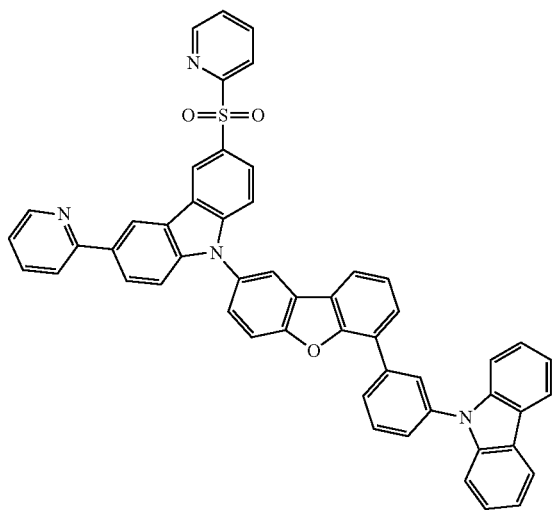

-continued
HS-43
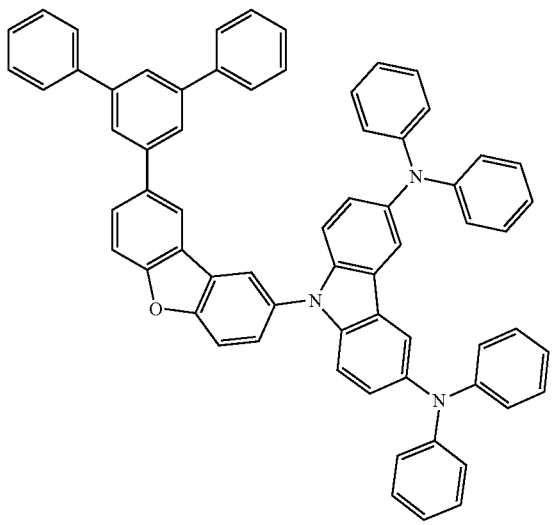
[Chemical Formula 37]
HS-44
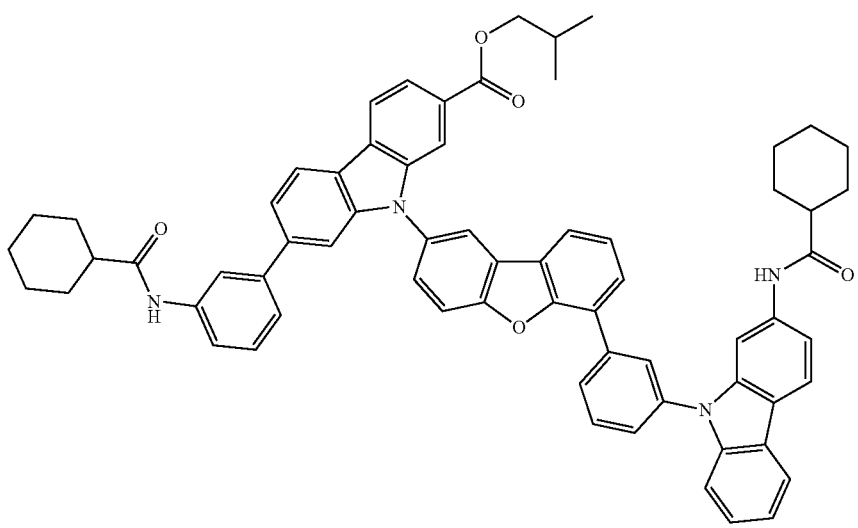
HS-45
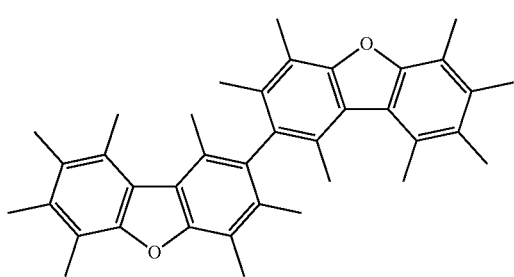
HS-46
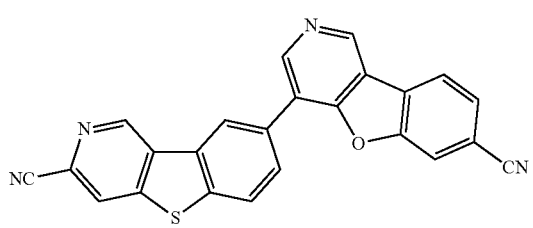

-continued
HS-47
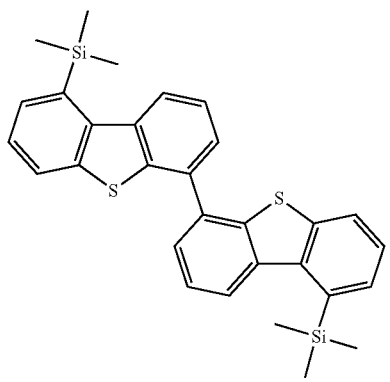
HS-48
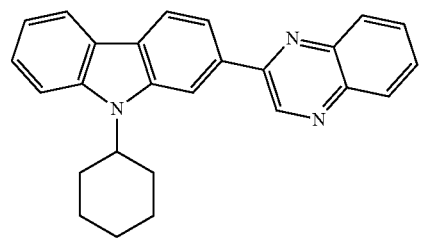
HS-49
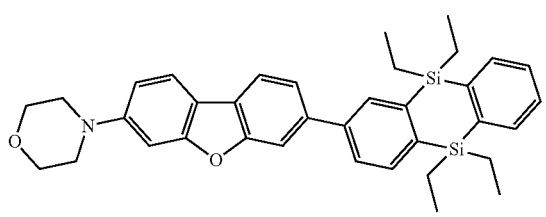
HS-50
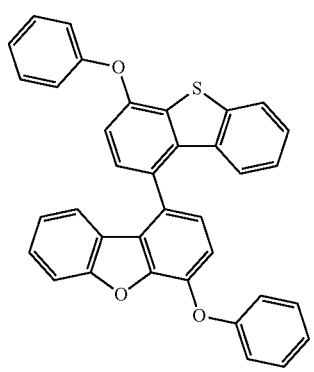
HS-51
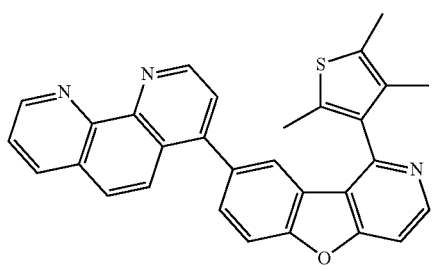
HS-52
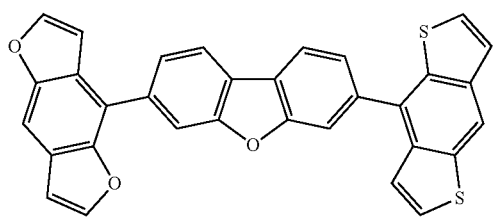
[Chemical Formula 38]
HS-53
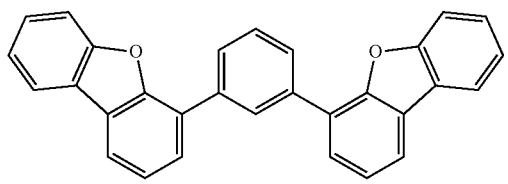
HS-54
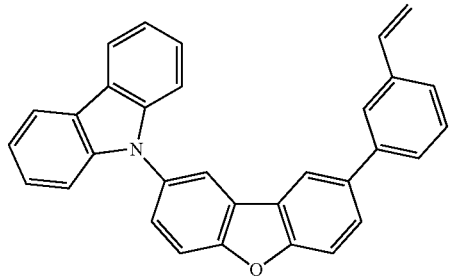

-continued
HS-55
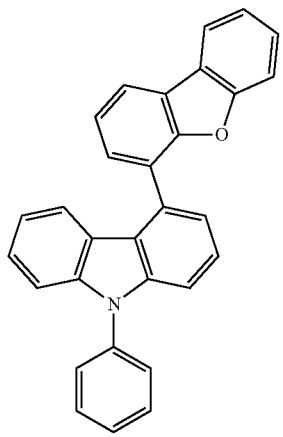
HS-56
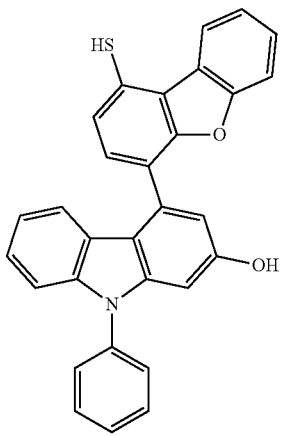
HS-57
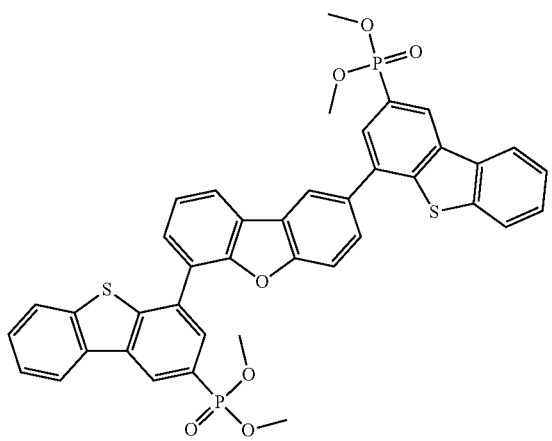
HS-58
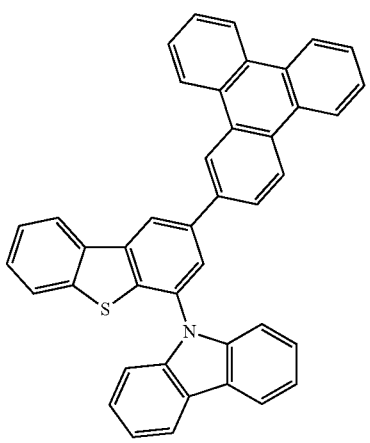
HS-59
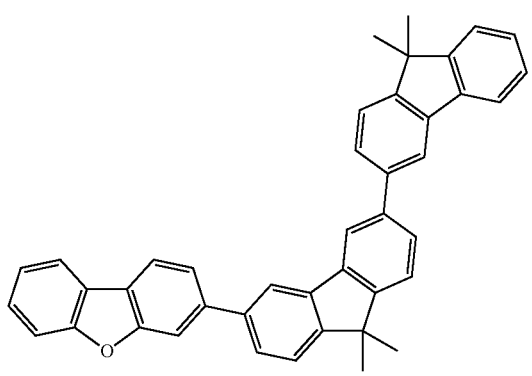
HS-60
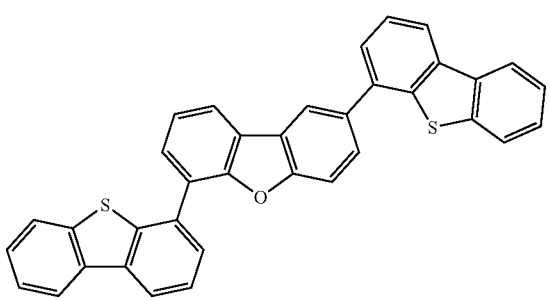
HS-61
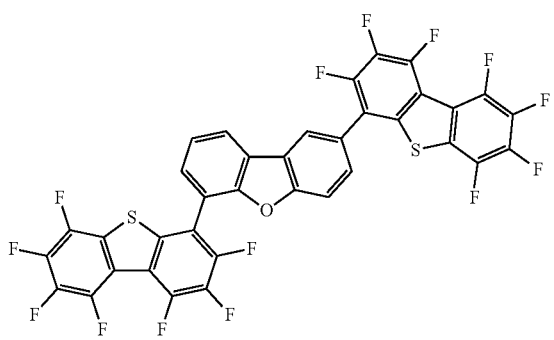

[Chemical Formula 39]
HS-62
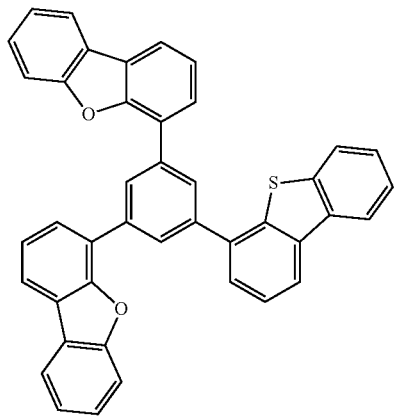
HS-63
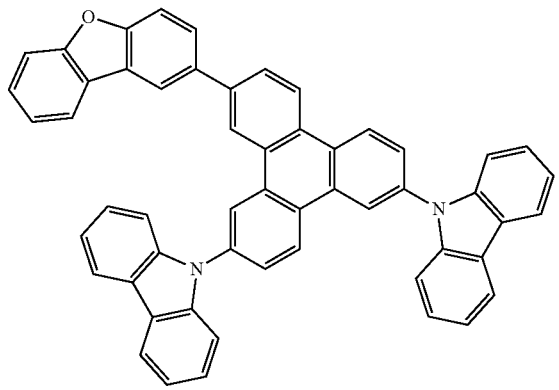
HS-64
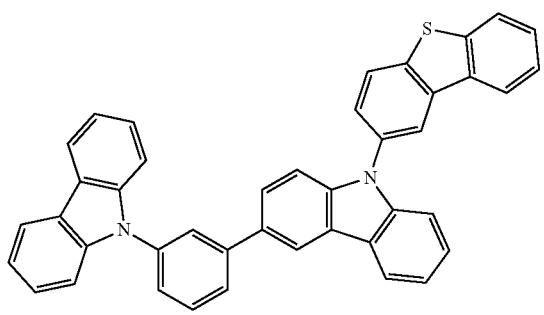
HS-65
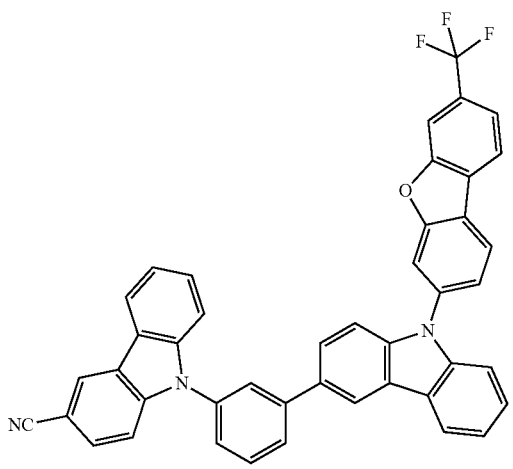
HS-66
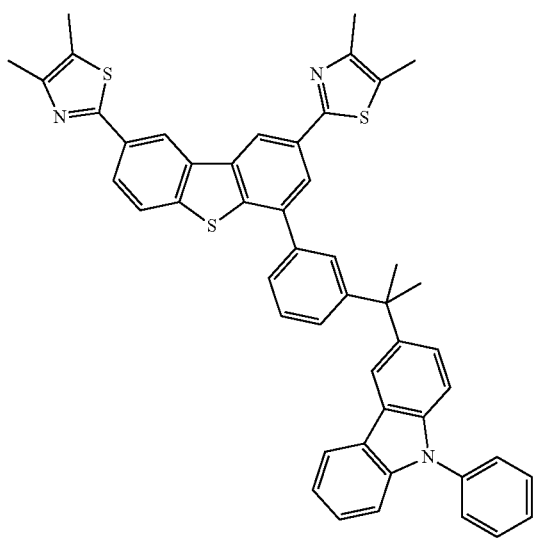
HS-67
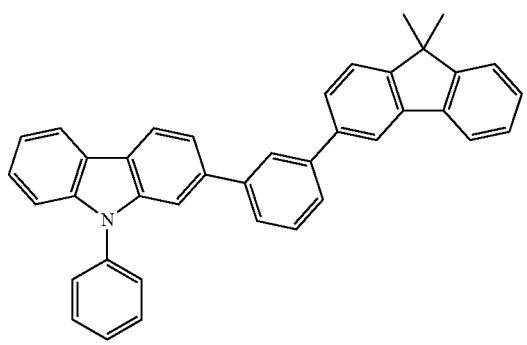

HS-68
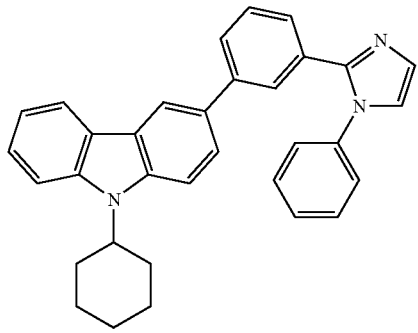
[Chemical Formula 40]
HS-69
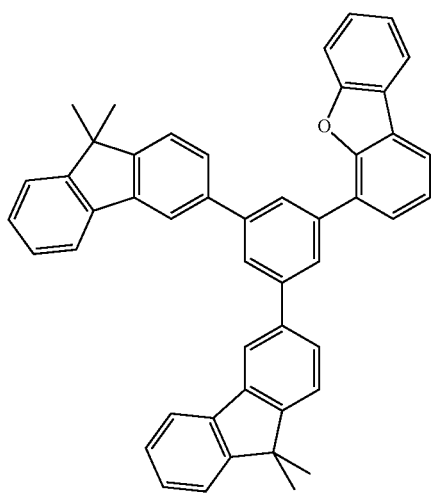
HS-70
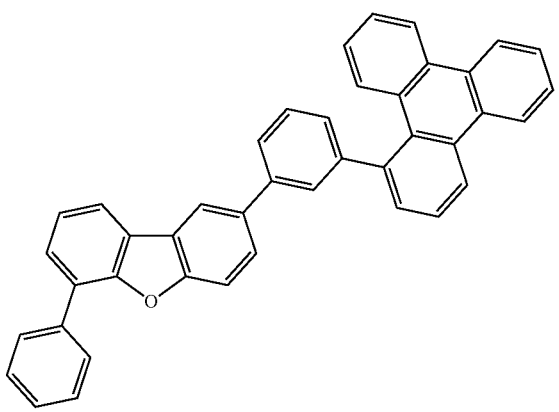
HS-71
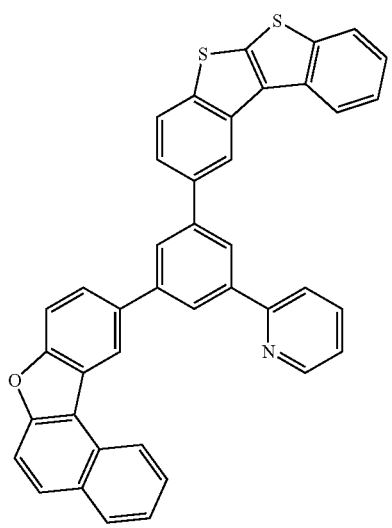
HS-72
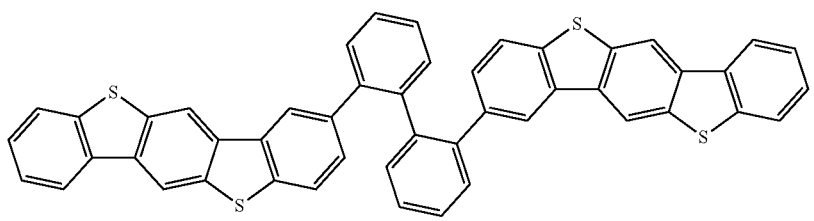

-continued
HS-73
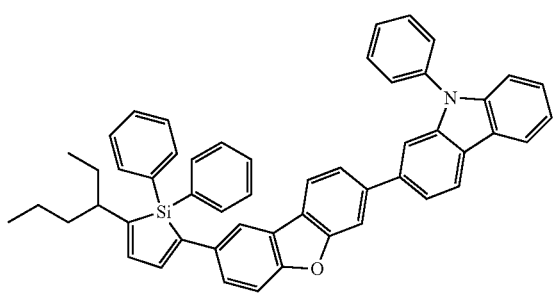
HS-74
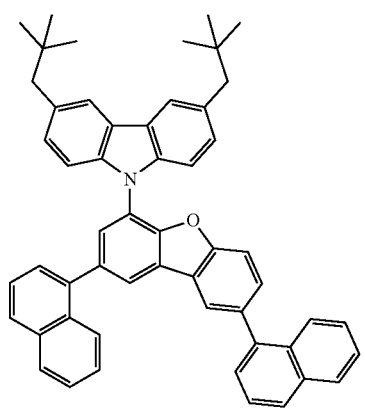
HS-75
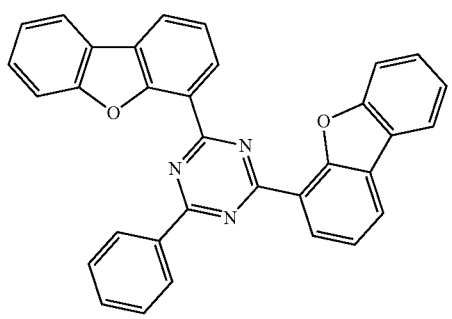
[Chemical Formula 41]
HS-76
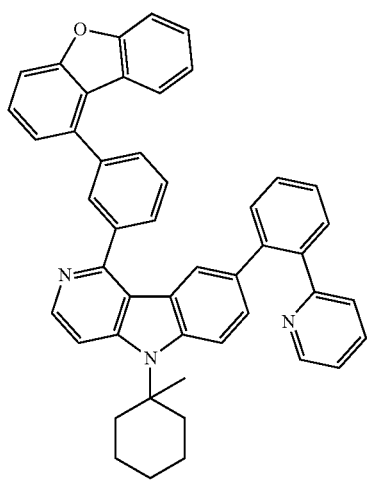
HS-77
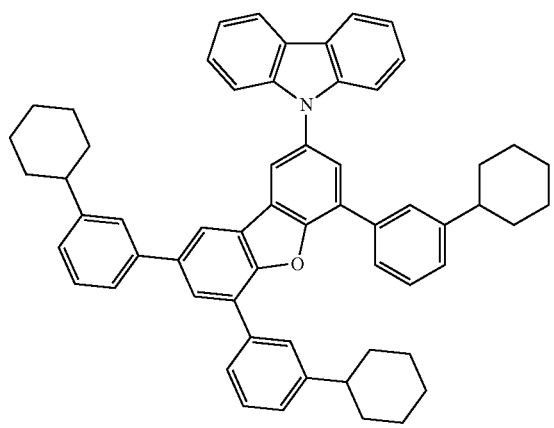

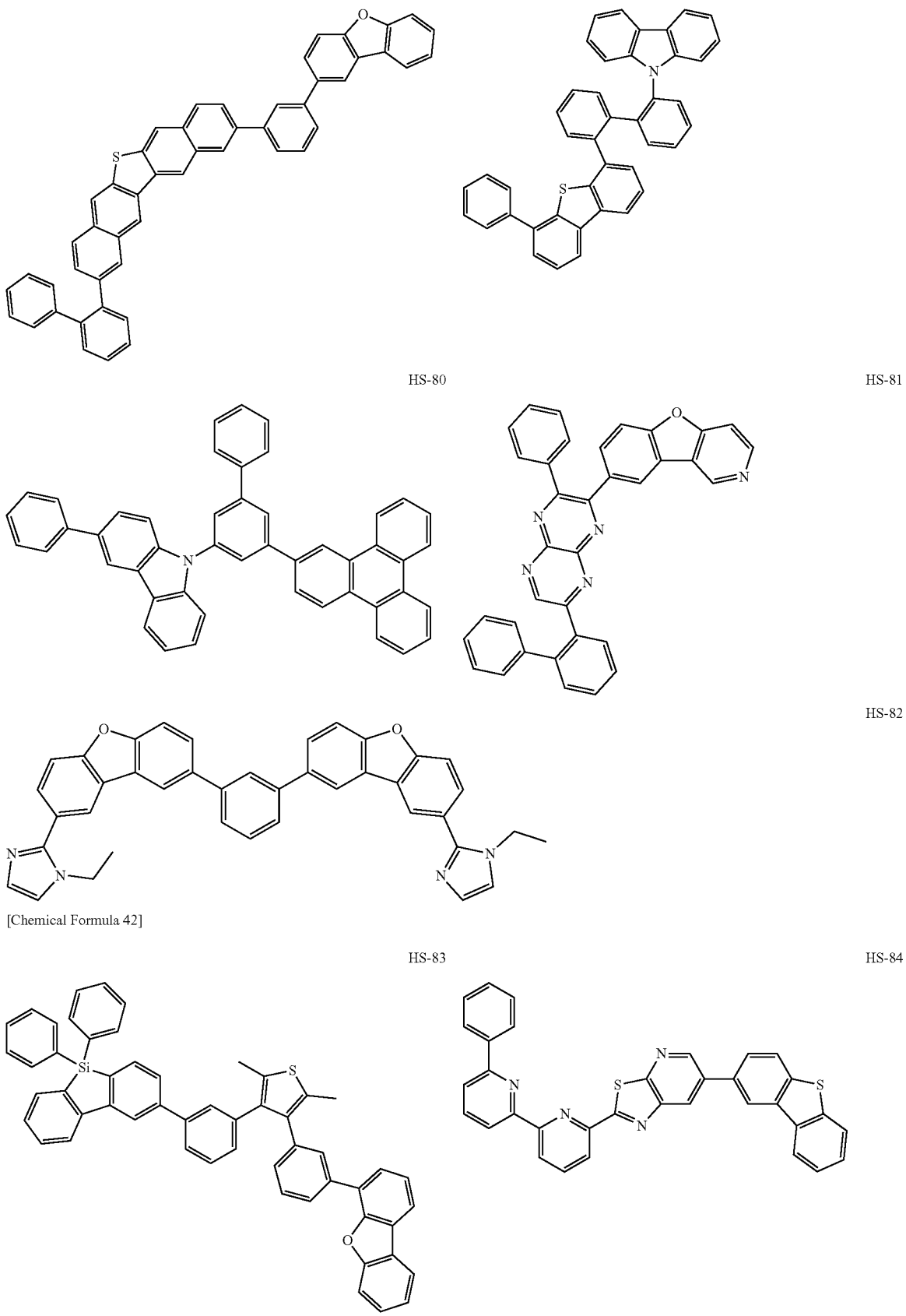

-continued
HS-85
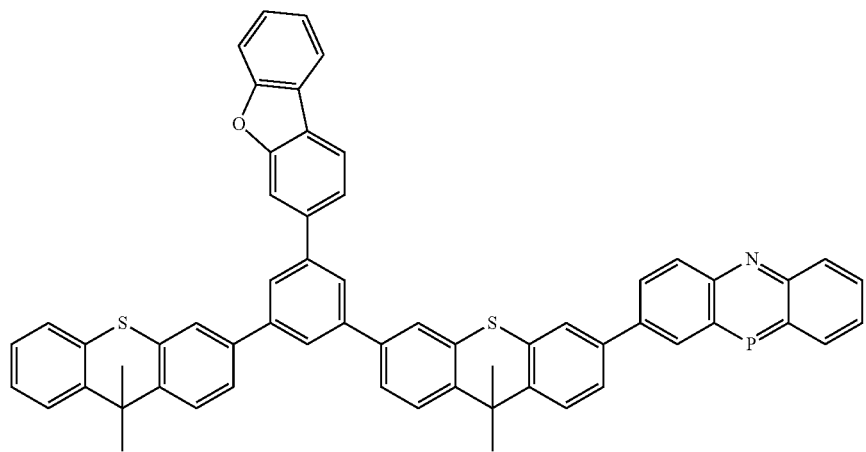
HS-86
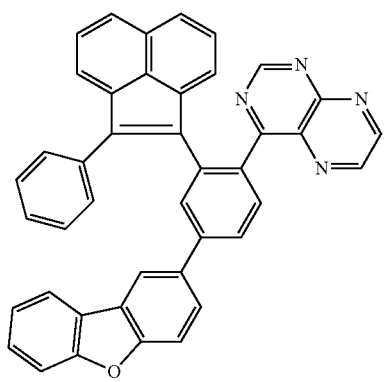
HS-87
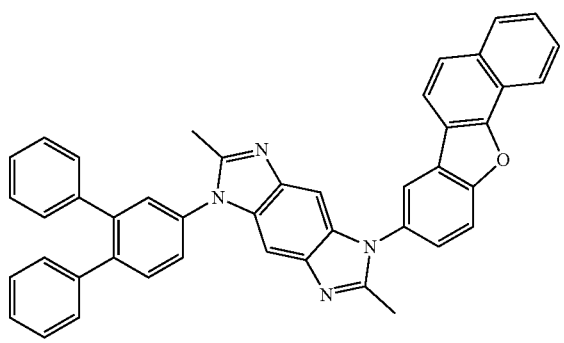
HS-88
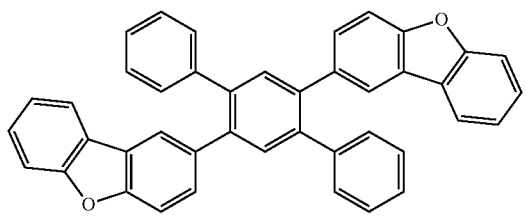
HS-89
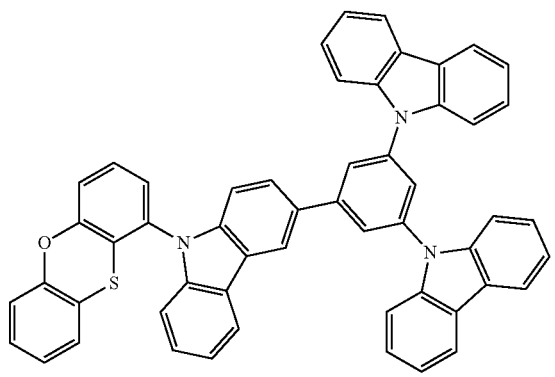

[Chemical Formula 43]
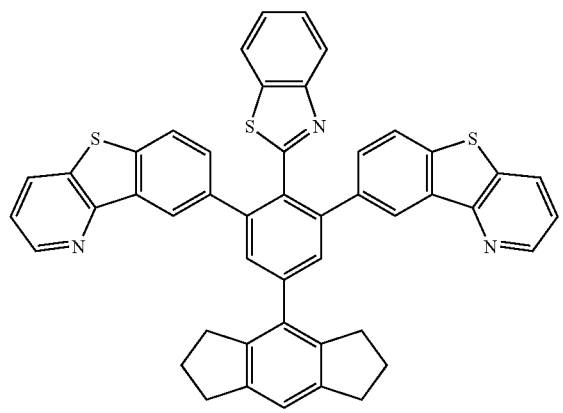
HS-90
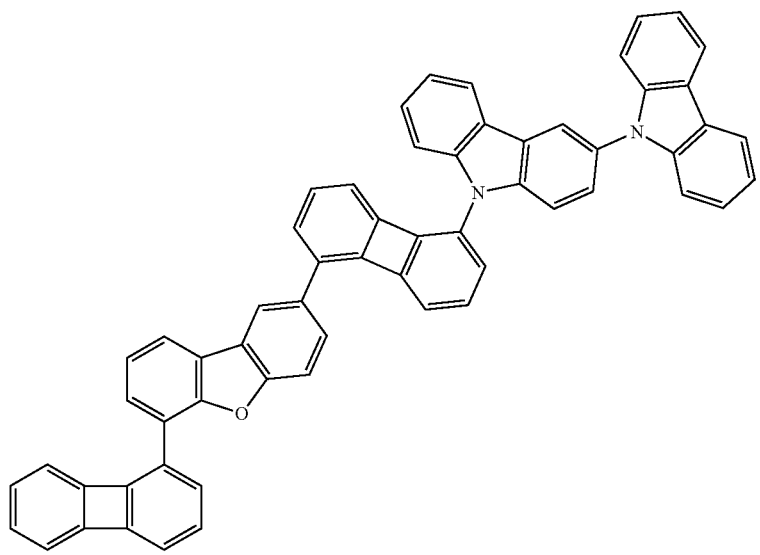
HS-91
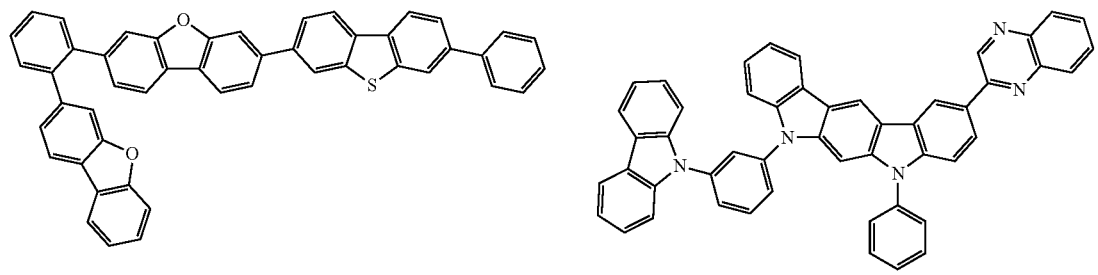
HS-92     HS-93
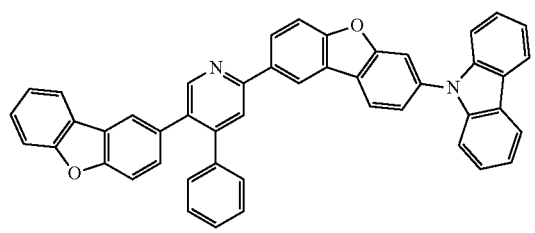
HS-94
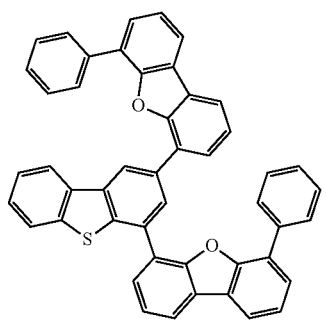
HS-95

HS-96
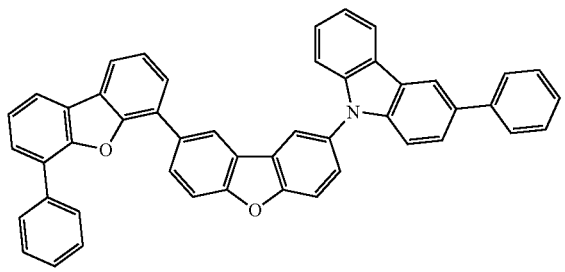
[Chemical Formula 44]
HS-97
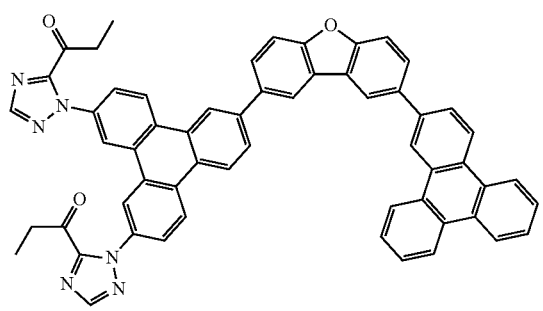
HS-98
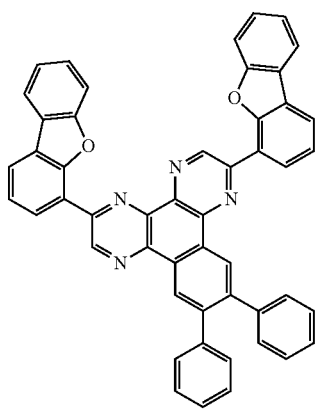
HS-99
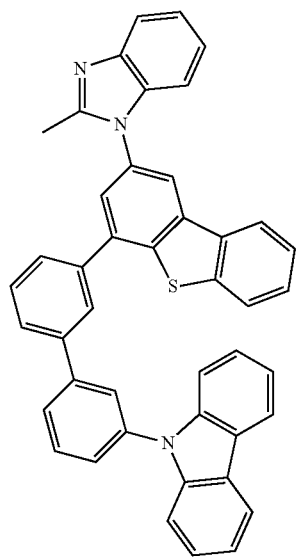
HS-100
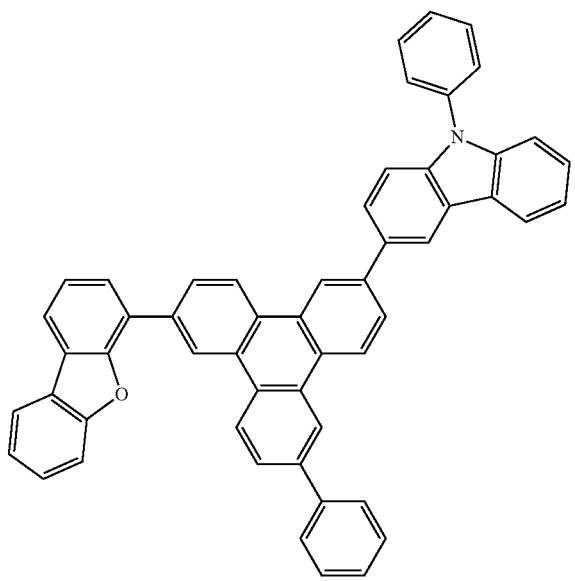

-continued
HS-101
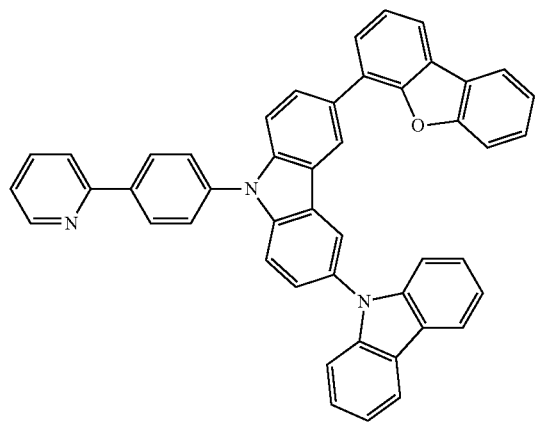
HS-102
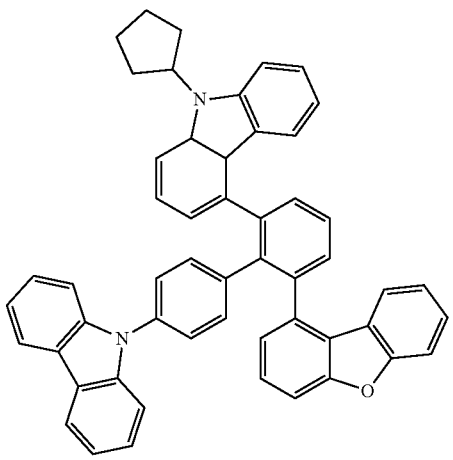
[Chemical Formula 45]
HS-103
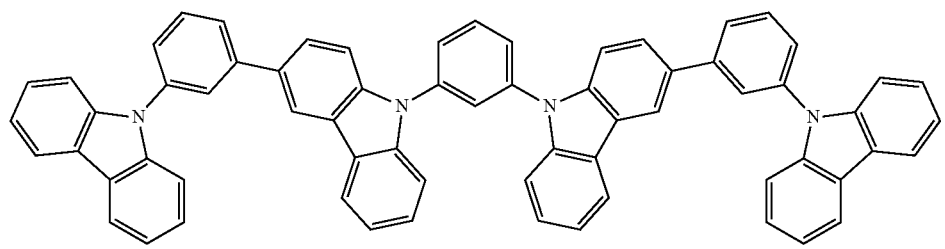
HS-104
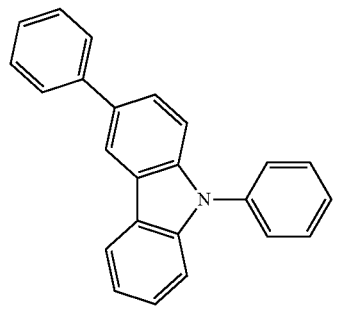
HS-105
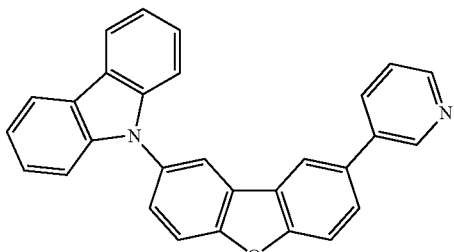
HS-106
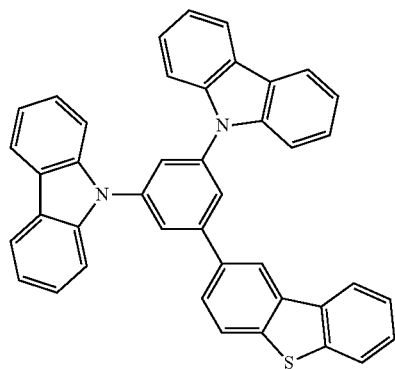
HS-107
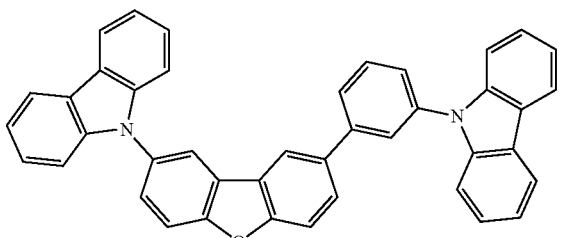

-continued
HS-108
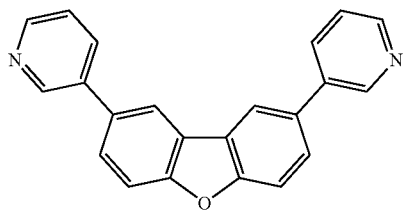
HS-109
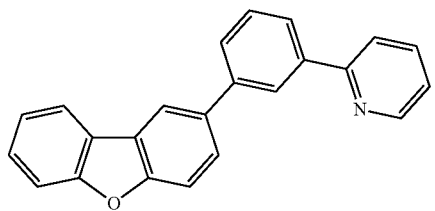
HS-110
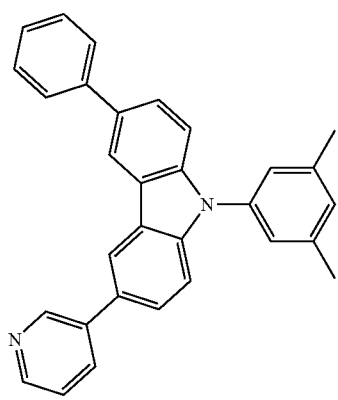
HS-111
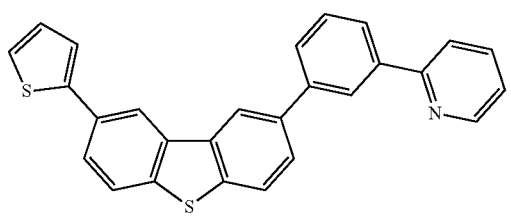
HS-112
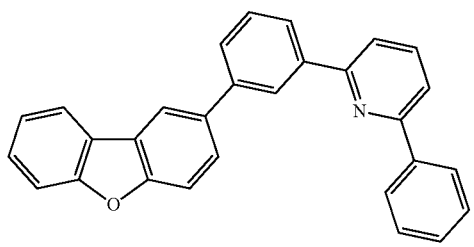
[Chemical Formula 46]
HS-113
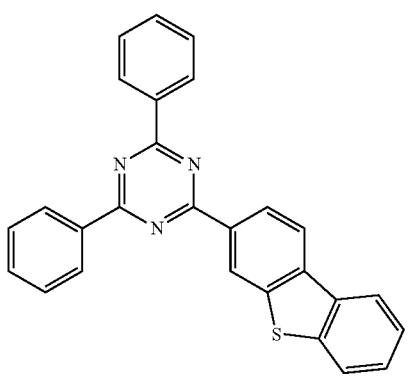
HS-114
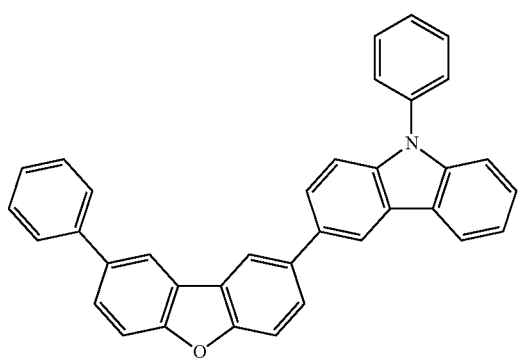

-continued
HS-115
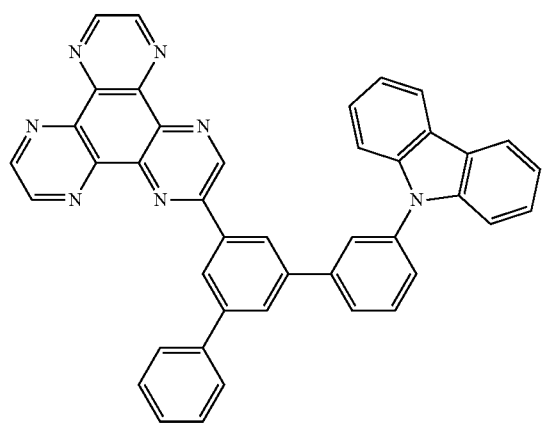
HS-116
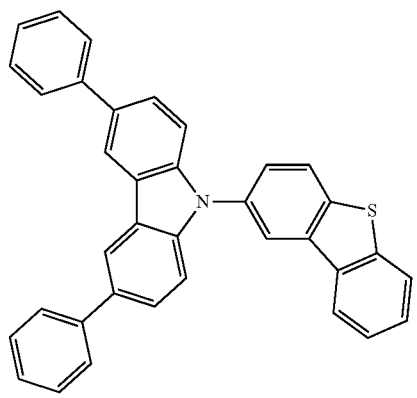
HS-117
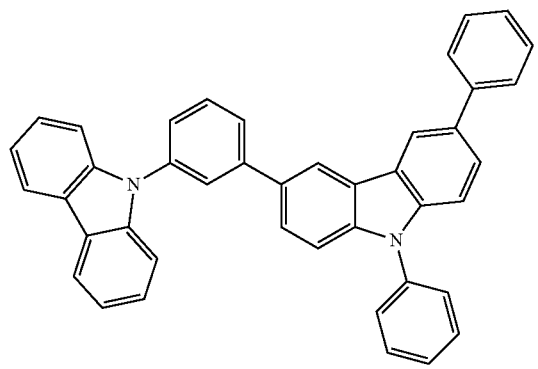
HS-118
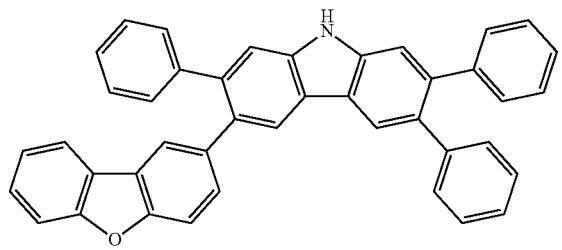
HS-119
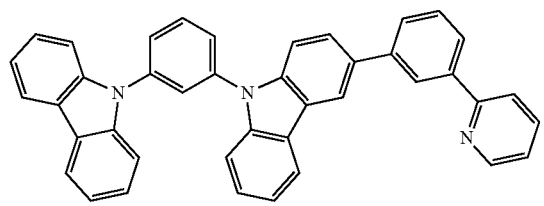
HS-120
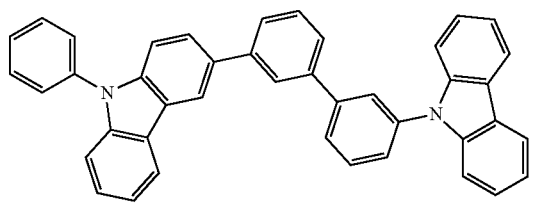
HS-121
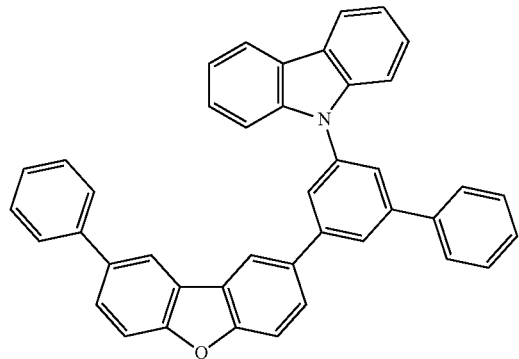

[Chemical Formula 47]
HS-122
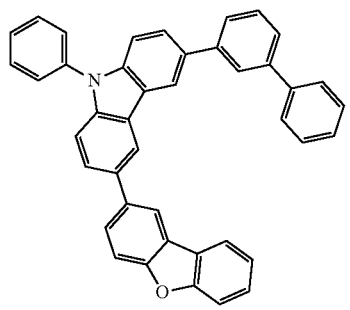
HS-123
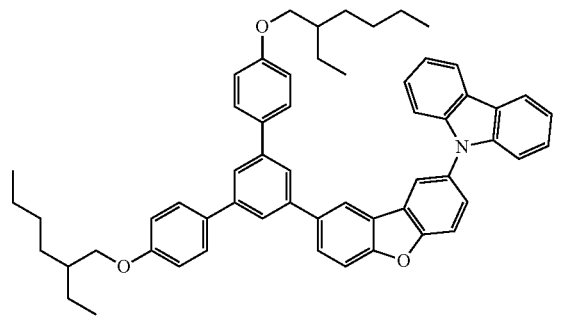
HS-124
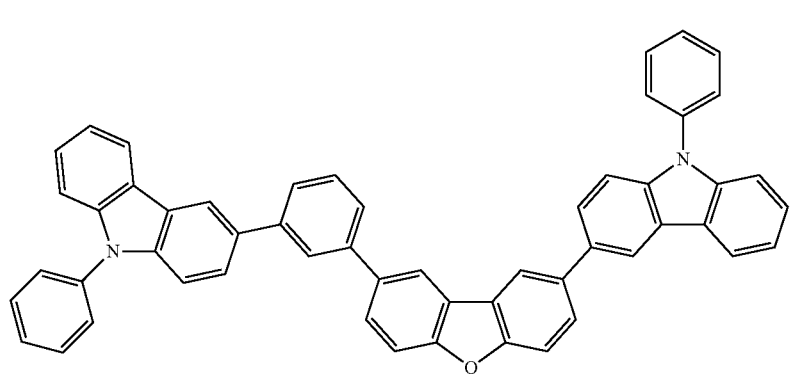
HS-125
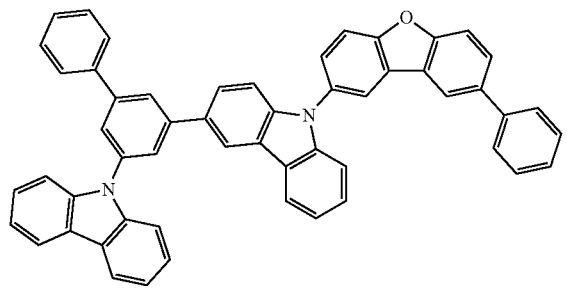
HS-126
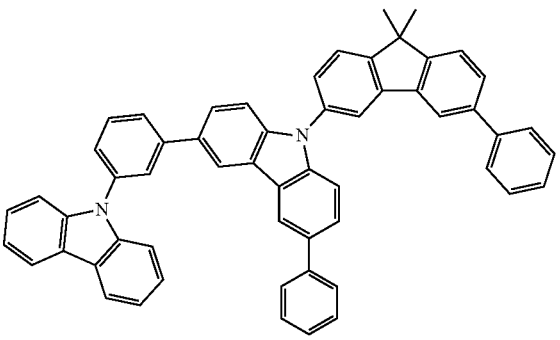
HS-127
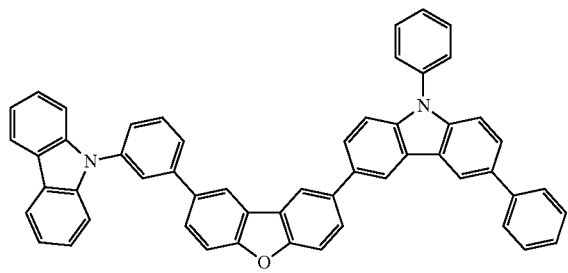

[Chemical Formula 48]
HS-128
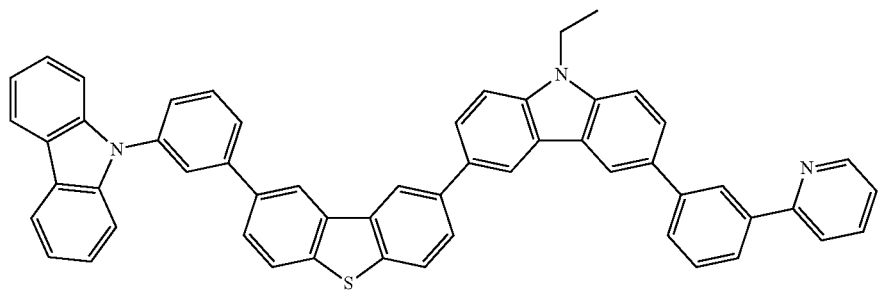
HS-129
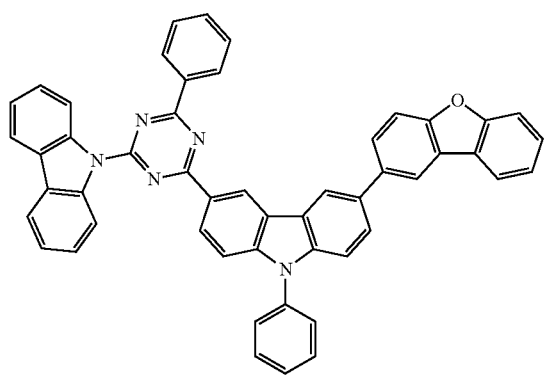
HS-130
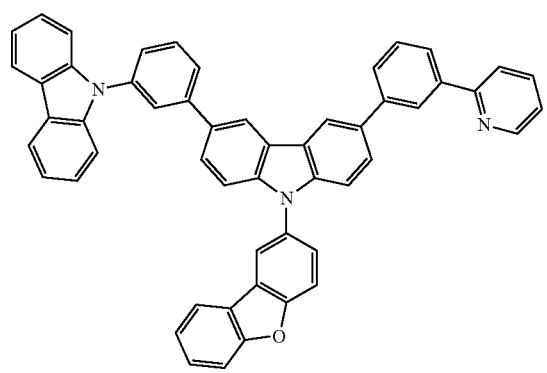
HS-131
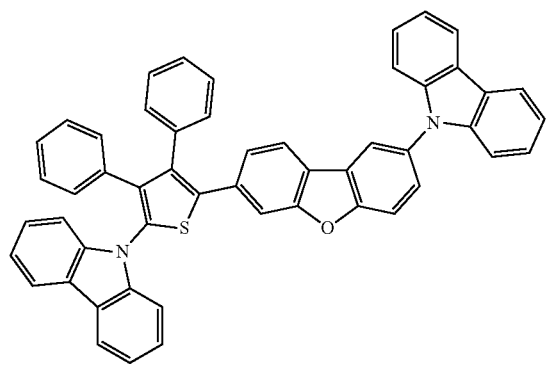
HS-132
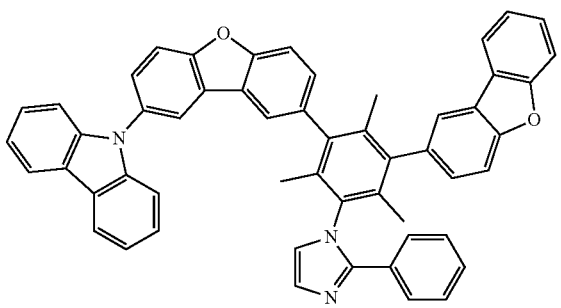
[Chemical Formula 49]
HS-133
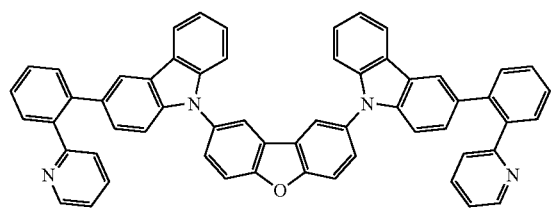
HS-134
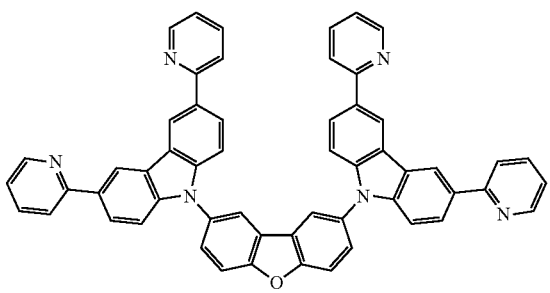

-continued
HS-135
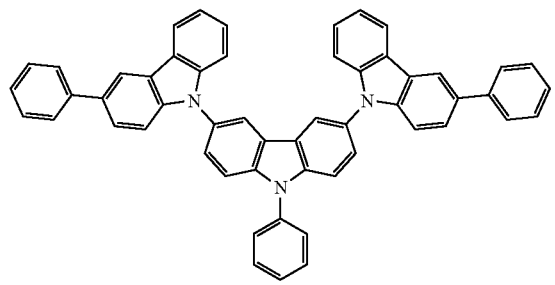
HS-136
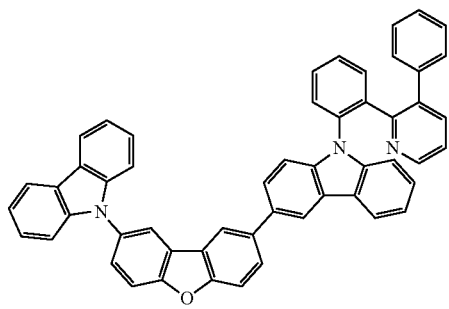
HS-137
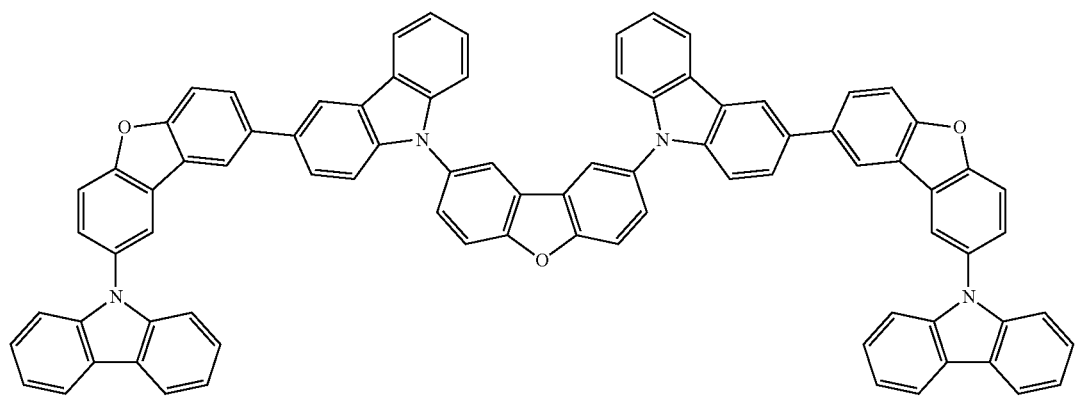
[Chemical Formula 50]
HS-138
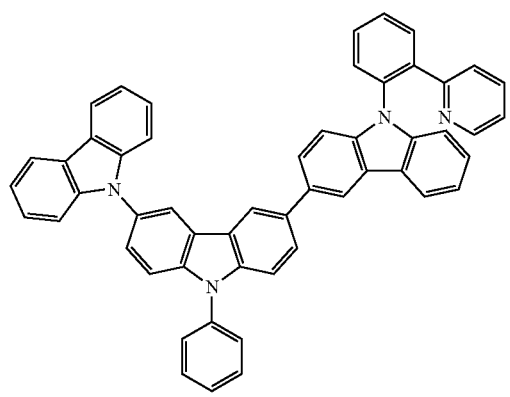
HS-139
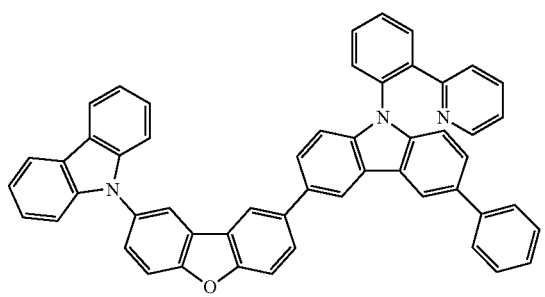
HS-140
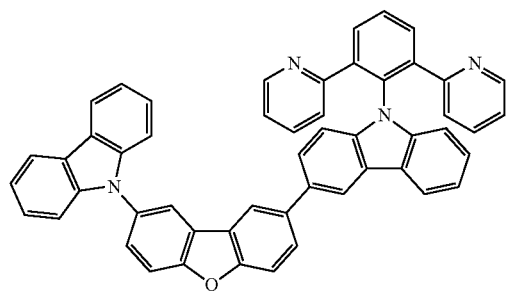
HS-141
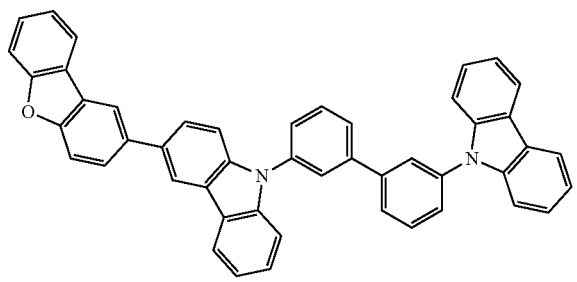

-continued
HS-142
HS-143
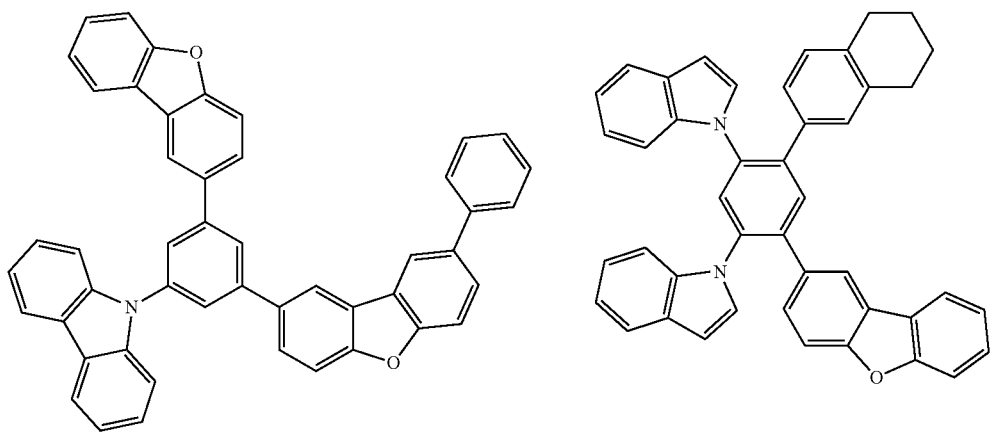
HS-144
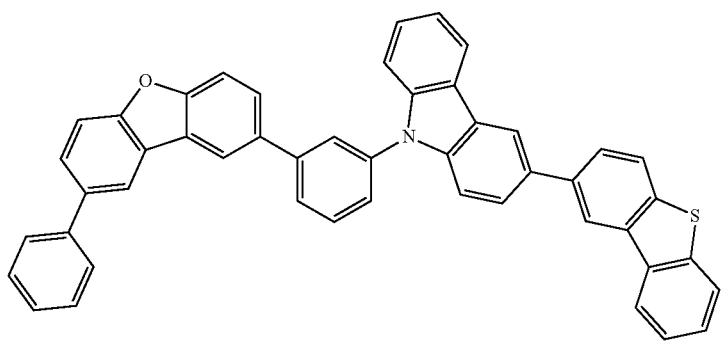
[Chemical Formula 51]
HS-145
HS-146
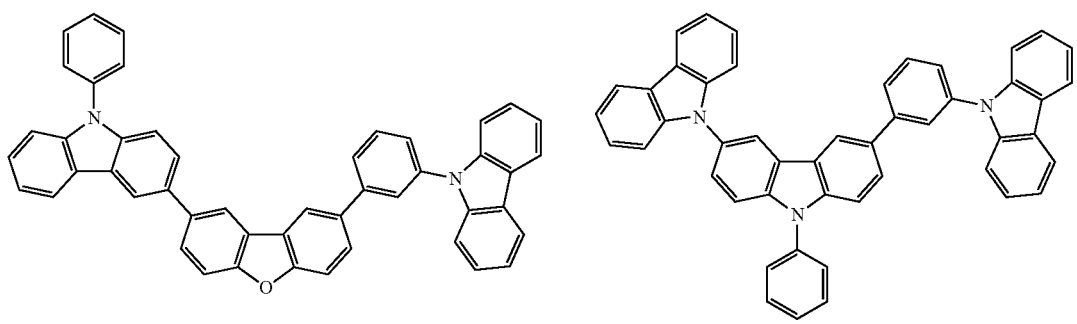
HS-147
HS-148
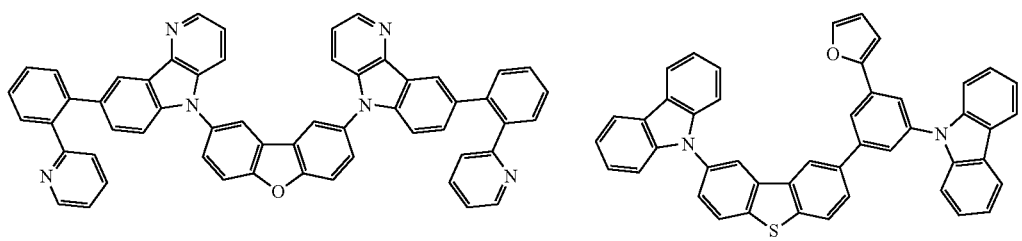

-continued
HS-149
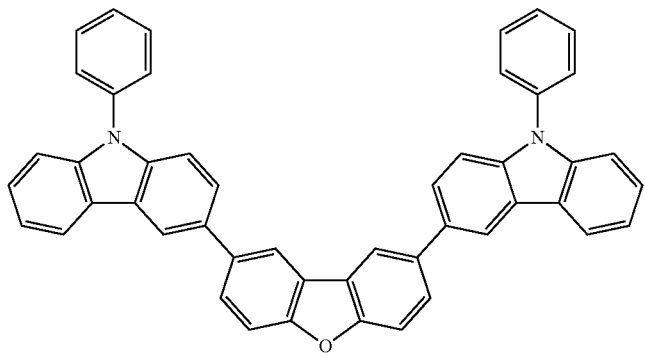
HS-150
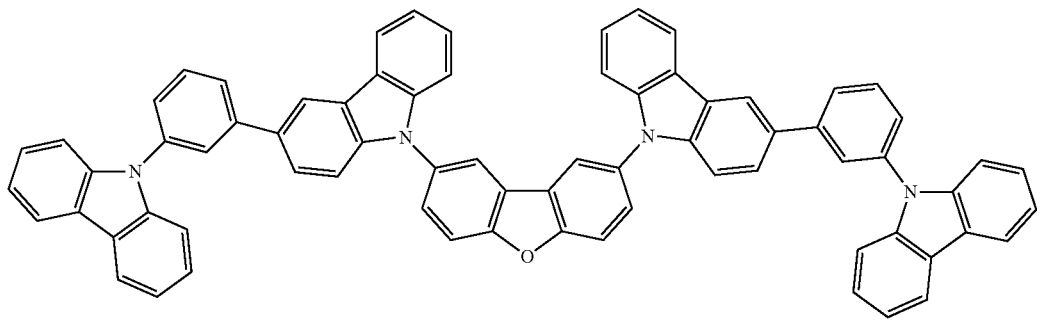
[Chemical Formula 52]
HS-151
HS-152
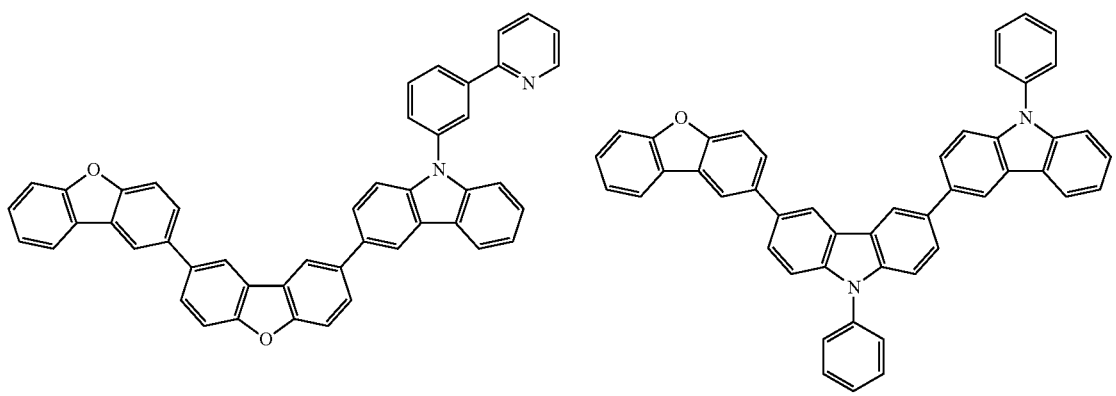
HS-153
HS-154
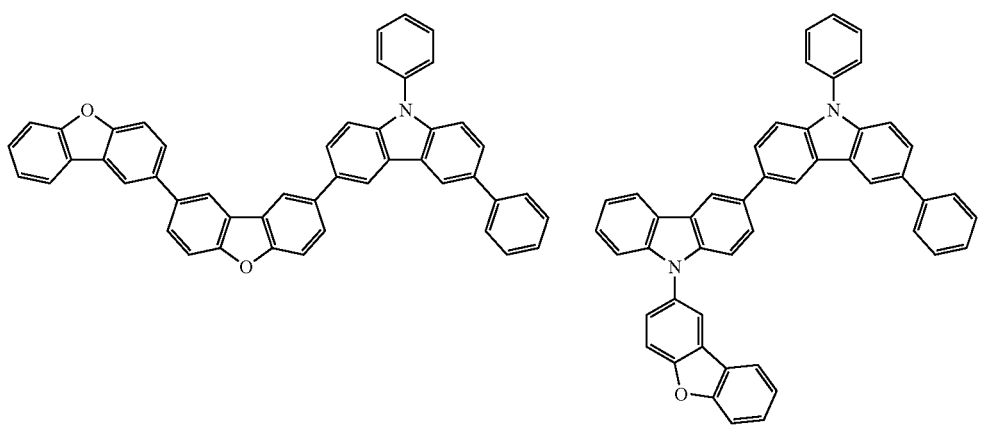

HS-155 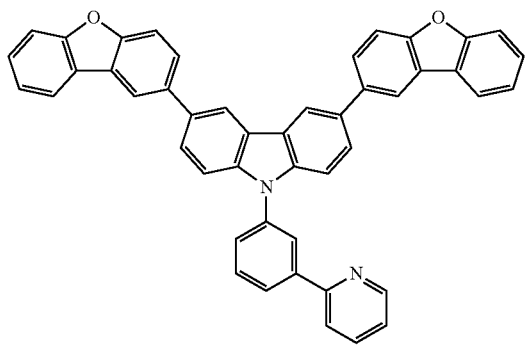
HS-156 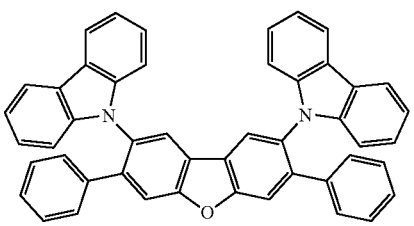
[Chemical Formula 53]
HS-157 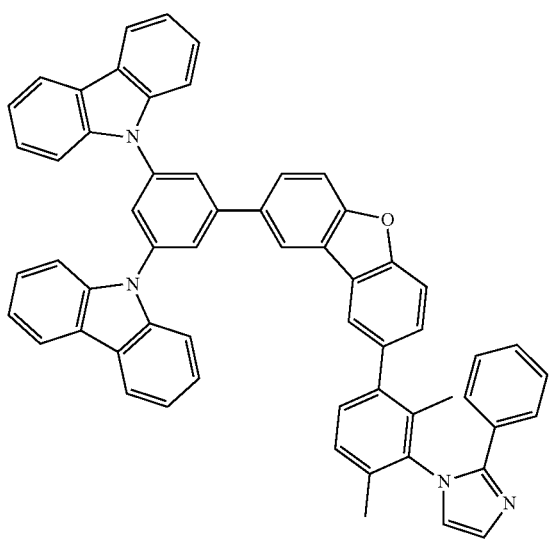
HS-158 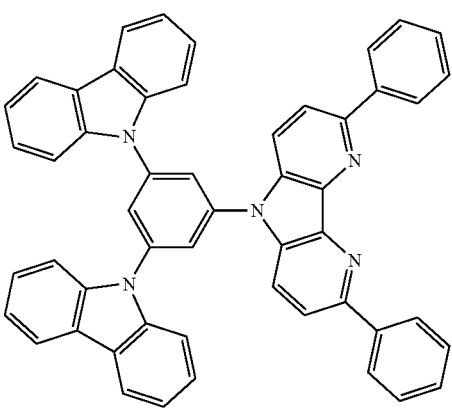
HS-159 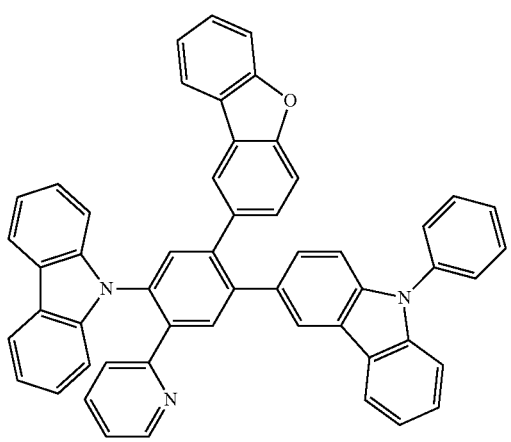
HS-160 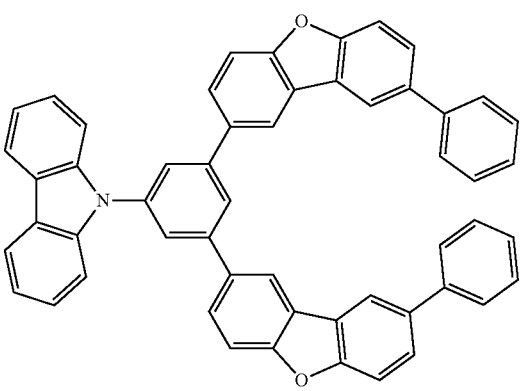

-continued
HS-161
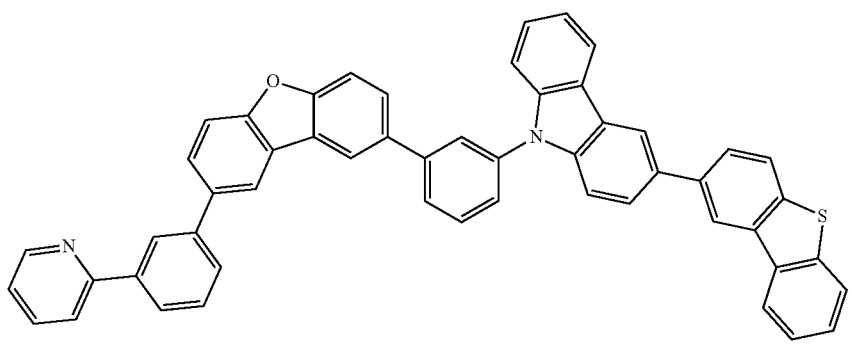
HS-162
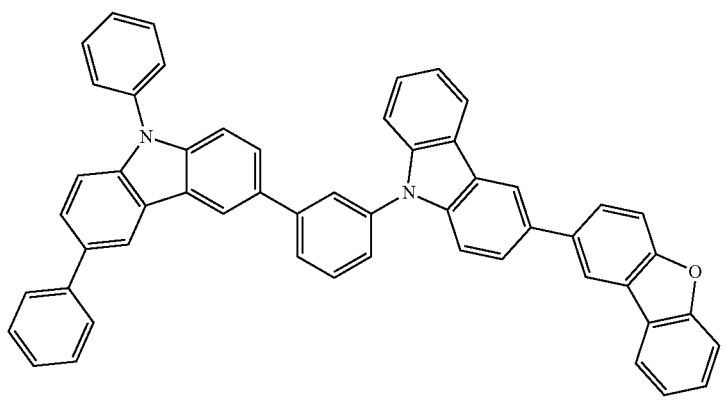
[Chemical Formula 54]
HS-163
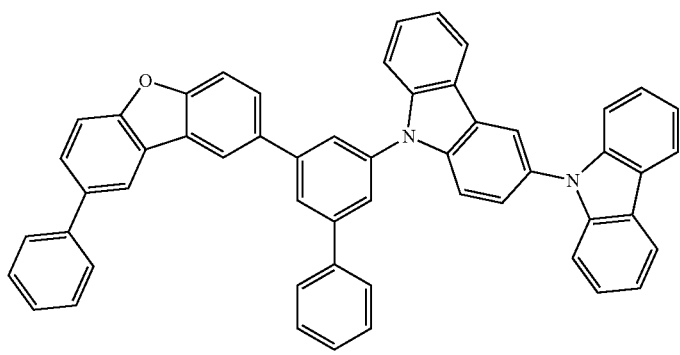
HS-164
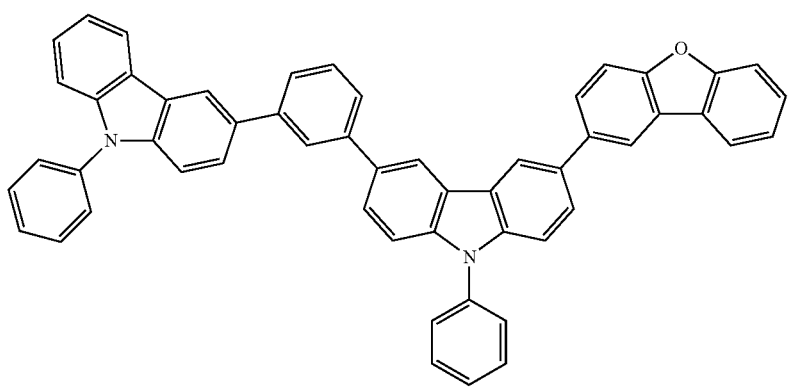

-continued
HS-165
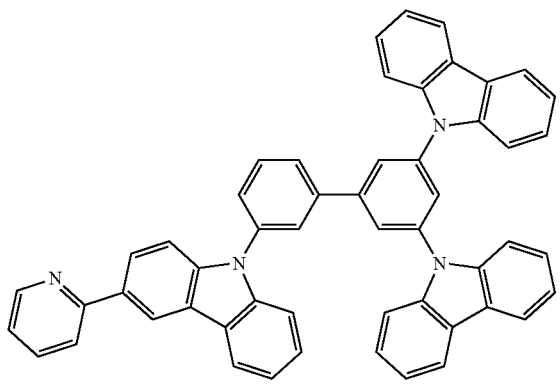
HS-166
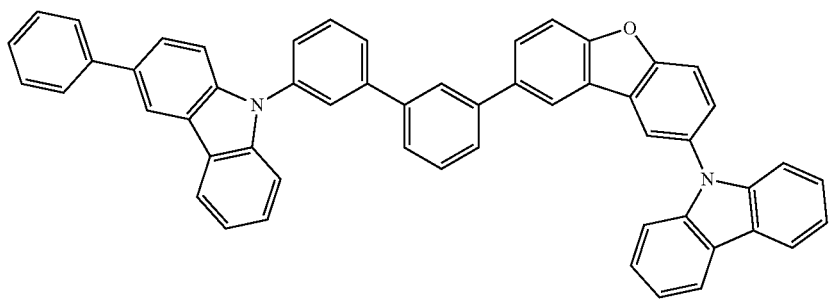
HS-167
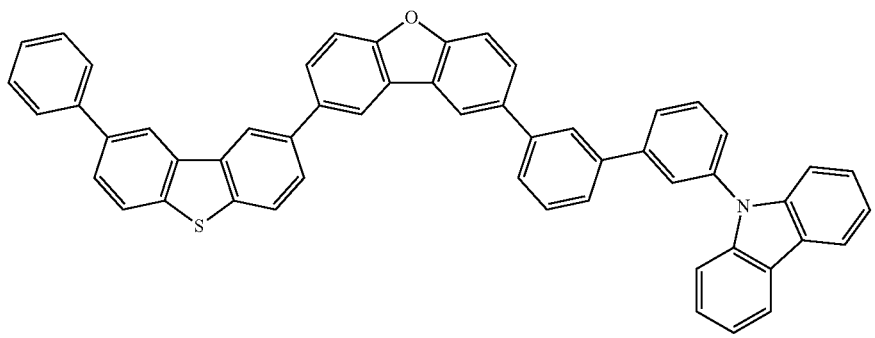
HS-168
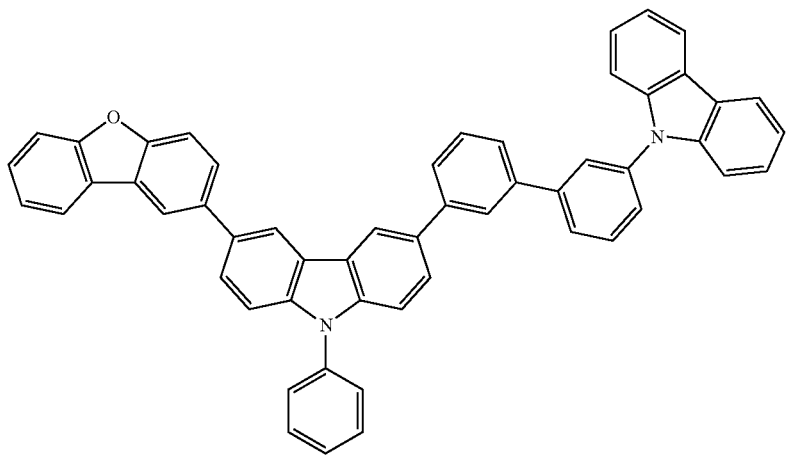

[Chemical Formula 55]
HS-169
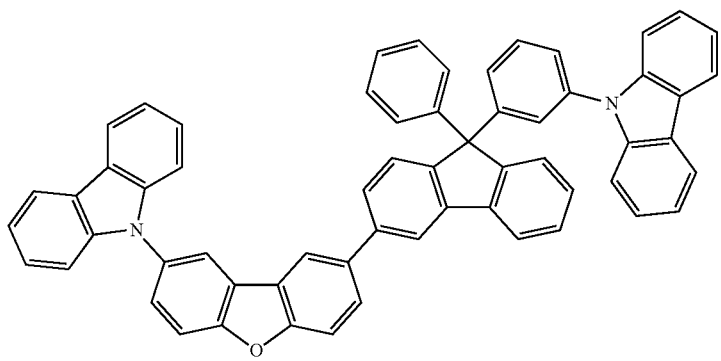
HS-170
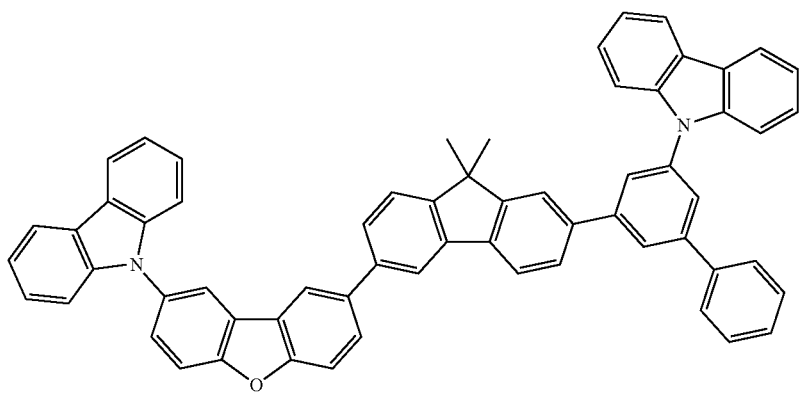
HS-171
HS-172
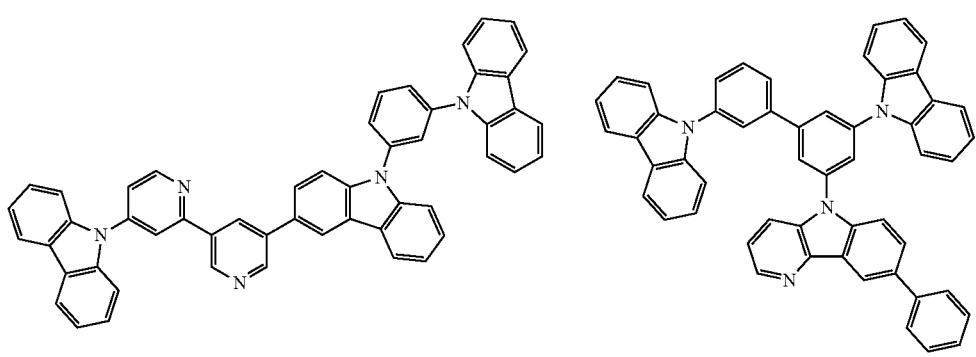
HS-173
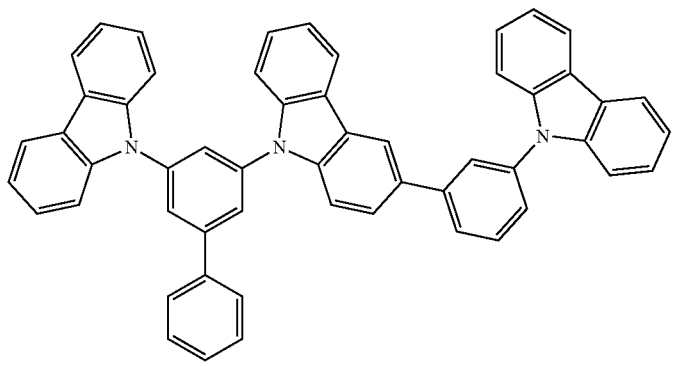

-continued
HS-174
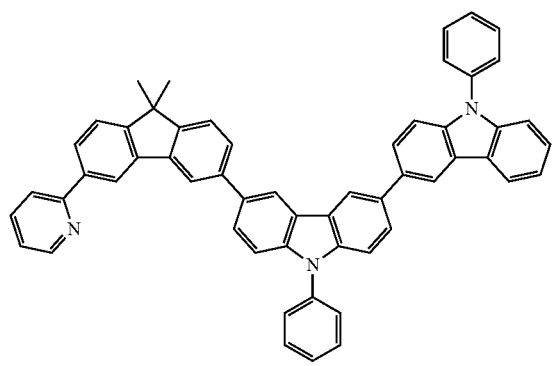
HS-175
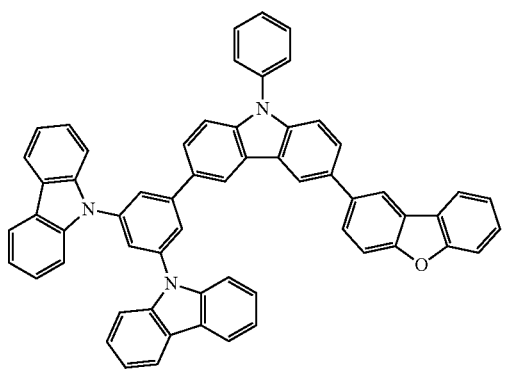
HS-176
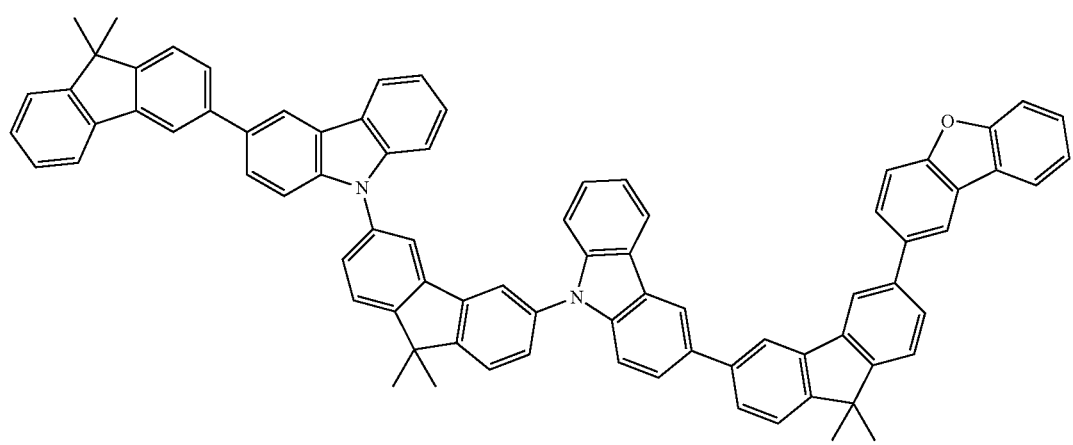
HS-177
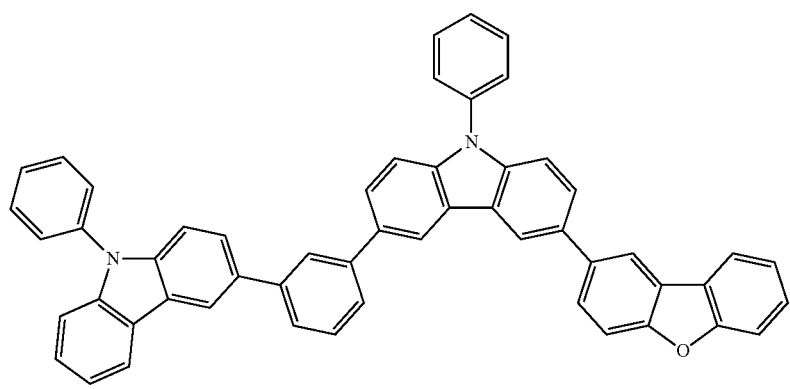
HS-178
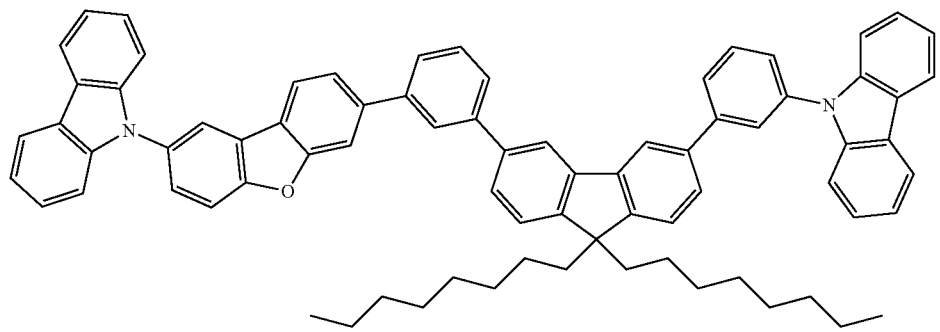

[Chemical Formula 57]
HS-179
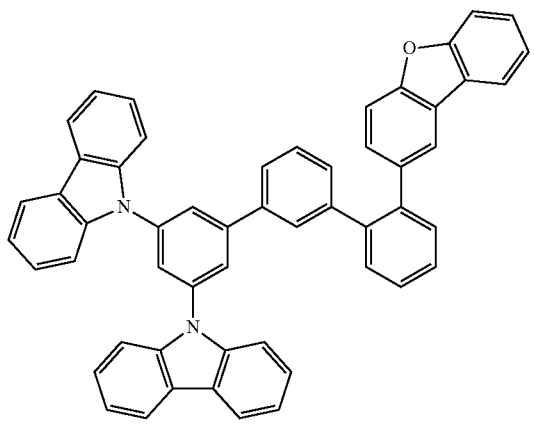
HS-180
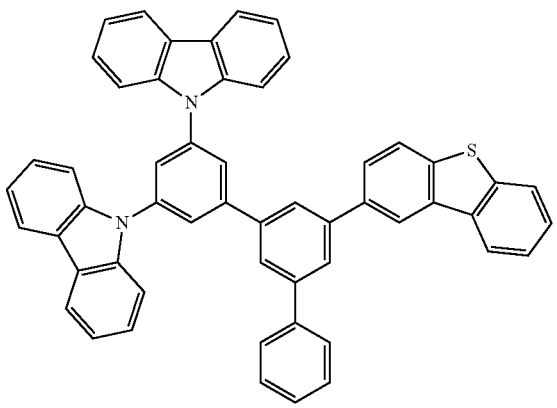
HS-181
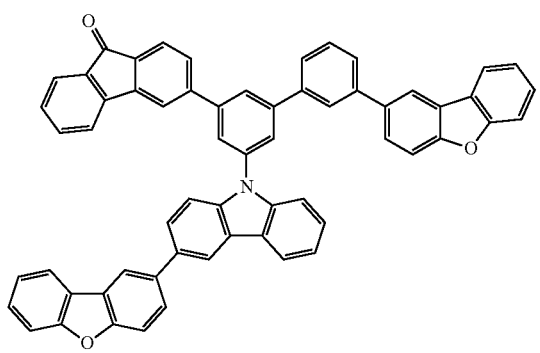
HS-182
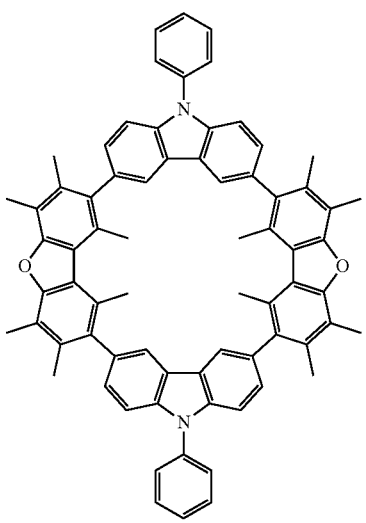
HS-183
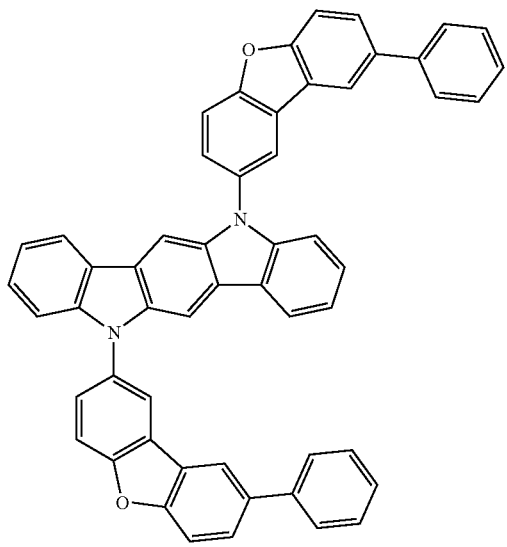

HS-184
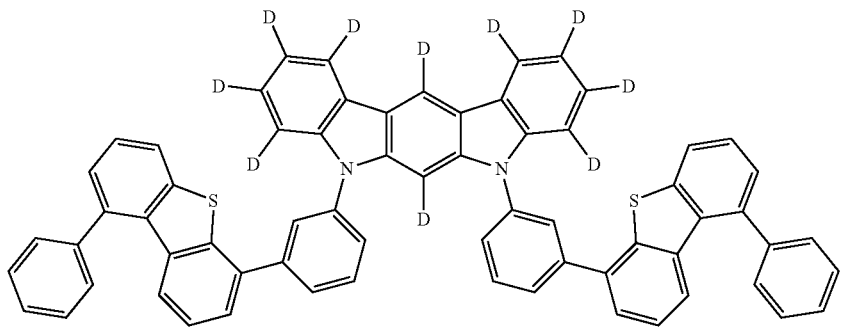
[Chemical Formula 58]
HS-185
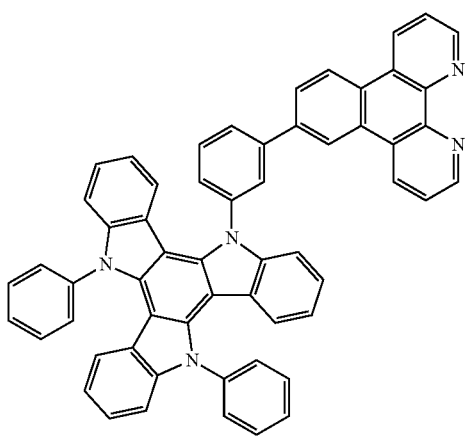
HS-186
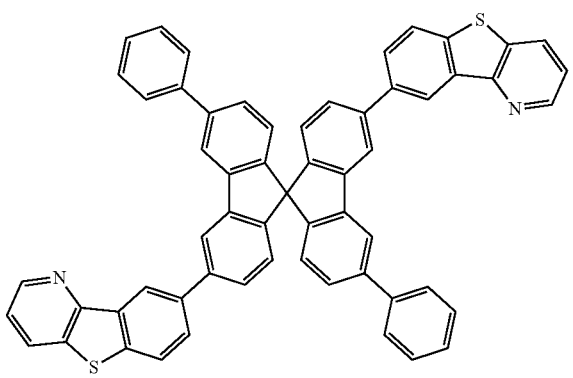
HS-187
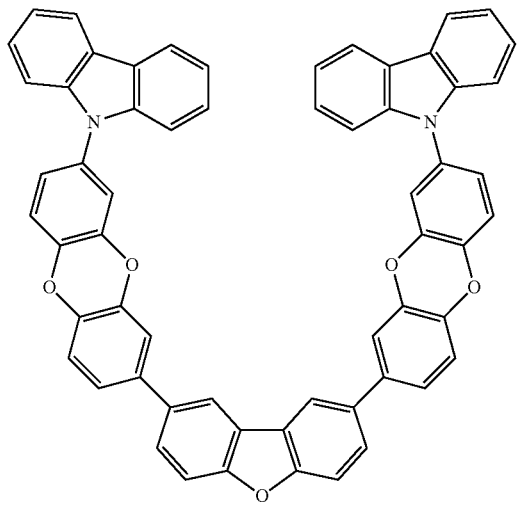
HS-188
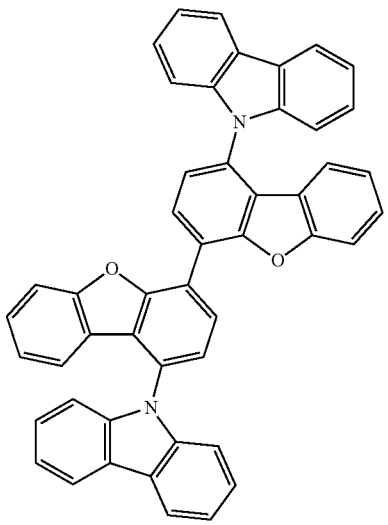

-continued
HS-189
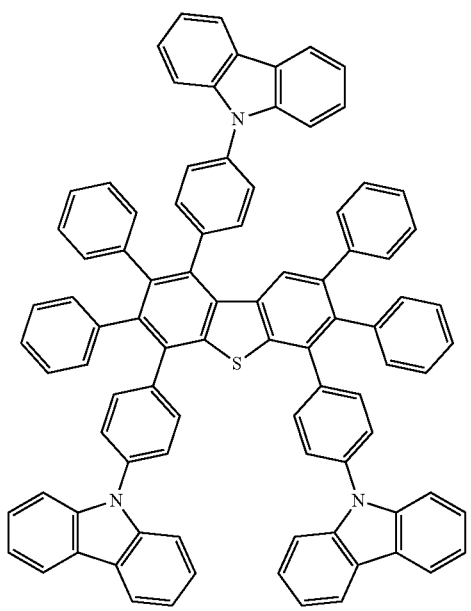
HS-190
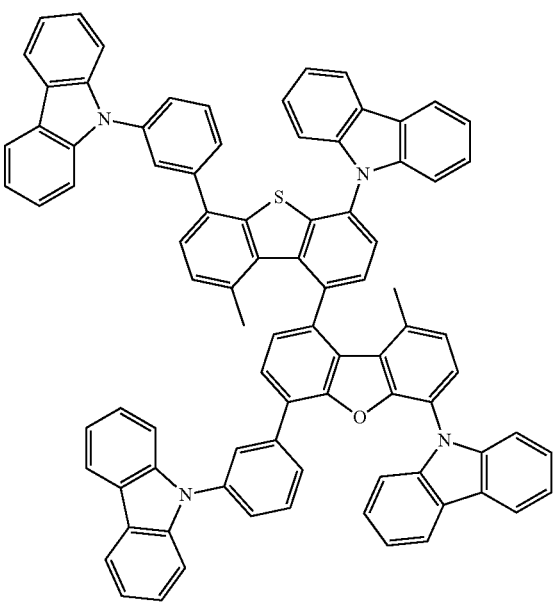
[Chemical Formula 59]
HS-191
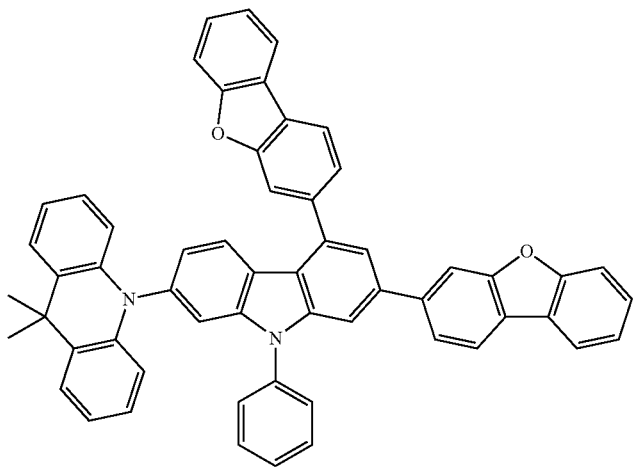
HS-192
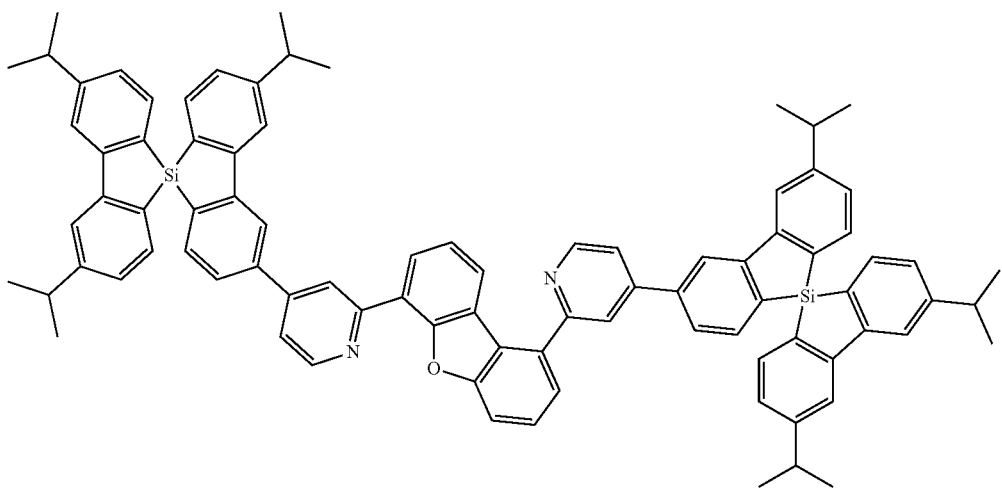

HS-193
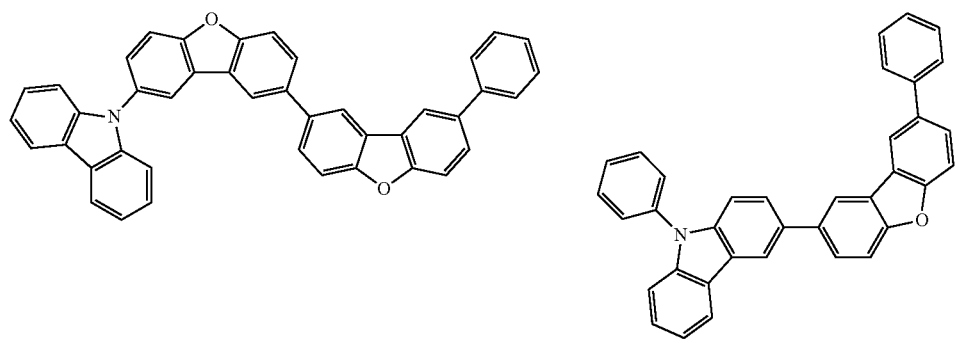
HS-194
HS-195
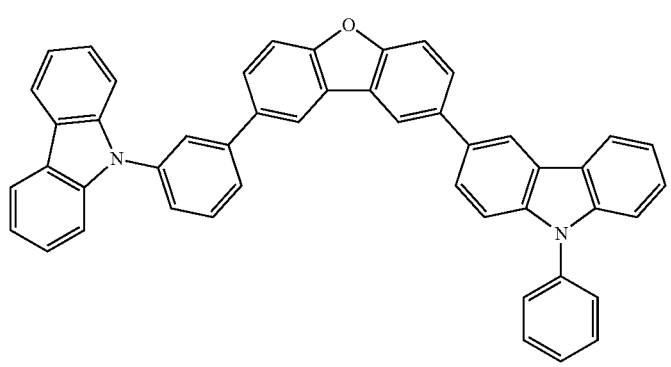
[Chemical Formula 60]
HS-196
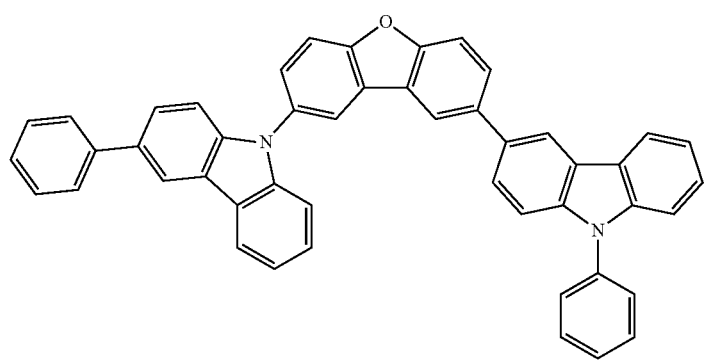
HS-197
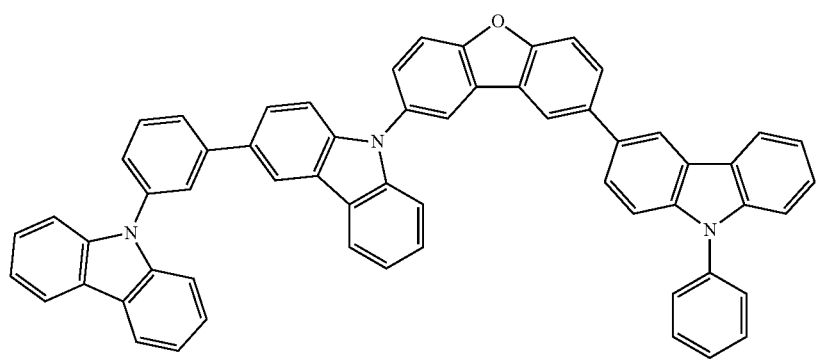

-continued

HS-198

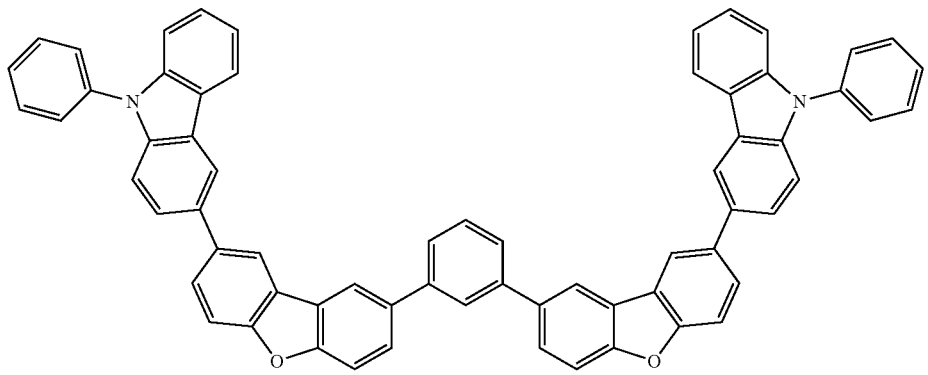

HS-199

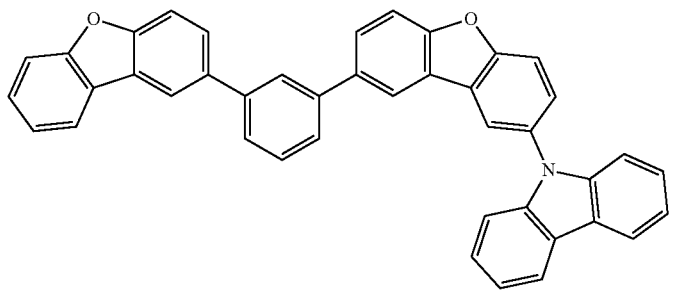

HS-200

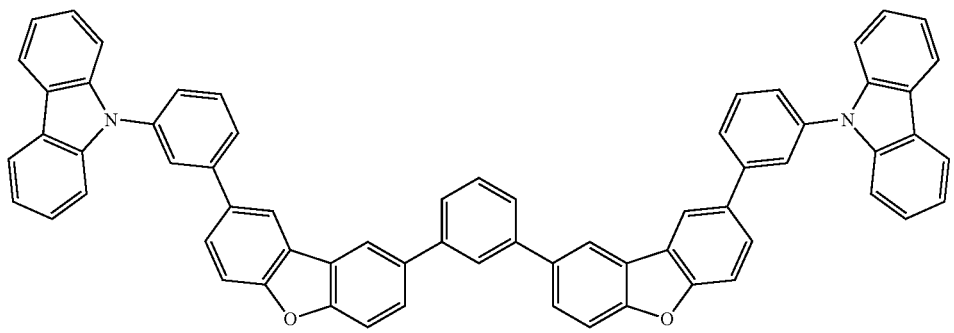

[Chemical Formula 61]

HS-201

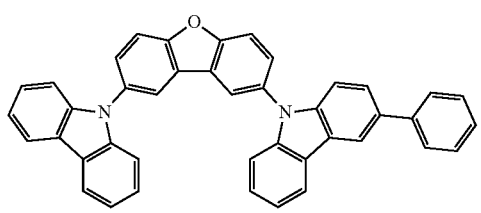

HS-202

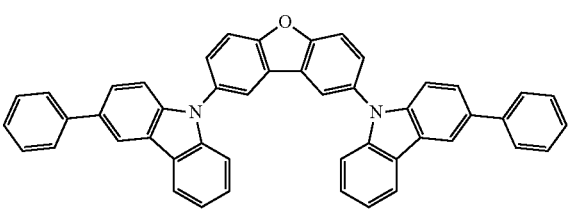

As host compounds, known host compounds may be used in combination with the compound represented by Formula (H1) of the present invention. Typical compounds usable in combination include those having basic skeletons, such as carbazole derivatives, triarylamine derivatives, aromatic derivatives, nitrogen-containing heterocyclic compounds, thiophene derivatives, furan derivatives, oligoarylene compounds; carboline derivatives; and diazacarbazole derivatives (diazacarbazole derivatives indicate compounds in which at least one of the carbon atoms in a hydrocarbon ring constituting the carboline ring of carboline derivatives is replaced with a nitrogen atom).

Known luminescent hosts which may be used in the present invention are preferably compounds having not only a hole transportability and an electron transportability, but also preventing emitted light from being shifted to a longer wavelength and having a high glass transition temperature (Tg). The Tg is more preferably 100° C. or more.

Transfer of charges can be controlled with a plurality of kinds of luminescent hosts to provide the organic EL element with high efficiency.

Furthermore, a plurality of kinds of known compounds used as the phosphorescent dopants can be used to mix different light emissions, thereby any luminescent color can be achieved.

The luminescent host used in the present invention may be either a low molecular weight compound, or a polymer compound having repeating units, including low molecular weight compounds having polymerizable groups such as a vinyl group and an epoxy group (polymerizable luminescent hosts). These compounds may be used alone or in combination.

Specific examples of known luminescent hosts include compounds described in the following documents:

Japanese Patent Application Laid-open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

<<Injection Layer: Hole Injection Layer (Anode Buffer Layer), Electron Injection Layer (Cathode Buffer Layer)>>

One or more injection layers are optionally provided. The injection layers are categorized into an electron injection layer and a hole injection layer, and may be provided between an anode and a light emitting layer or a hole transport layer, and/or between a cathode and a light emitting layer or an electron transport layer as described above. The injection layer is provided between an electrode and an organic layer to reduce driving voltage and to enhance emission luminance, detailed in "Yuki EL Soshi to Sono Kogyoka Saizensen (The Front Line of Organic EL elements and Engineering (Nov. 30, 1998, published by NTS Inc.)", Volume 2, Chapter 2 "Denkyoku Zairyo (Electrode Materials)", (p. 123-166). The injection layers are categorized into a hole injection layer (an anode buffer layer) and an electron injection layer (a cathode buffer layer).

The anode buffer layer (hole injection layer) is also detailed in Japanese Patent Application Laid-open Nos. H09-45479, H09-260062 and H08-288069, and specific examples thereof include a phthalocyanine buffer layer, typically composed of copper phthalocyanine; an oxide buffer layer, typically composed of vanadium oxide; an amorphous carbon buffer layer; a polymer buffer layer including conductive polymer such as polyaniline (emeraldine) and polythiophene; and an orthometalated complex layer, typically composed of a tris(2-phenylpyridine)iridium complex.

A cathode buffer layer (an electron injection layer) is detailed in Japanese Patent Application Laid-open Nos. H06-325871, H09-17574 and H10-74586. Specific examples thereof include a metal buffer layer, typically composed of strontium and aluminum; an alkaline metal buffer layer, typically composed of lithium fluoride, sodium fluoride, or potassium fluoride; an alkaline earth metal buffer layer, typically composed of magnesium fluoride; and an oxide buffer layer, typically composed of aluminum oxide. The buffer layer (injection layer) is preferably a significantly thin film, and its thickness is preferably in the range of 0.1 nm to 5 µm, depending on raw materials.

The material used for an anode buffer layer or for a cathode buffer layer can be used in combination with other materials. For example, they can be added, in the form of a mixture, to a hole transport layer or in an electron transport layer.

<<Hole Transport Layer>>

The hole transport layer, which is composed of a hole transport material having a hole transport function, includes a hole injection layer and an electron blocking layer in a broad sense. The present invention is characterized by a plurality of hole transport layers. A hole transport layer near the anode is referred to as a first hole transport layer (HT1), and the hole transport layer adjacent to the light emitting layer is referred to as a second hole transport layer (HT2).

The hole transport material can perform either hole injection or transportation or electron blocking, and may be either an organic or inorganic substance. Examples thereof include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers, and conductive oligomers, especially thiophene oligomer, etc.)

Those materials described can be used as hole transport materials. Porphyrin compounds, aromatic tertiary amine compounds, and styrylamine compounds are preferred. Aromatic tertiary amine compounds are particularly preferred.

Typical examples of the aromatic tertiary amine compounds and the styrylamine compounds include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminodiphenylether, 4,4'-bis(diphenylamino)quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; N-phenylcarbazole; and those having two fused aromatic rings in a molecule described in U.S. Pat. No. 5,061,569, such as 4,4'-bis[N-(1-naphthyl)-N-phenylamino]biphenyl (NPD), and 4,4',4''-tris[N-(3-methylphenyl)-N-phenylamino]triphenylamine (MTDATA), in which three triphenylamine units are bonded into a starburst form, described in Japanese Patent Application Laid-open No. H04-308688.

Also polymer materials consisting of the above materials in their polymer chains or containing the above materials in their main chains of polymers can be used.

An inorganic compound such as p-type Si and p-type SiC can also be used as a hole injection material and a hole transport material.

Cyclometalated complexes and ortho-metalated complexes, which are represented by copper phthalocyanine, tris(2-phenylpyridine) iridium complex, etc. can also be used as a hole transfer material.

Furthermore, so-called p-type hole transport materials described in Japanese Patent Application Laid-open No. H11-251067 and literature of J. Huang et. al. (Applied Physics Letters 80 (2002), p. 139) can also be used. In the present invention, these materials are preferably used because light emitting elements having higher efficiency can be prepared.

The hole transport layer can be prepared by forming a thin film made of the above-described hole transport material by a known method, such as vacuum evaporation method, spin coating method, casting method, printing method including inkjetting method, and LB method.

The thickness of the hole transport layer is, but not particularly limited to, generally approximately from 5 nm to 5 μm, preferably from 5 nm to 200 nm. The hole transport layer may be a single layer structure composed of one kind or two or more kinds of the materials described above.

Furthermore, an impurity-doped hole transport layer having high P characteristics can also be used. The examples thereof include those described in Japanese Patent Application Laid-open Nos. H04-297076, 2000-196140, and 2001-102175, and J. Appl. Phys., 95, 5773 (2004).

In the present invention, such a hole-transporting layer having high p characteristics is preferably used because the elements having lower power consumption can be prepared.

Hereinafter specific examples of the compounds preferably used for forming the hole injection layer and the hole transport layer of the organic EL element of the present invention are shown, but the present invention is not limited to these examples.

[Chemical Formula 62]

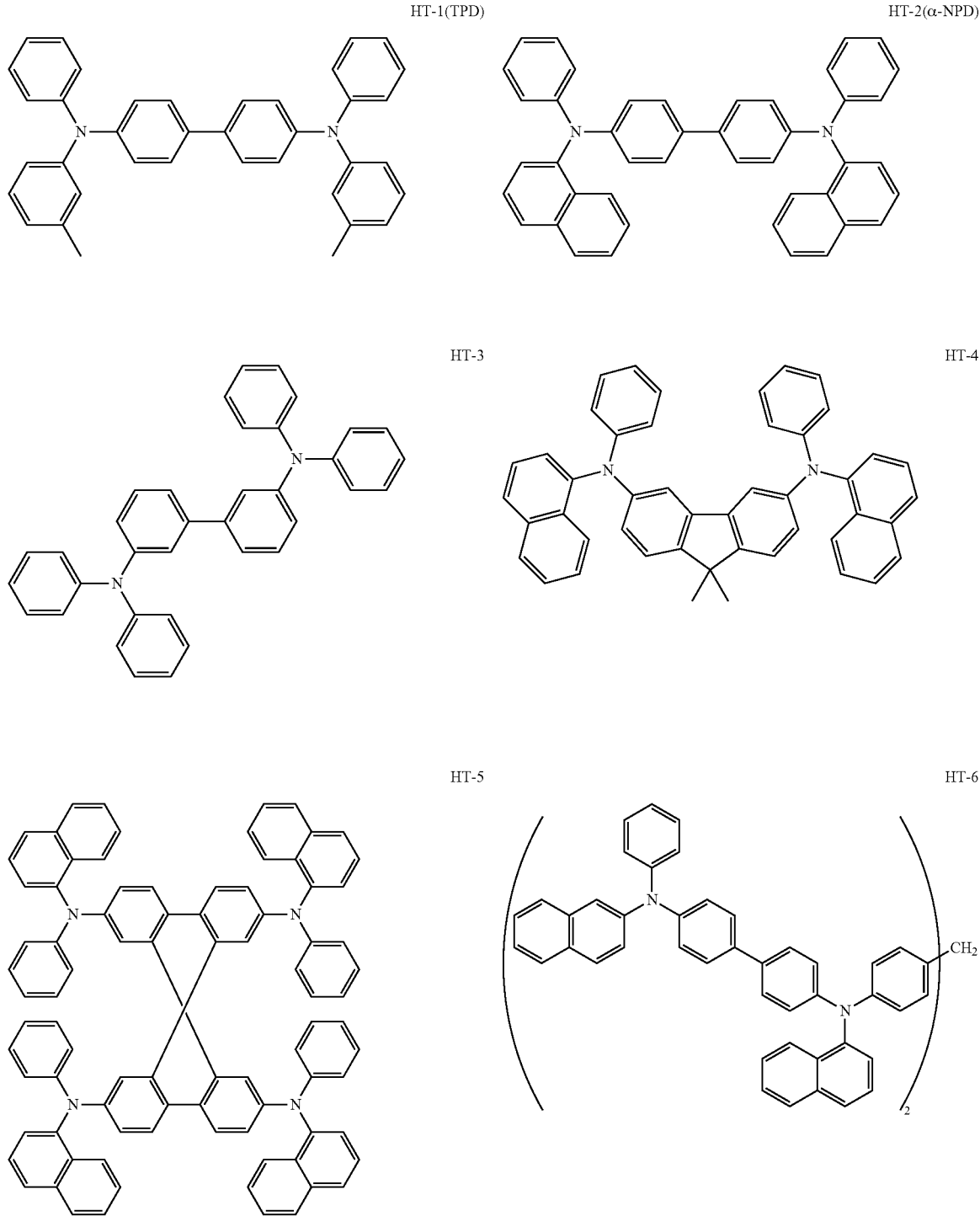

[Chemical Formula 63]
HT-7
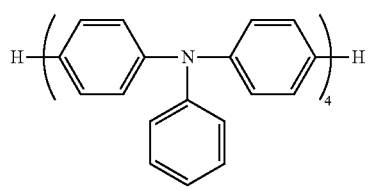
HT-8
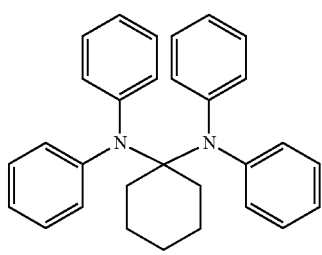
HT-9(F8-TFB)
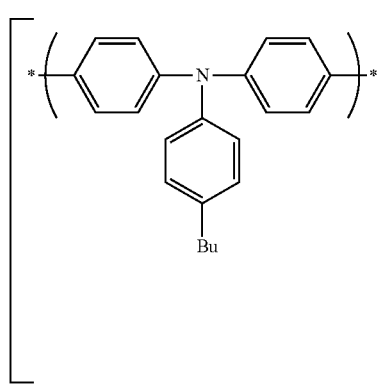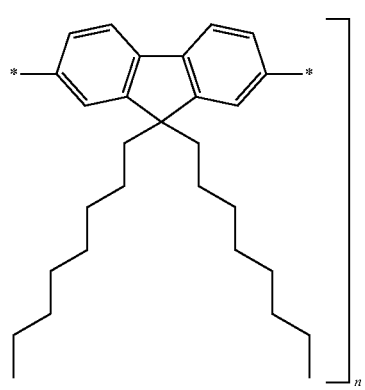
HT-10
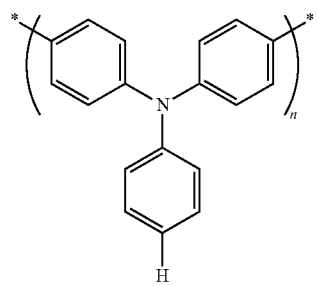
HT-11
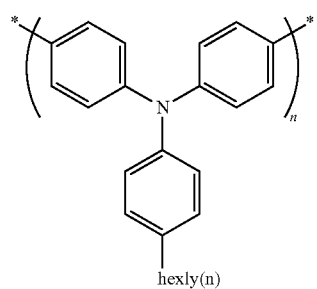
HT-12
[Chemical Formula 64]
HT-13
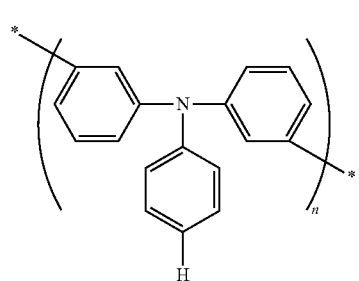
HT-14
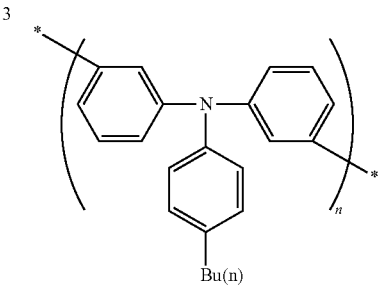

-continued
HT-15
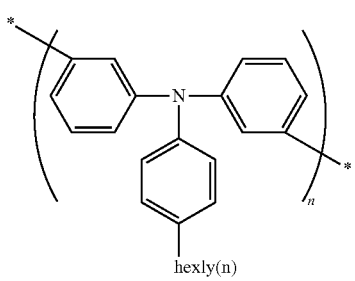
HT-16
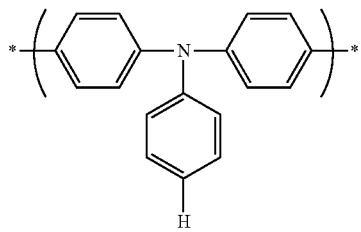
HT-17
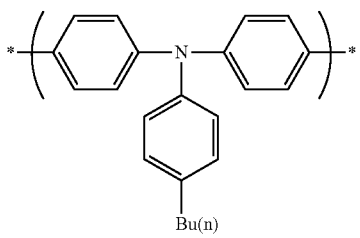
HT-18
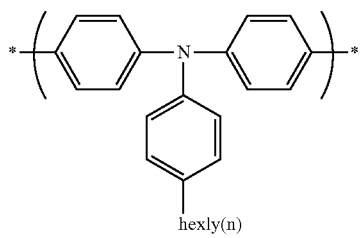
HT-19
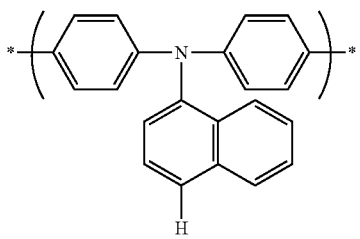
HT-20
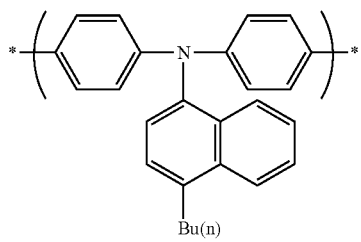
HT-21
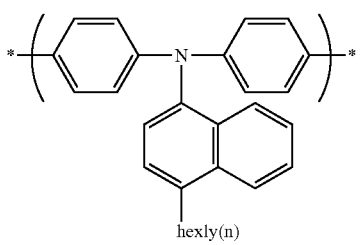
[Chemical Formula 65]
HT-22
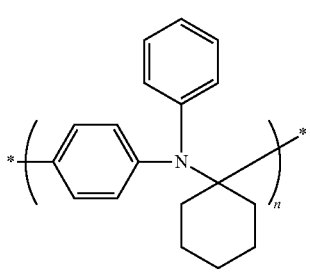
HT-23
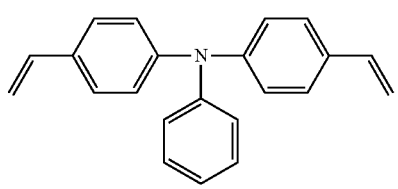
HT-24
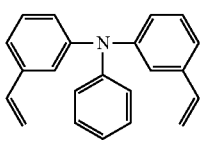
HT-25
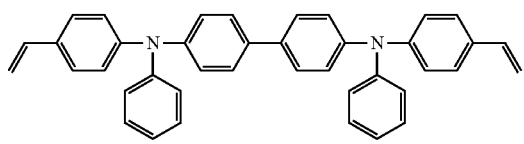

-continued
HT-26 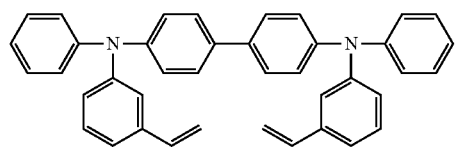
HT-27 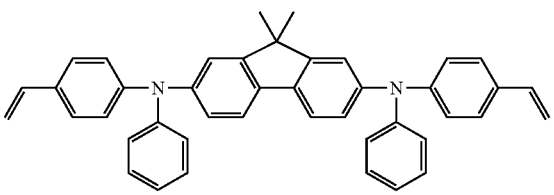
HT-28 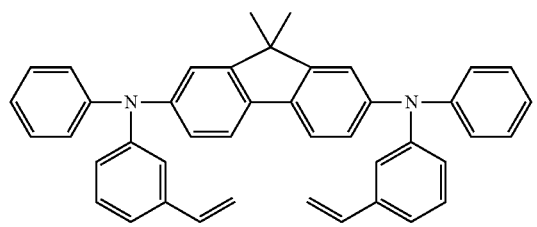
HT-29 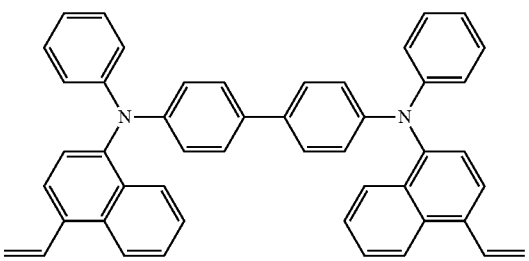
[Chemical Formula 66]
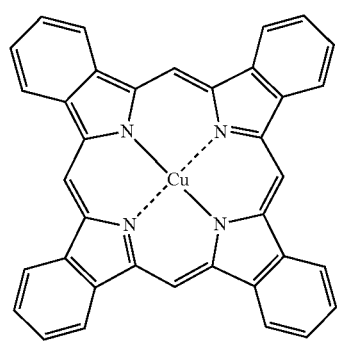
HT-30
HT-31 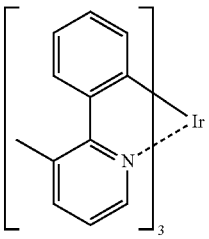
HT-32 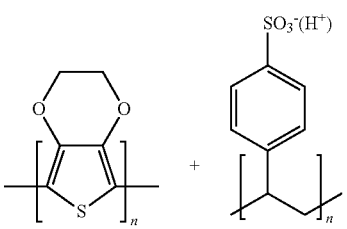
−[CH$_x$F$_y$]$_n$−
HT-33
HT-34 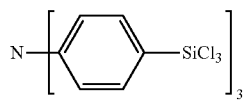
HT-35 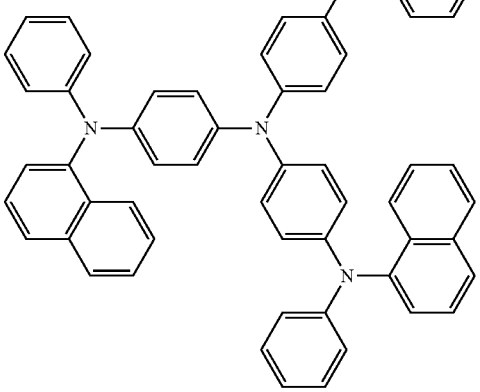

-continued
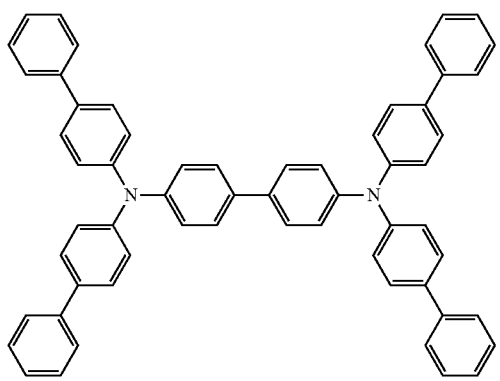
HT-36
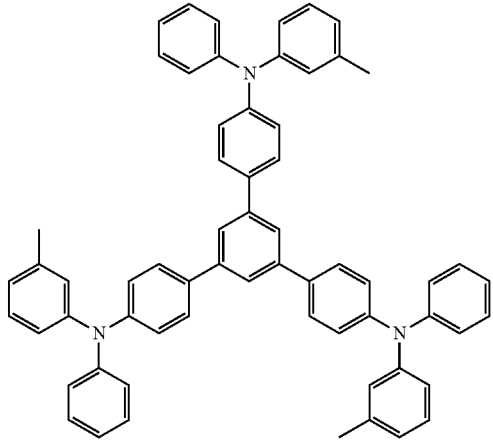
HT-37
[Chemical Formula 67]
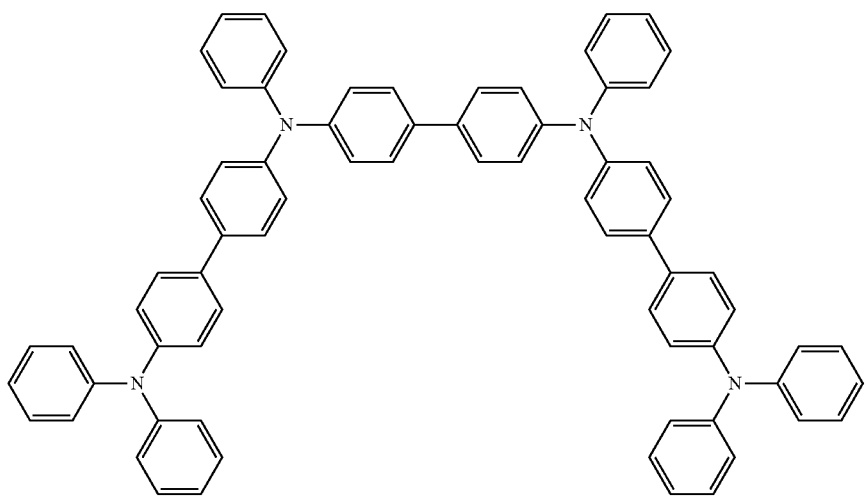
HT-38
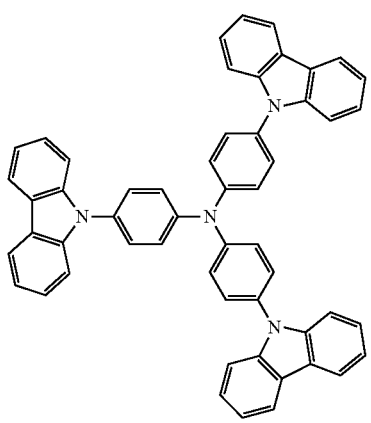
HT-39
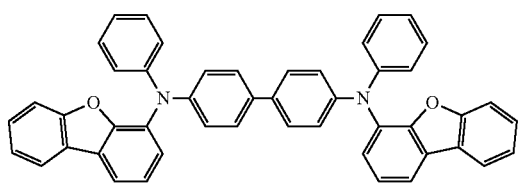
HT-40

-continued
HT-41
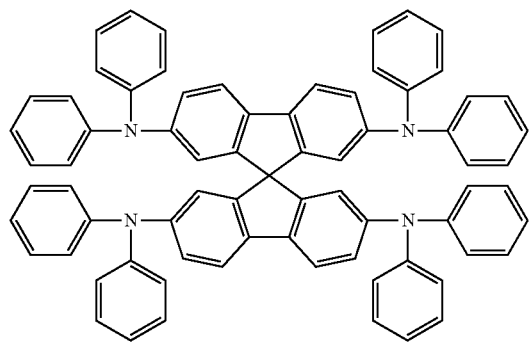
HT-42
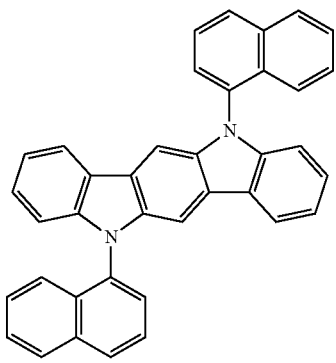
[Chemical Formula 68]
HT-43
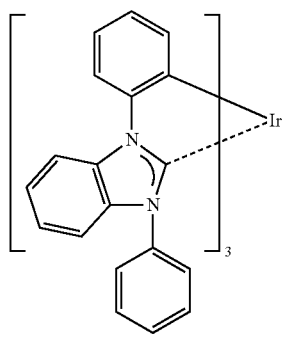
HT-44
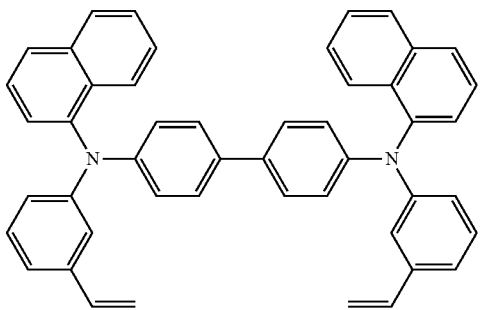
HT-45
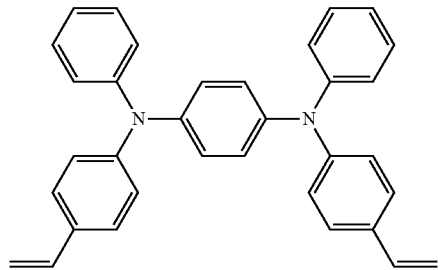
HT-46
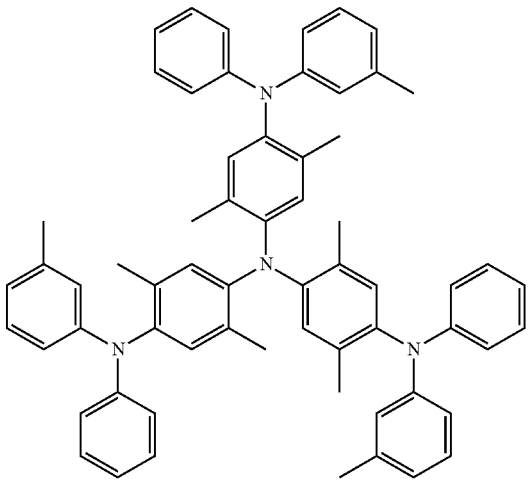
The present invention has a feature of having a compound represented by Formula (2) as the second hole transport layer.
where X and Y each represent O, S, or N—R (R represents a hydrogen atom or a substitution group), and $A_1$ and $A_2$ each represent a hydrogen atom or a substitution group. $L_1$
[Chemical Formula 69]
Formula (2)
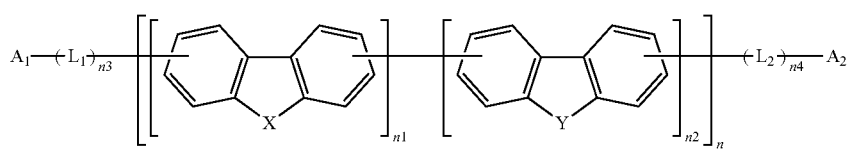

and $L_2$ each represent a divalent linking group; n represents an integer of 1 or more, n1 and n2 represent an integer 0 or more, and n3 and n4 each represent 0 or 1 (where n1+n2≥2).

In Formula (2), examples of the substituent represented by $A_1$ and $A_2$ include alkyl groups (e.g., a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); cycloalkyl groups (e.g., a cyclopentyl group, and a cyclohexyl group); alkenyl groups (e.g., a vinyl group and an allyl group); alkynyl groups (e.g., an ethynyl group and a propargyl group); aryl groups (e.g., a phenyl group, a p-chlorophenyl group, a mesityl group, a tolyl group, a xylyl group, a naphthyl group, an anthryl group, an azulenyl group, an acenaphthenyl group, an fluorenyl group, an phenanthryl group, an indenyl group, an pyrenyl group, and an biphenyl group), aromatic heterocyclic groups (e.g., a furyl group, a thienyl group, a pyridyl group, pyridazyl group, pyrimidyl group, pyrazyl group, a triazyl group, an imidazolyl group, a pyrazolyl group, a thiazolyl group, a benzimidazolyl group, a benzoxazolyl group, a quinazolyl group, and a phthalazyl group), heterocyclic groups (e.g., a pyrrolidyl group, an imidazolinyl group, a morpholyl group, an oxazolidyl group), alkoxyl groups (e.g., a methoxy group, an ethoxy group, a propyloxy group, a pentyloxy group, an hexyloxy group, an octyloxy group, and a dodecyloxy group), cycloalkoxy groups (e.g., a cyclopentyloxy group, and a cyclohexyloxy group), aryloxy groups (e.g., phenoxy group, naphthyloxy group), alkylthio groups (e.g., a methylthio group, an ethylthio group, a propylthio group, a pentylthio group, a hexylthio group, an octylthio group, and a dodecylthio group), cycloalkylthio groups (e.g., a cyclopentylthio group, and a cyclohexyl thio group), arylthio groups (e.g., a phenylthio group and a naphthylthio group); alkoxycarbonyl groups (e.g., a methyloxycarbonyl group, an ethyloxycarbonyl group, a butyloxycarbonyl group, an octyloxycarbonyl group, and a dodecyloxycarbonyl group); aryloxycarbonyl groups (e.g., a phenyloxycarbonyl group and a naphthyloxycarbonyl group); sulfamoyl groups (e.g., an aminosulfonyl group, a methylaminosulfonyl group, a dimethylaminosulfonyl group, a butylaminosulfonyl group, a hexylaminosulfonyl group, a cyclohexylaminosulfonyl group, and an octylaminosulfonyl group, a dodecylaminosulfonyl group, a phenylaminosulfonyl group, a naphthylaminosulfonyl group, and a 2-pyridylaminosulfonyl group), acyl groups (e.g., an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group); acyloxy groups (e.g., an acetyloxy group, an ethylcarbonyloxy group, a butylcarbonyloxy group, an octylcarbonyloxy group, a dodecylcarbonyloxy group, and a phenylcarbonyloxy group); amido groups (e.g., a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group); carbamoyl groups (e.g., an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group); ureido groups (e.g., a methylureido group, an ethylureido group, a pentylureido group, a cyclohexylureido group, an octylureido group, a dodecylureido group, a phenylureido group, a naphthylureido group, and a 2-pyridylaminoureido group); sulfinyl groups (e.g., a methylsulfinyl group, an ethylsulfinyl group, a butylsufinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group); alkylsulfonyl group (e.g., a methylsulfonyl group, an ethylsulfonyl group, a butylsulfonyl group, a cyclohexylsulfonyl group, a 2-ethylhexylsulfonyl group, and a dodecylsulfonyl group), arylsulfonyl groups (e.g., a phenylsulfonyl group, a naphthylsulfonyl group, and a 2-pyridylsulfonyl group); amino groups (e.g., an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group); halogen atoms (e.g., a fluorine atom, a chlorine atom, and a bromine atom); fluoro hydrocarbon groups (e.g., a fluoromethyl group, a trifluoromethyl group, a pentafluoroethyl group, and a pentafluorophenyl group); a cyano group; silyl groups (e.g., a trimethylsilyl group, a triisopropylsilyl group, a triphenylsilyl group, and a phenyldiethylsilyl group); carbazolyl groups; benzofuryl groups; carbolinyl groups; and diarylamino groups where the aryls of the diarylamino groups are synonymous with the aryl groups of Formula (A), which are represented by a substituent A1 or A2. These groups each may further have a substituent.

In Formula (2), X and Y each represent O, S, or N—R (R represents a substituent), and the substituents represented by R include substituted or unsubstituted alkyl groups, aryl groups and aromatic heterocyclic groups, and specific examples thereof are those included in the description of $A_1$ and $A_2$.

In Formula (2), divalent linking groups represented by each of $L_1$ and $L_2$ include alkylene groups (e.g., an ethylene group, a trimethylene group, a tetramethylene group, a propylene group, an ethylethylene group, a pentamethylene group, and a hexamethylene group), alkenylene groups (e.g., a vinylene group, a propenylene group, a butenylene group, a pentenylene group, a 1-methylvinylene group, a 1-methylpropenylene group, a 2-methylpropenylene group, a 1-methylpentenylene group, a 3-methylpentenylene group, a 1-ethylvinylene group, a 1-ethylpropenylene group, a 1-ethylbutenylene group, and a 3-ethylbutenylene group), alkynylene groups (e.g., an ethynylene group, a 1-propynylene group, a 1-butynylene group, a 1-pentynylene group, a 1-hexnylene group, a 2-butynylene group, a 2-pentynylene group, a 1-methylethynylene group, a 3-methyl-1-propynylene group, and a 3-methyl-1-butynylene group), arylene groups (e.g., an o-phenylene group, a m-phenylene group, a p-phenylene group, a naphthalenediyl group, an anthracenediyl group, a naphthacenediyl group, a pyrenediyl group, a naphthylnaphthalenediyl group, a biphenyldiyl group (e.g., a [1,1'-biphenyl]-4,4'-diyl group and a 3,3'-biphenyldiyl group, and a 3,6-biphenyldiyl group), a terphenyldiyl group, a quaterphenyldiyl group, a quinquephenyldiyl group, a sexiphenyldiyl group, a septiphenyldiyl group, a octiphenyldiyl groups, a nobiphenyldiyl group, and a deciphenyldiyl group), heteroarylene groups (e.g., a divalent group derived from the group consisting of a carbazole ring, a carboline ring, a diazacarbazole ring (also referred to as a monoazacarboline ring, indicating a ring structure in which one of the carbon atoms constituting the carboline ring is replaced with a nitrogen atom), a triazole ring, a pyrrole ring, a pyridine ring, a pyrazine ring, a quinoxaline ring, a thiophene ring, an oxadiazole ring, a dibenzofuran ring, a dibenzothiophene ring and an indole ring), and divalent heterocyclic groups (e.g., a divalent group derived from a pyrrolidine ring, a imidazolidine ring, a morpholine ring, and a oxazolidine ring), and chalcogen atoms such as oxygen and sulfur.

Furthermore, the linking groups may be groups which link via hetero atoms such as alkylimino groups, dialkylsilanediyl groups, and diarylgermanediyl groups.

Furthermore, $L_1$ and $L_2$ each is preferably an arylene group, a heteroarylene group, a divalent heterocyclic group, and an alkylene group, more preferably an arylene group, and most preferably an m-phenylene group.

Hereinafter specific examples of the compounds represented by Formula (2) of the present invention are shown, but the present invention is not limited to these examples:

[Chemical Formula 70]

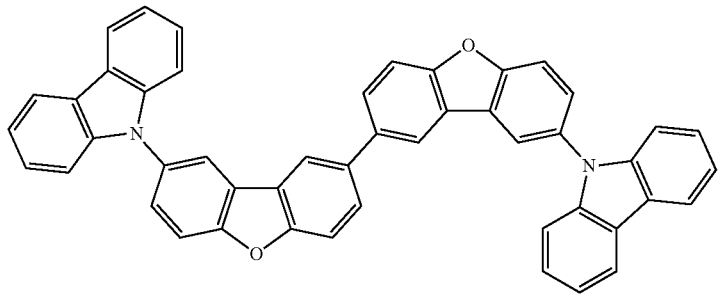

(1)

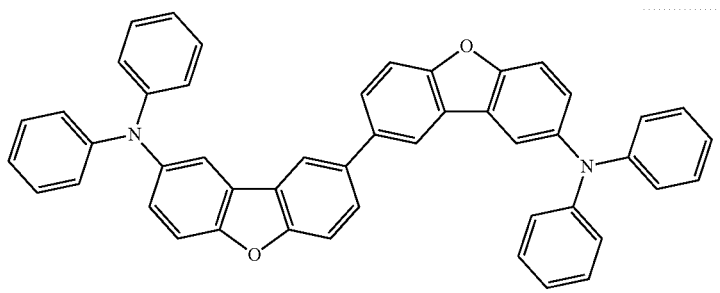

(2)

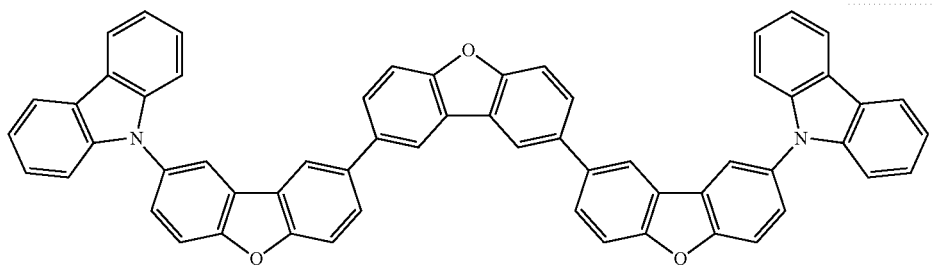

(3)

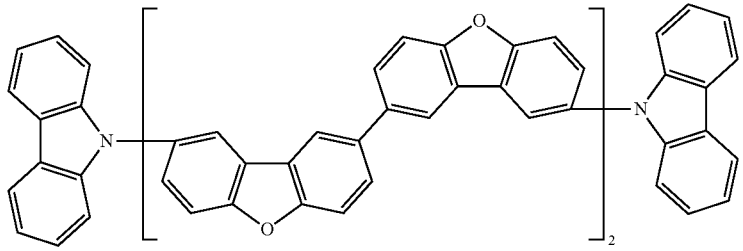

(4)

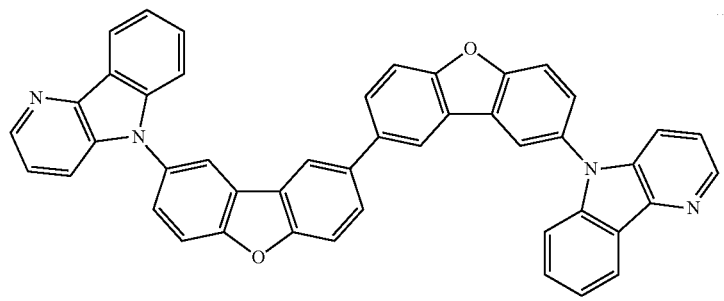
(5)
[Chemical Formula 71]
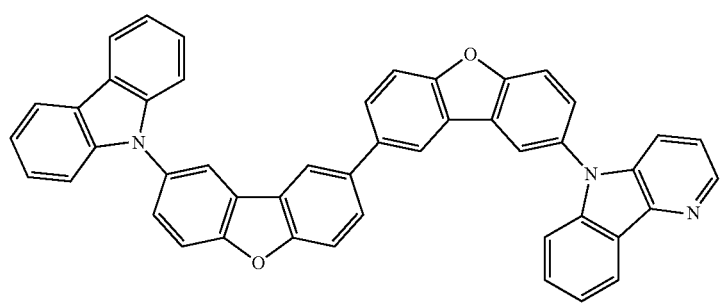
(6)
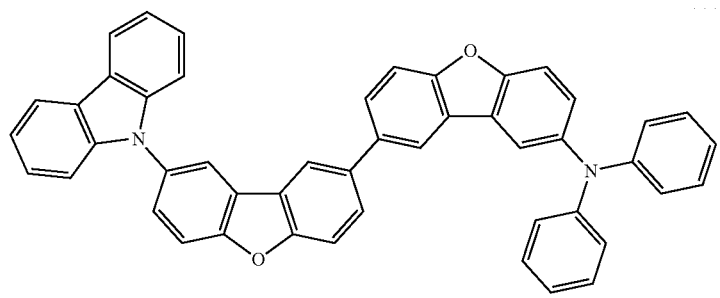
(7)
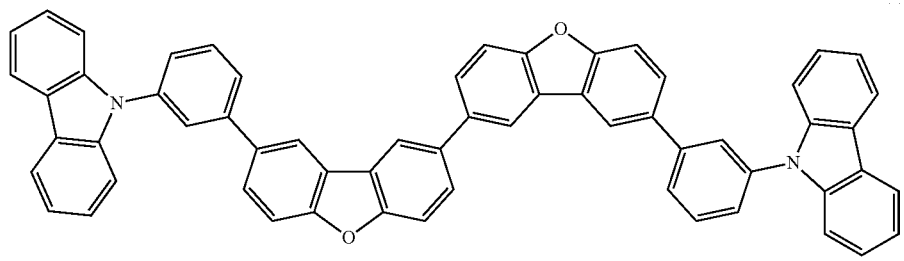
(8)
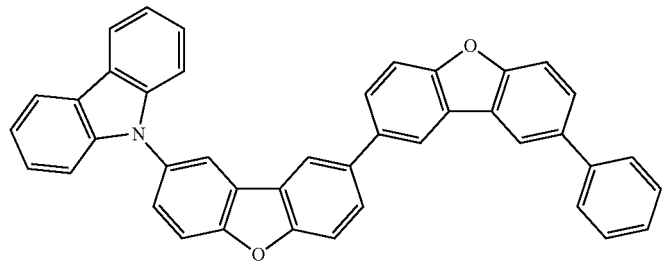
(9)

(10)
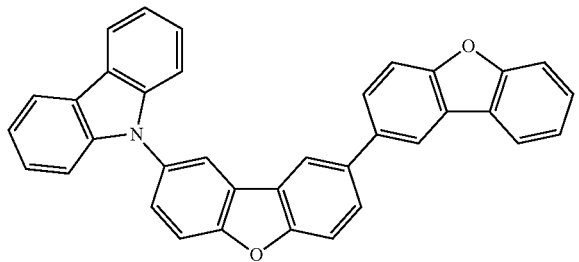
[Chemical Formula 72]
(11)
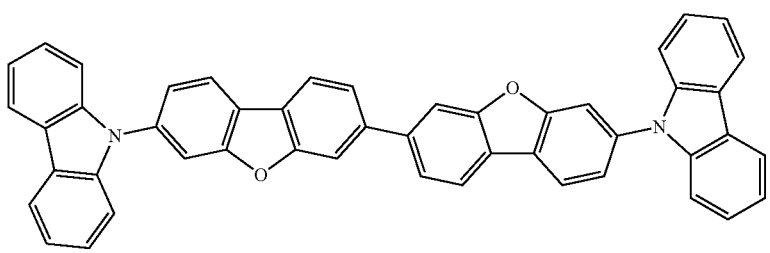
(12)
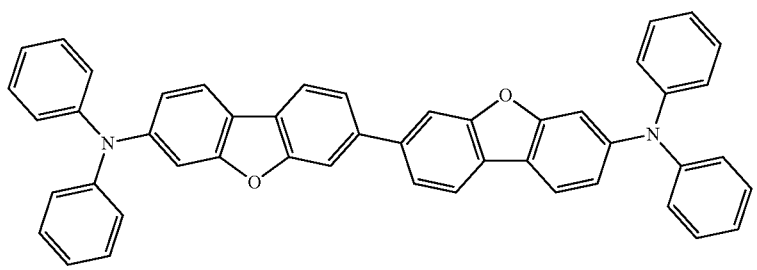
(13)
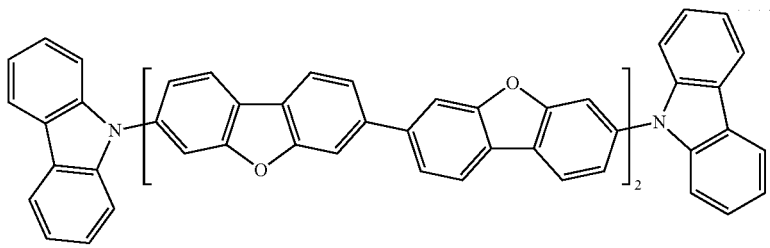
(14)
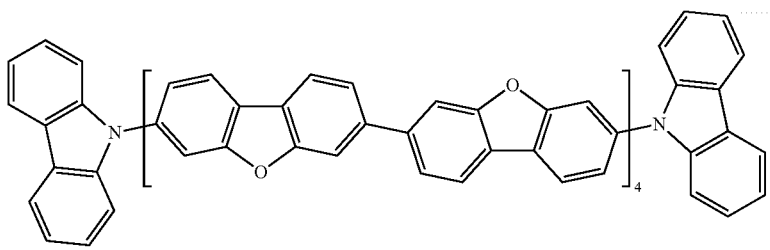

-continued
(15)
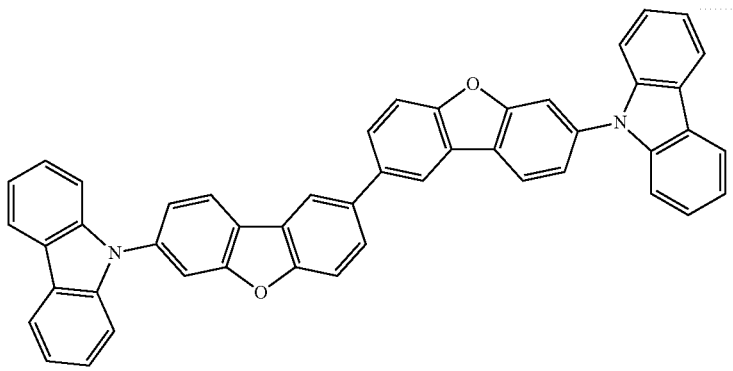
[Chemical Formula 73]
(16)
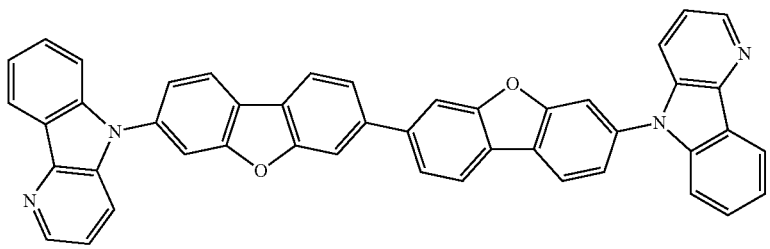
(17)
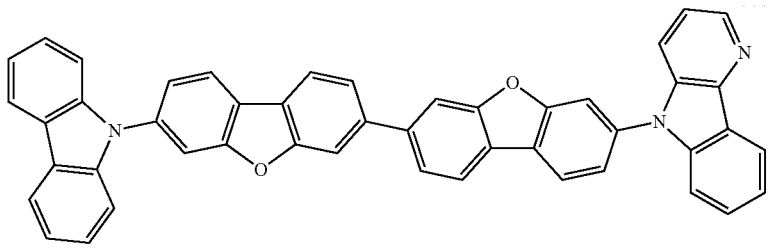
(18)
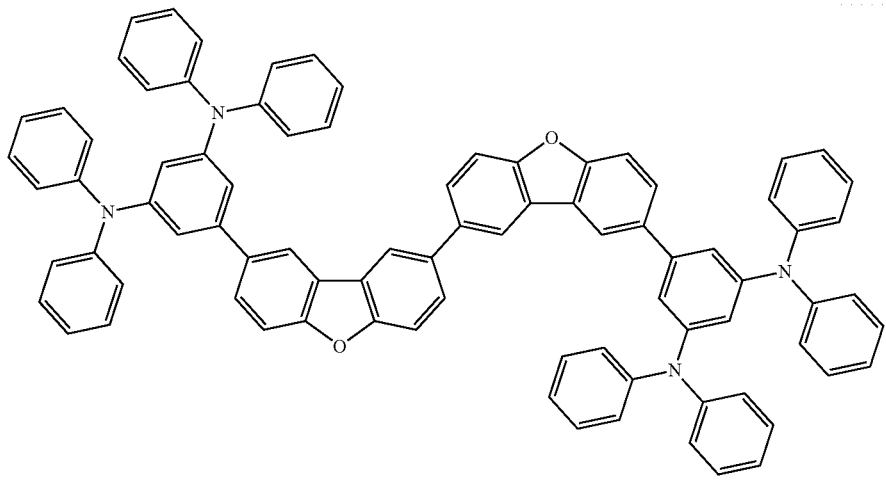

(19)
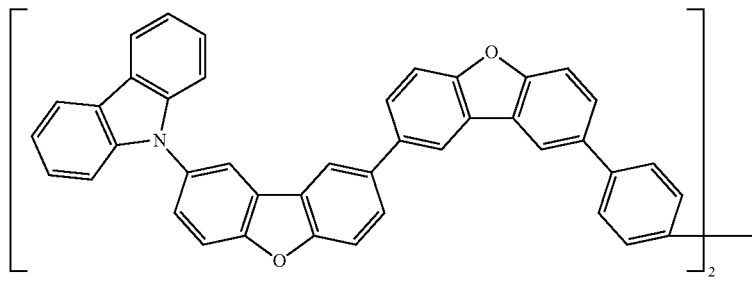
(20)
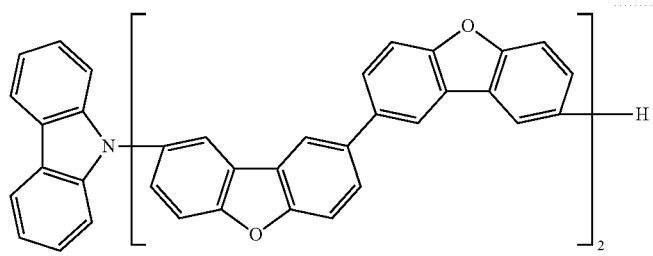
[Chemical Formula 74]
(21)
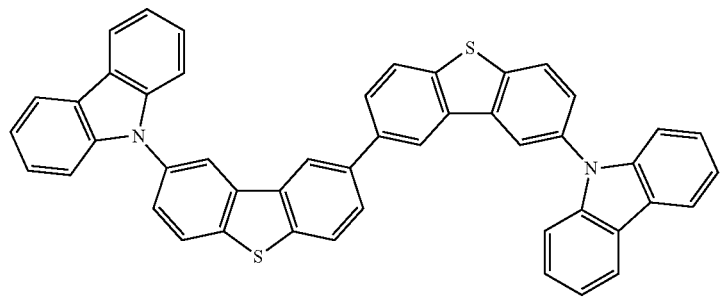
(22)
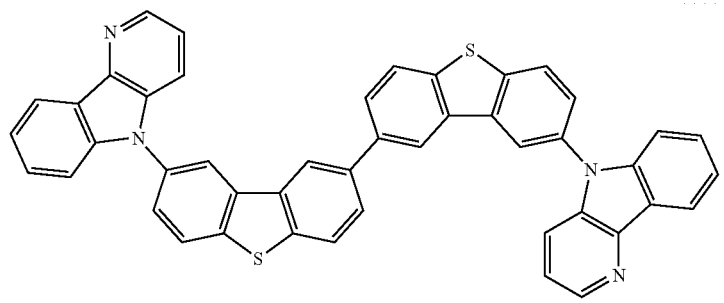
(23)
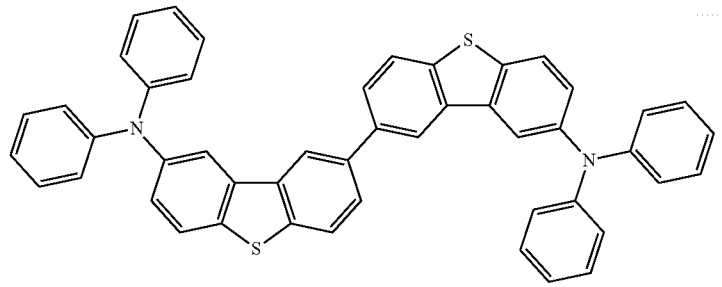

(24)
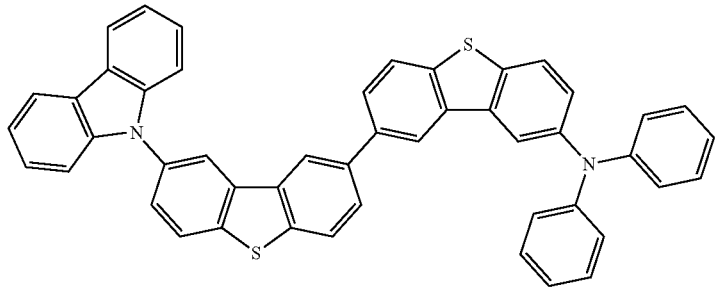
(25)
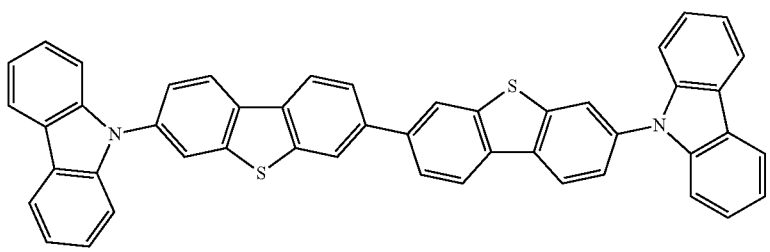
[Chemical Formula 75]
(26)
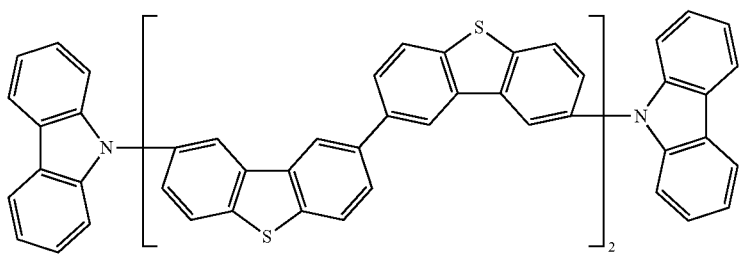
(27)
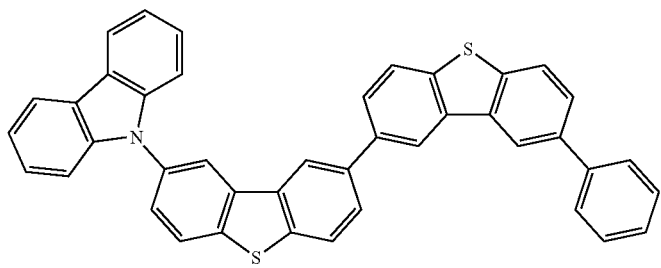
(28)
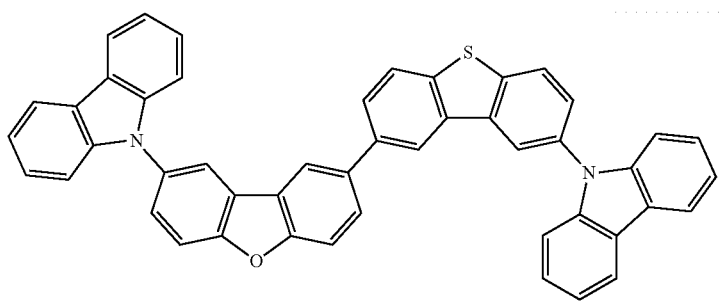

(29)
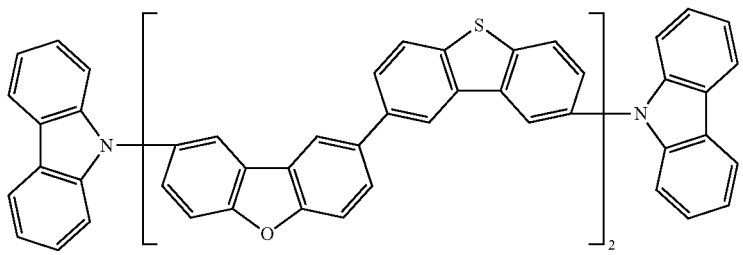
(30)
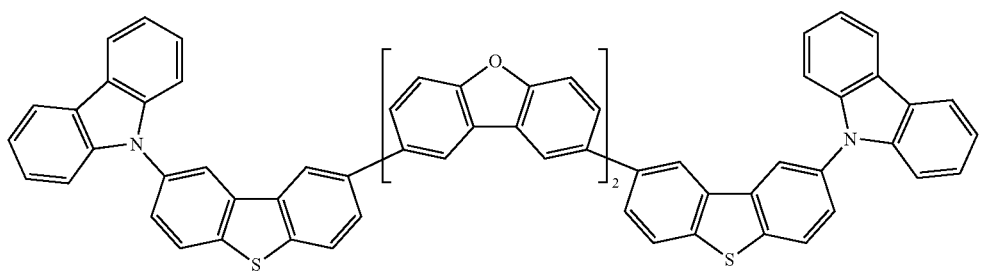
[Chemical Formula 76]
(31)
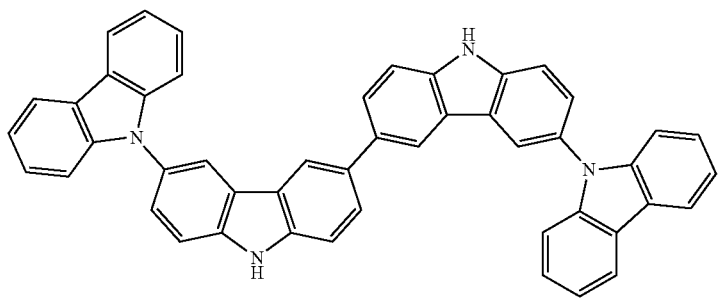
(32)
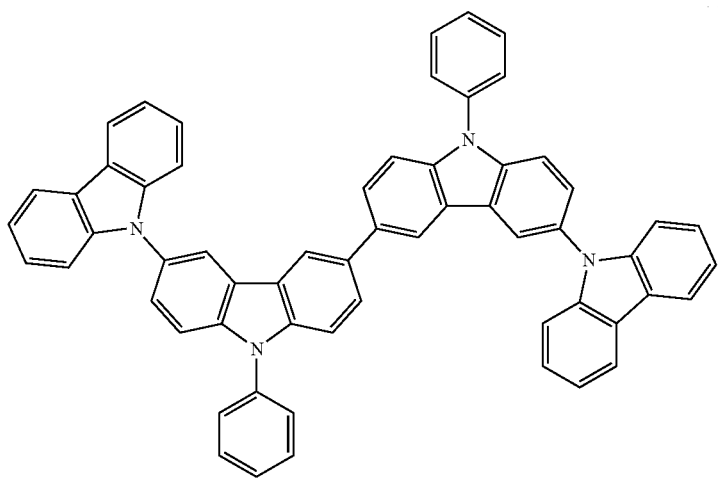

(33)
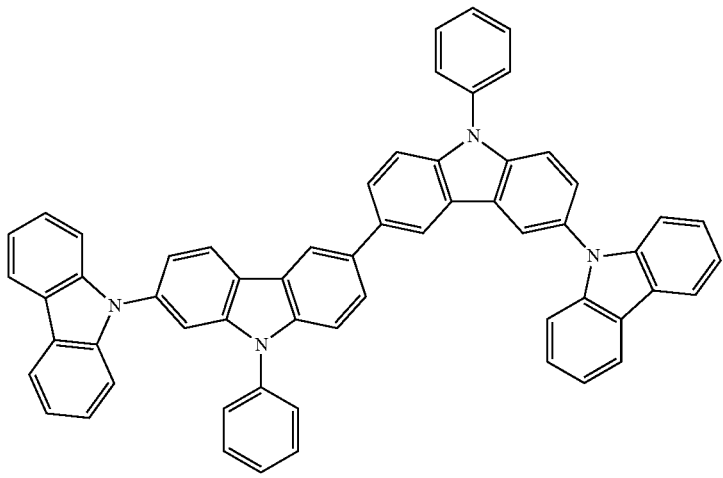
(34)
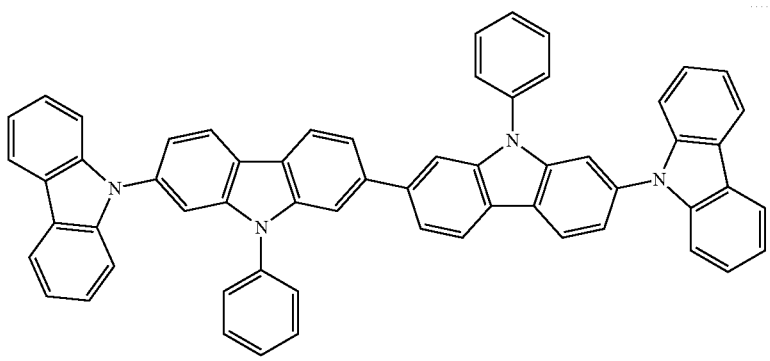
[Chemical Formula 77]
(35)
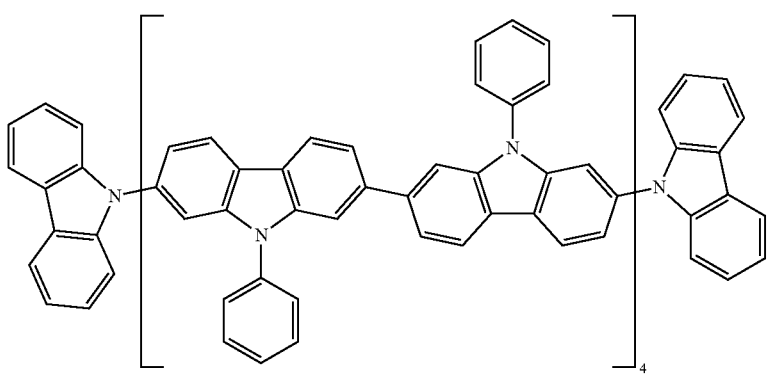

(36)
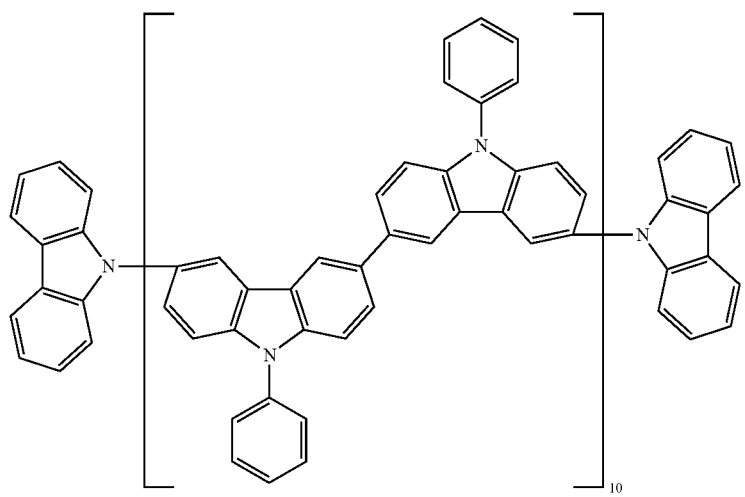
(37)
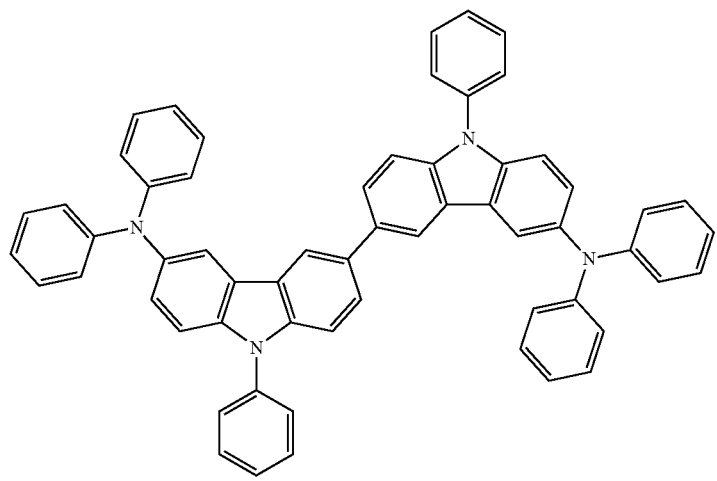
[Chemical Formula 78]
(38)
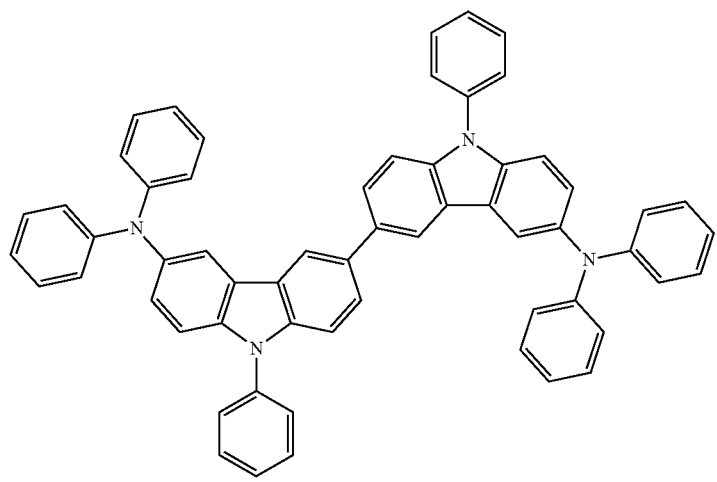

(39)
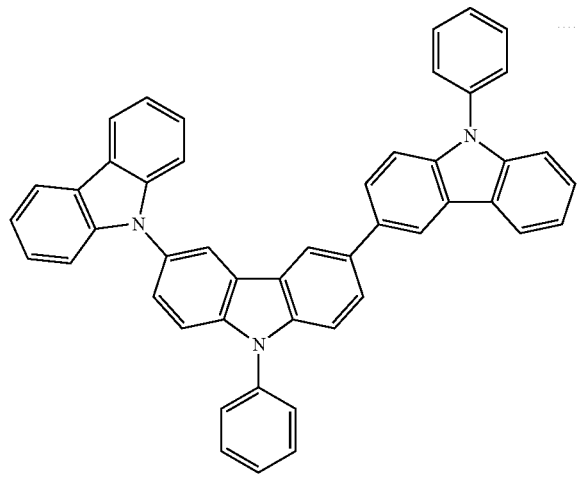
(40)
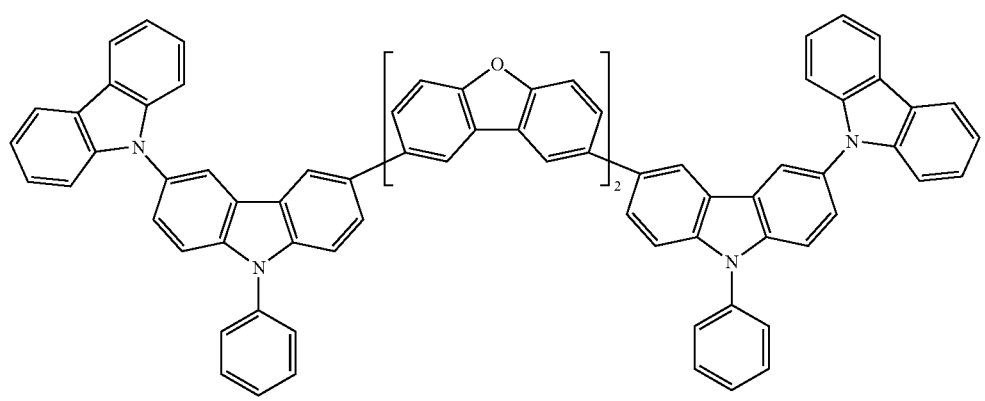
[Chemical Formula 79]
(41)
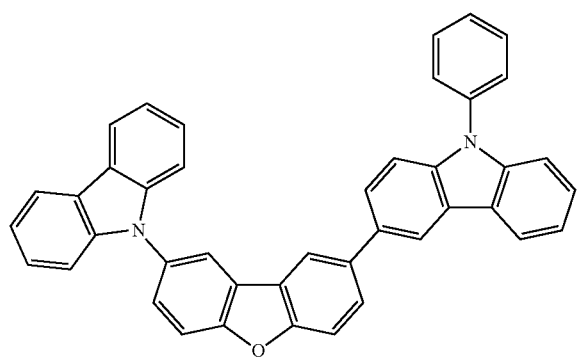

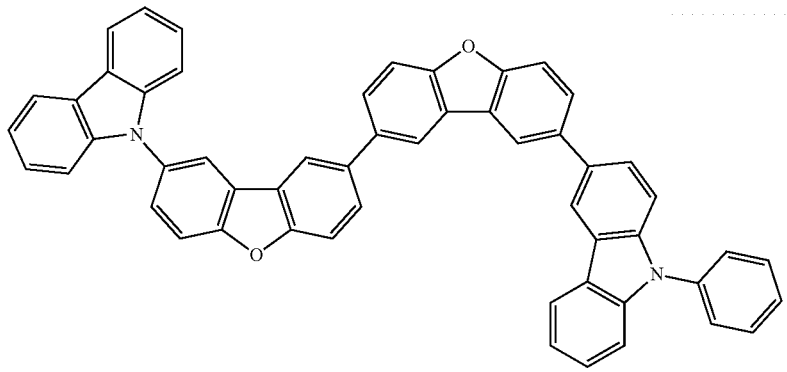
(42)
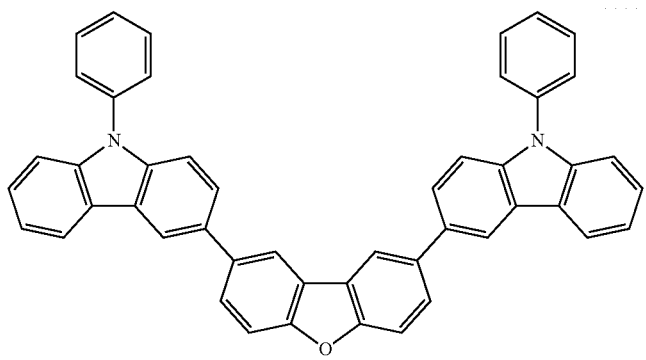
(43)
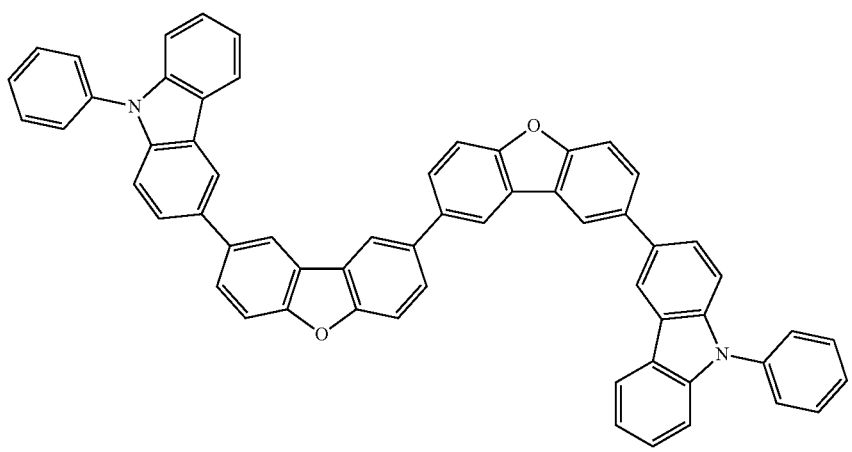
(44)

[Chemical Formula 80]
(45)
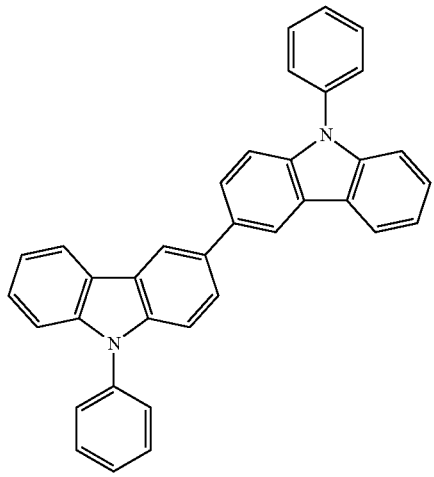
(46)
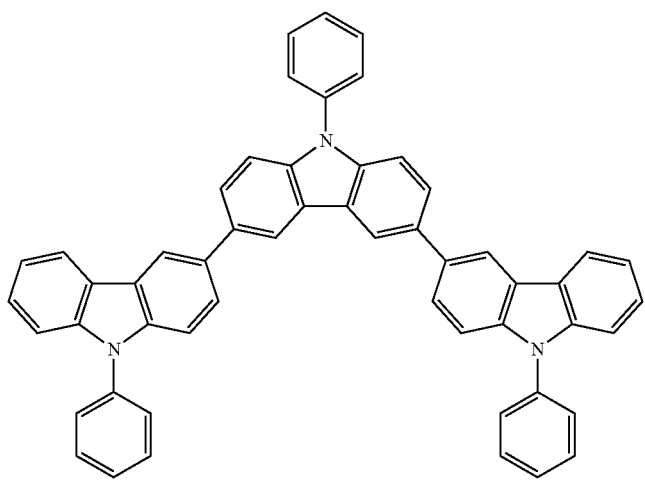
(47)
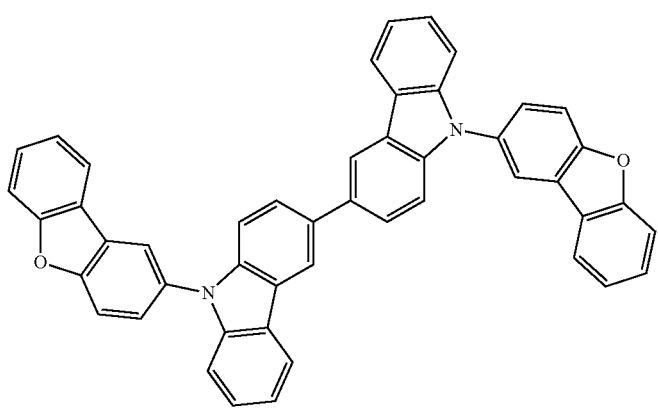

(48)

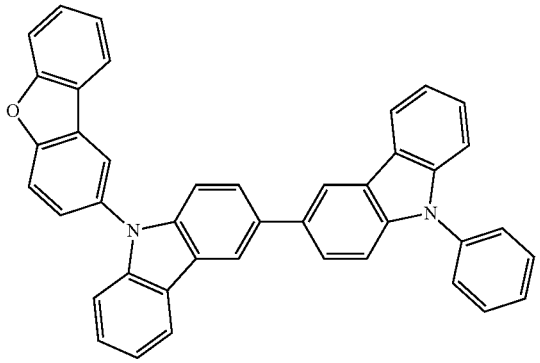

(49)

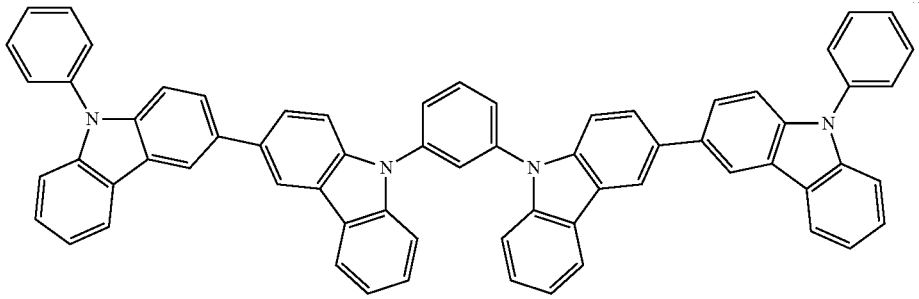

The HOMO value of the compound represented by Formula(2) of the present invention satisfies preferably the expression: −5.40<HOMO (HT2)<−4.80, and more preferably the expression: −5.10<HOMO (HT2)<−4.85. This range of HOMO (HT2) is determined for the following reason: A value of −5.4 or lower significantly precludes hole injection into the light emitting layer, resulting in low efficiency, short lifetime, and poor chromatic stability, while a value of −4.8 or higher causes ready accumulation of holes at the interface between the light-emitting layer and hole transport layer due to high hole trapping characteristics of a compound of Formula (1), similarly resulting in low efficiency, short lifetime, and poor chromatic stability.

Furthermore, the relationship of the triplet excitation energy between the phosphorescence emitting dopant and the organic material contained in the second hole transport layer in the present invention satisfies the expression: preferably T1(HT2)−T1 (D)>0.1, and more preferably 0.1<T1 (HT2)−T1 (D)<0.5. The range (T1 (HT2)−T1 (D)) is determined for the following reason: A value of lower than 0.1 causes energy transfer from the phosphorescence emitting dopant to the hole transport material contained in the second hole transport layer, resulting in low efficiency, short lifetime, and poor chromatic stability.

The relationship of HOMOs between a first hole transport layer and a second hole transport layer satisfies the expression: preferably −0.5<HOMO (HT2)−HOMO (HT1)<−0.1, and more preferably −0.4<HOMO (HT2)−HOMO (HT1)<−0.1. The range of (HOMO (HT2)−HOMO (HT1)) is determined for the following reason: A value of lower than −0.5 causes a decrease in hole transport ability from HT1 to HT2, leading to the reduced hole injection which results in low efficiency, short lifetime, and poor chromatic stability, while a value of higher than −0.1 causes the loss of control of the hole injection into the light emitting layer, also resulting in low efficiency, short lifetime, and poor chromatic stability.

<<Electron Transport Layer>>

The electron transport layer is composed of materials that can transport electrons, and includes an electron-injecting layer and a hole-blocking layer in a broad sense. The electron transport layer may have a single-layer or multi-layer composition.

The electron transport layer (including a hole-blocking layer and an electron-injecting layer) can be made of any conventionally known material that can transport electrons injected from a cathode to a light-emitting layer. Such materials may be used alone or in combination.

Examples of the conventionally known materials for the electron transport layer (hereinafter referred to as "electron transport materials") include nitro-substituted fluorene derivatives; diphenylquinone derivatives; thiopyran dioxide derivatives; heterocyclic tetracarboxylic acid such as naphthalene and perylene; carbodiimides; fluorenylidenemethane derivatives; anthraquinodimethane; anthrone derivatives; oxadiazole derivatives; and azacarbazole derivatives including carboline derivatives.

The azacarbazole derivatives as mentioned herein refer to compounds having a carbazole ring of which one or more carbon atoms are replaced with a nitrogen atom or nitrogen atoms.

Moreover, among these oxadiazole derivatives, thiadiazole derivatives containing an oxadiazole ring of which an oxygen atom is replaced with a sulfur atom, and quinoxaline derivatives, containing quinoxaline rings known as electron-attractive groups, can also be used for the electron transport materials.

Any polymer material, which any of the above materials is introduced to the polymer chains or constitutes the main chain of the polymer, can also be used.

Further examples of the materials that can be used for the electron transport materials include metal complexes of 8-quinolinol derivatives, such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq), and these metal complexes of which the central metallic is replaced with In, Mg, Cu, Ca, Sn, Ga, or Pb.

Metal-free or metal phthalocyanines can also be used for the electron transport materials, and end groups of these phthalocyanines may be replaced with alkyl groups or sulfonic acid groups.

Moreover, inorganic semiconductors, such as n-type Si and n-type SiC, can also be used for the electron transport materials as used in the hole injection layer and the hole transport layer.

The electron transport layer may have any thickness, but typically a thickness of about 5 nm to 5000 nm, preferably 5 nm to 200 nm. The electron transport layer may have a single-layer structure or a multilayer structure comprising one or more kinds of the above-described materials.

The electron transport layer may also include materials doped with impurities to have high n-type conductivity. Examples thereof are described in Japanese Unexamined Patent Application Publications Nos. 4-297076, 10-270172, 2000-196140, and 2001-102175, and J. Appl. Phys., 95, 5773 (2004).

Specific examples of conventional compounds (electron transport materials) preferably used for forming the electron transport layer of the white organic EL element of the present invention are described, but not limited to, below:

[Chemical Formula 81]

ET-1
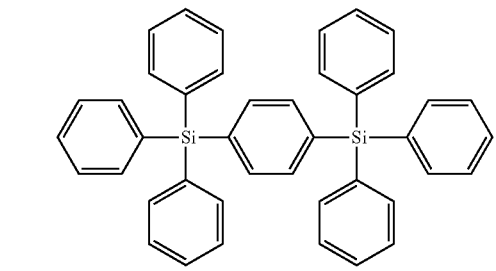

ET-2
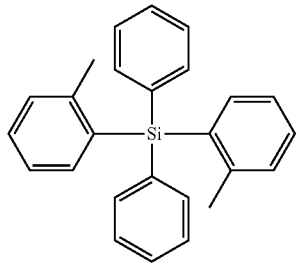

ET-3
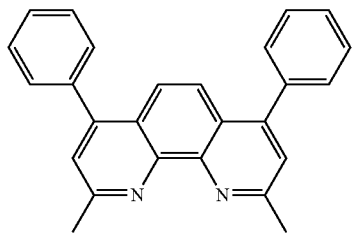

ET-4
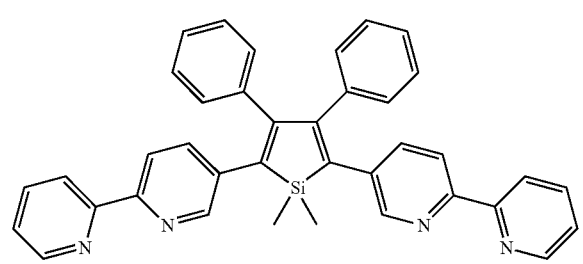

ET-5
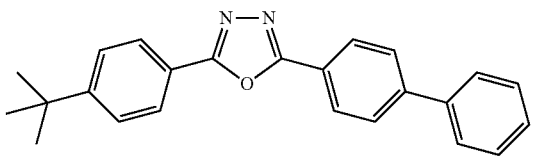

ET-6
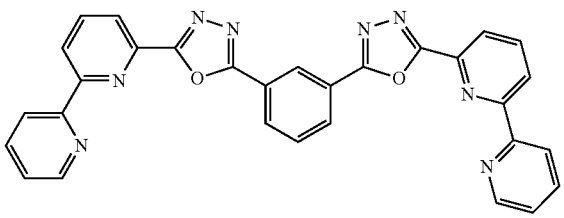

ET-7
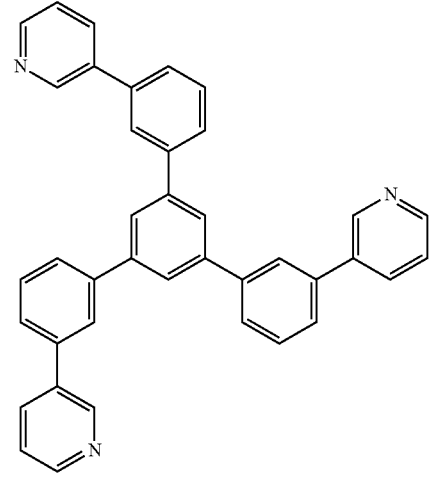

ET-8
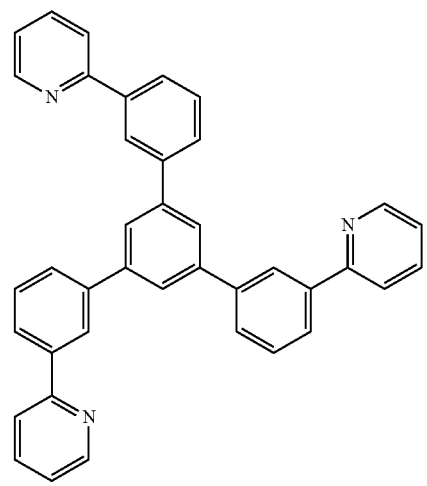

The materials preferably used in the present invention are azacarbazole derivatives represented by General Formula (3) and metal complexes of 8-quinolinol derivatives represented by General Formula (4).

[Chemical Formula 82]

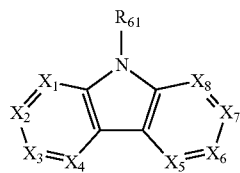

Formula (3)

where $R_{61}$ represents a hydrogen atom, an alkyl group, an aryl group, or a heteroaryl group, $X_1$ to $X_8$ each represent N or $-CR_{62}$, and $R_{62}$ represents a hydrogen atom, an alkyl group, an aryl group, or a heteroaryl group.

[Chemical Formula 83]

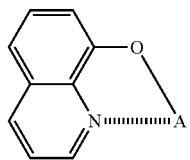

Formula (4)

where A represents Li, Be, or Al.

Hereinafter specific examples of General Formula (3) are shown, but the present invention is not limited to these examples:

[Chemical Formula 84]

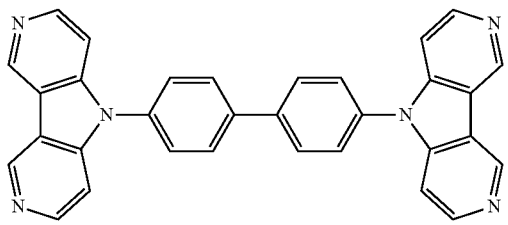

3-1

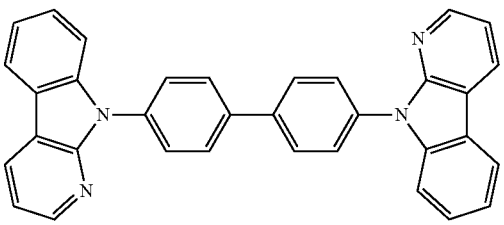

3-2

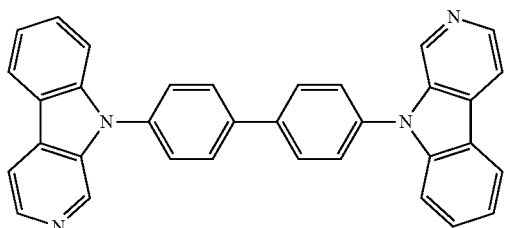

3-3

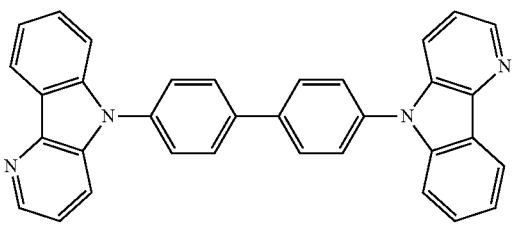

3-4

3-5

3-6

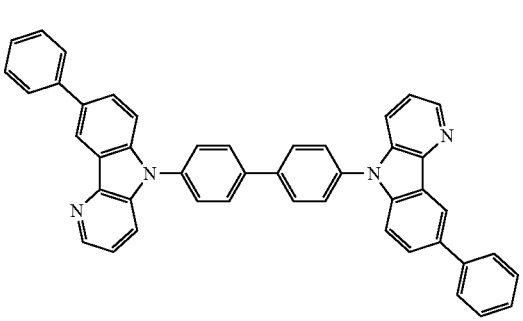

3-7

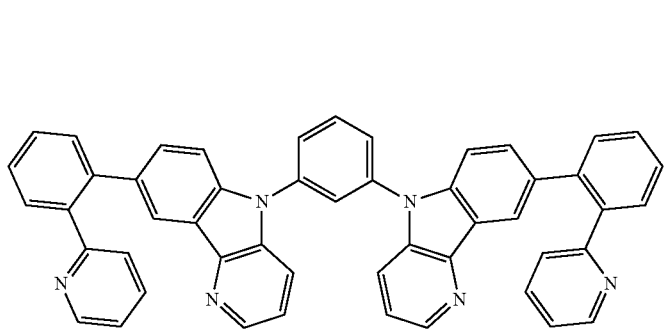

[Chemical Formula 85]
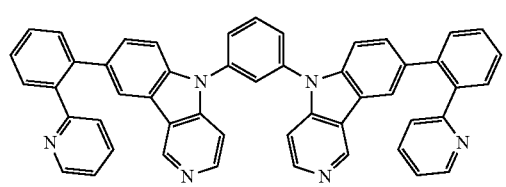
3-8
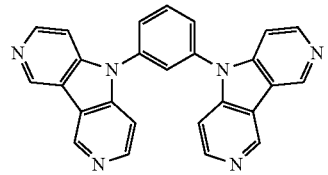
3-9
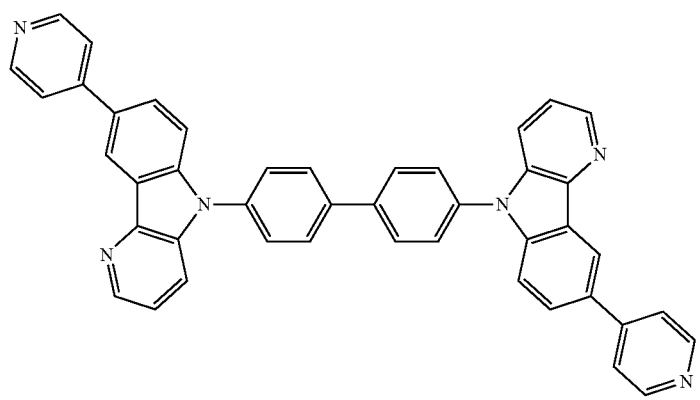
3-10
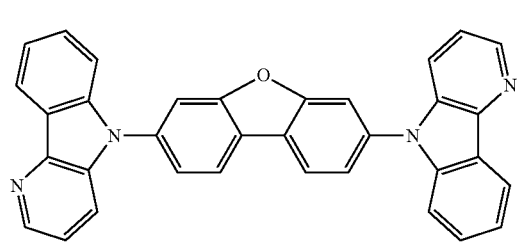
3-11
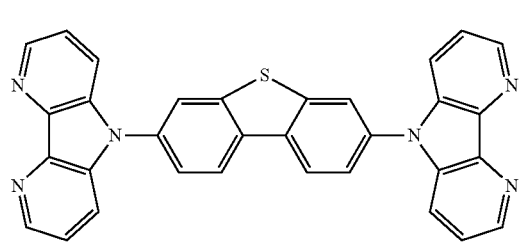
3-12
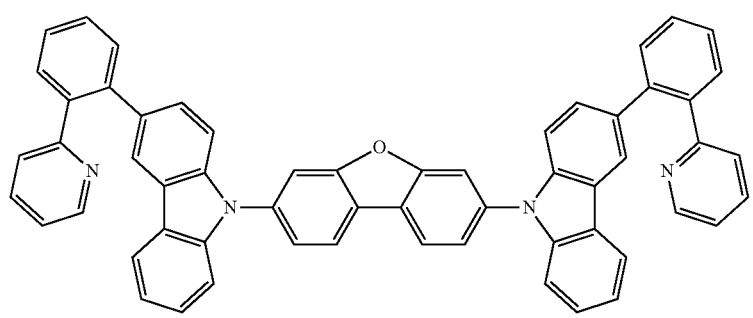
3-13
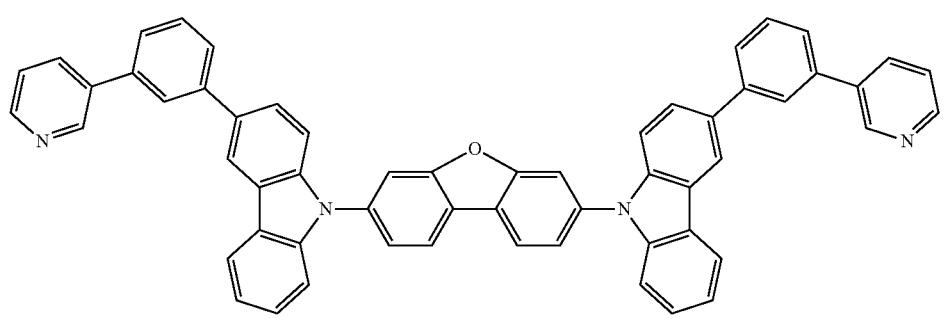
3-14
and

[Chemical Formula 86]

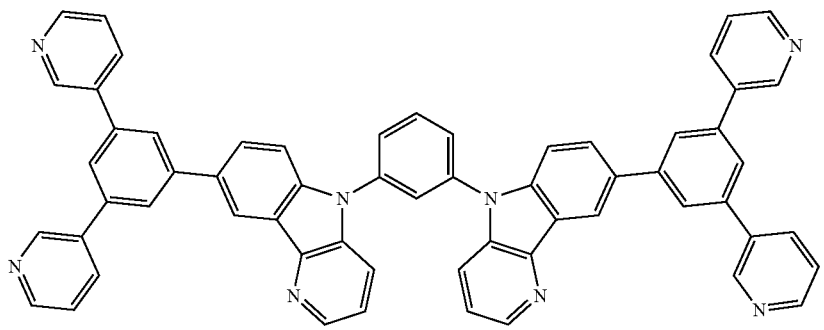

3-15

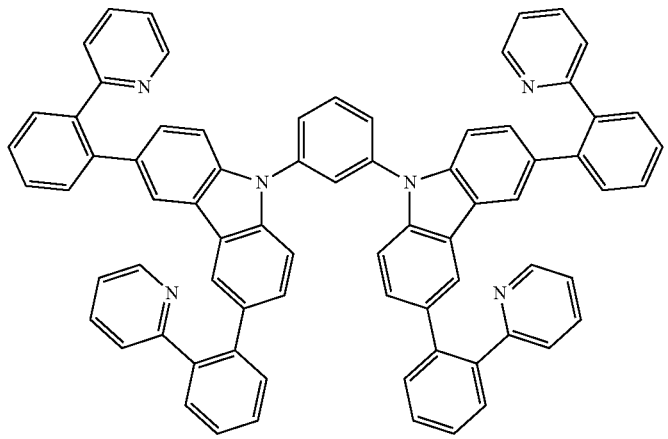

3-16

Hereinafter specific examples of General Formula (4) are shown, but the present invention is not limited to these examples:

[Chemical Formula 87]

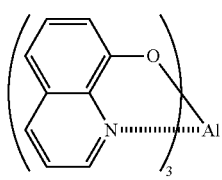

4-1

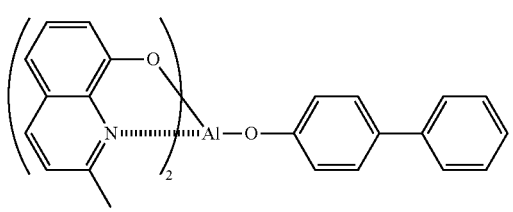

4-2

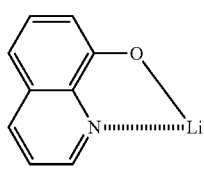

4-3

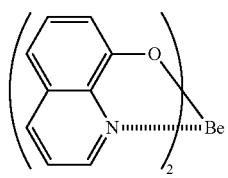

4-4

<<Blocking Layers: Hole-blocking Layer and Electron-blocking Layer>>

Blocking layers are provided as required in addition to the basic constituting layers of the organic thin film, as described above. Examples thereof are hole-blocking (hole block) layers described in Japanese Unexamined Patent Application Publications Nos. 11-204258 and 11-204359, and on page 237 of "Yuki EL Soshi to Sono Kogyoka Saizensen (Organic EL Element and Forefront of its Industrialization) (published by NTS Inc., Nov. 30, 1998)".

A hole-blocking layer functions as an electron transport layer in a broad sense, is composed of hole-blocking material having significantly low hole transportability while having an electron transport function, and enhances the probability of recombination between electrons and holes by blocking holes while transporting electrons.

The above mentioned electron transport layer may also be used as a hole-blocking layer according to the present invention, if necessary.

The hole-blocking layer of the organic EL element of the present invention is disposed preferably adjacent to the light-emitting layer.

Preferably, the hole-blocking layer contains nitrogen-containing compounds, such as carbazole derivatives, azacarbazole derivatives (the azacarbazole derivatives as mentioned herein refer to compounds in which one or more carbon atoms of the carbazole ring are replaced with a nitrogen atom or nitrogen atoms), and pyridine derivatives.

In the case that multiple light-emitting layers emitting lights of different colors are provided in the present invention, a light-emitting layer having the shortest maximum emission wavelength is preferably disposed closest to the anode, among all the light-emitting layers. In this case, it is preferred to additionally dispose a hole-blocking layer between the shortest wavelength layer and a light-emitting layer second closest to the anode.

Furthermore, the hole-blocking layer disposed on that position contains compounds, of which 50 mass % or more preferably has an ionization potential of at least 0.3 eV higher than that of the host compound of the light-emitting layer having the shortest wavelength.

The ionization potential of a compound is defined as the energy required to release an electron at the highest occupied molecular orbital (HOMO) level of the compound into the vacuum level, which can be obtained, for example, by the following procedures:

(1) Gaussian98 (Gaussian98, Revision A.11.4, M. J. Frisch, et al., Gaussian, Inc., Pittsburgh Pa., 2002), which is a software for computing molecular orbital manufactured by U.S. Gaussian Inc., is available to calculate the value (eV, unit value of conversion) by structural optimization using a keyword, B3LYP/6-31G*. The validity of this procedure is confirmed by a high correlation between experimental values and the value calculated by this procedure.

(2) The ionization potential may also be directly measured by photoelectron spectroscopy. For example, a low-energy electron spectrometer (Model AC-1) manufactured by RIKEN KEIKI Co., Ltd. may be used. Alternatively, a technique known as ultraviolet photoelectron spectroscopy may be suitably used.

An electron-blocking layer functions as an hole transport layer in a broad sense, is composed of a material that can transport holes and has significantly low electron transportability, and enhances the probability of recombination between electrons and holes by blocking electrons while transporting holes.

Moreover, the above mentioned hole transport layer can be used as an electron-blocking layer, if necessary. The hole-blocking layer and the electron-blocking layer according to the present invention each have a thickness of, preferably 3 nm to 100 nm, and more preferably 3 nm to 30 nm.

In the present invention, the correlation of the lowest unoccupied molecular orbitals (LUMO) between the electron transport materials contained in the host compound and the electron transport layer is preferably –0.4<LUMO (H)–LUMO (ET)<0.8, and more preferably –0.3<LUMO (H)–LUMO (ET)<0.7. The value of LUMO (H)–LUMO (ET) are restricted within this range by the following reasons: At a value of –0.4 or less, electrons are injected too fast and thus are readily accumulated at the interfaces between the light-emitting layer and the hole transport layer due to high hole trap density in General Formula (1), which results in reductions in both efficiency and service life. At a value of 0.8 or more, injection of electrons into the light-emitting layer is reduced, which also results in reductions in both efficiency and service life.

<<Anode>>

As the anode for organic EL elements, anode including, as an electrode substance, a metal, an alloy, or a conductive compound having a large work function (4 eV or more), or a mixture thereof is preferably used. Specific examples of such electrode substances include metals, e.g., Au, and transparent conductive materials, e.g., CuI, indium tin oxide (ITO), $SnO_2$, and ZnO.

Amorphous materials, such as IDIXO ($In_2O_3$—ZnO), which are available for forming a transparent conductive film, may also be used. These electrode substances for an anode may be formed into a thin film by evaporation or sputtering method etc., and then finished into a desired pattern by photolithography method. If precise patterning is not required (about 100 μm or more), the electrode substances may be formed into a pattern through a mask of a desired form during evaporation or sputtering.

Alternatively, a wet film formation method such as a printing method or coating method may be employed for coatable materials, e.g., conductive organic compounds. To emit light from an anode, the film has a light transmittance of, preferably 10% or more, and the anode has a sheet resistance of, preferably several hundred Ω/square or less. Moreover, the film has a thickness of, typically 10 nm to 1,000 nm, and preferably 10 nm to 200 nm, which depends on the materials.

<<Cathode>>

As the cathode, cathode including, as an electrode substance, a metal (referred to as electron-injecting metal), an alloy, or a conductive compound having a small work function (4 eV or less), or a mixture thereof is preferably used.

Specific examples of such electrode substances include sodium, sodium-potassium alloys, magnesium, lithium; mixtures of magnesium and copper, mixtures of magnesium and silver, mixtures of magnesium and aluminum, mixtures of magnesium and indium, and mixtures of aluminum and aluminum oxide ($Al_2O_3$); indium; mixtures of lithium and aluminum; and rare earth metals.

Among them, preferred are mixtures of an electron-injecting metal and a stable second metal having a work function larger than that of the electron-injecting metal, such as mixtures of magnesium and silver, mixtures of magnesium and aluminum, mixtures of magnesium and indium, mixtures of aluminum and aluminum oxide ($Al_2O_3$), and mixtures of lithium and aluminum; and aluminum in view of their high electron-injecting properties and durability against, e.g., oxidation.

These electrode substances may be formed into thin-film cathodes by methods such as evaporation and sputtering. The cathode has a sheet resistance of, preferably several hundred Ω/square or less, and a thickness of, typically 10 nm to 5 μm, and preferably 50 nm to 200 nm.

Either the anode or the cathode for the organic EL element is preferably to be transparent or translucent to allow the emitted light pass therethrough, and thereby the luminance of the emitted light is enhanced.

Any of the above metals is formed into a thin film having a thickness of 1 nm to 20 nm in the cathode, and then the transparent conductive materials mentioned in the above description on the anode is disposed on the film into a transparent or translucent cathode. Through this procedure, an element containing a transparent anode and a transparent cathode can be produced.

<<Supporting Substrate>>

A supporting substrate (hereinafter also referred to as a base substance, a substrate, a base material, or a support) for the organic EL element of the present invention may be composed of any material, such as glass and plastic, and may be either transparent or opaque. A transparent supporting substrate is preferred to emit light from the surface of the supporting substrate.

Examples of materials preferably used for the transparent supporting substrate include glass, quartz, and a transparent resin film. A particularly preferable supporting substrate is composed of a resin film that can provide flexibility to the organic EL element.

Examples of such resin film include polyesters, such as polyethylene terephthalate (PET), and polyethylene naphthalate (PEN); polyethylene; polypropylene; cellulose esters or derivatives thereof, such as cellophane, cellulose diacetate, cellulose triacetate, cellulose acetate butylate, cellulose acetate propionate (CAP), cellulose acetate phthalate (TAC), and cellulose nitrate; polyvinylidene chloride, polyvinyl alcohol, polyethylene vinyl alcohol, syndiotactic polystyrene, polycarbonates, norbornene resins, polymethylpentene, polyether ketones, polyimides, polyether sulfones (PESs), polyphenylene sulfides, polysulfones, polyether imides, polyether ketone imides, polyamides, fluororesins, nylons, polymethyl methacrylate, acrylics, polyarylates; and cycloolefine resins, such as ARTON (brand name, available from JSR Corporation) and APEL (brand name, available from Mitsui Chemicals, Inc.).

The surface of a resin film may be coated with an inorganic or organic film, or a hybrid film of the inorganic or organic film. The coated film is preferably a barrier film having a water vapor permeability of 0.01 g/(m$^2$/24 hrs) or less (at 25±0.5° C. and 90±2% relative humidity (RH)) measured by a testing method in accordance with JIS K 7129-1992, more preferably a high barrier film having an oxygen permeability of 10$^{-3}$ ml/(m$^2$/24 hrs/MPa) or less and a water vapor permeability of 10$^{-5}$ g/(m$^2$/24 hrs) or less measured by a testing method in accordance with JIS K 7126-1987.

The barrier film is composed of any material that can prevent the penetration of moisture or oxygen which causes the deterioration of the element. Examples of such materials include silicon monoxide, silicon dioxide, and silicon nitride.

Moreover, the barrier film preferably has a laminated configuration of layers composed of the above inorganic substances and organic substances to eliminate the fragility of the film. The layers may be laminated in any order, but may preferably be alternatively laminated several times.

The barrier film may be formed by any methods, for example, vacuum deposition method, sputtering method, reactive sputtering method, molecular beam epitaxy method, cluster ion beam method, ion plating method, plasma polymerization method, atmospheric pressure plasma polymerization method, plasma CVD method, laser CVD method, thermal CVD method, and coating method. Particularly preferred is atmospheric pressure plasma polymerization method described in Japanese Patent Application Laid-open No. 2004-68143.

Examples of the opaque supporting substrate include metal plates of aluminum or stainless steel, films, opaque resin substrates, and ceramic substrates.

The organic EL element of the present invention has an external fetch efficiency of emitted light of preferably 1% or more, and more preferably 5% or more at room temperature.

The external fetch quantum efficiency (%) can be expressed by (the ratio of the number of photons output from the organic EL element divided by the number of electrons input into the organic EL element)×100.

A hue adjust filter such as a color filter and/or a color conversion filter converting the light emitted from the organic EL element into multicolor with phosphor may be used at the same time. A color conversion filter is preferably applied to the organic EL element emitting light of which λmax is equal to or shorter than 480 nm.

<<Production Method of Organic EL Element>>

An example of a method of producing an organic EL element will now be described which includes an anode/a hole injection layer/a hole transport layer/a light-emitting layer/a hole-blocking layer/an electron transport layer/a cathode buffer layer (an electron-injecting layer)/and a cathode.

A thin film, which is composed of a desired electrode substance such as an anode material, is firstly formed on a suitable base substance so that the thin film has a thickness of 1 μm or less, and preferably 10 nm to 200 nm to produce an anode.

Then a thin film including an organic compound such as a hole injection layer, a hole transport layer, a light-emitting layer, a hole-blocking layer, an electron transport layer, and a cathode buffer layer constituting the element is then disposed on the anode.

In the phosphorescence emitting organic EL element of the present invention, at least a cathode and an electron transport layer adjacent to the cathode are applied/formed as a film through a wet method.

Examples of the wet method include spin coating method, casting method, die coating method, blade coating method, roll coating method, ink jetting method, printing method, spray coating method, curtain coating method, and Langmuir Blodgett (LB) coating method. Among them, die coating method, roll coating method, ink jetting method, and spray coating method, which have high aptitude for being applied to a roll-to-roll process, are preferable in view of their availability of forming a precise thin film and high productivity. Alternatively, each layer may be produced through different film forming methods.

Examples of the liquid medium for dissolving or dispersing the organic EL materials of the present invention include organic media, e.g., ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; fatty hydrocarbons such as cyclohexane, decahydronaphthalene, and dodecane; dimethylformamide (DMF), and dimethyl sulfoxide (DMSO).

Examples of the adaptable dispersion method include ultrasonic dispersion, high shearing dispersion, and media dispersion.

After formation of these layers, a thin film composed of cathode materials is disposed on the layers so that the thin film has a thickness of 1 μm or less, and preferably 50 nm to 200 nm, to produce a cathode, and thereby a desired organic EL element is obtained.

In the converse order, a cathode, a cathode buffer layer, an electron transport layer, a hole-blocking layer, a light-emitting layer, a hole transport layer, a hole injection layer, and an anode may be produced in this order.

The resulting multicolor display device emits light under an applied DC voltage of about 2 V to 40 V between the positive anode and the negative cathode. Alternatively, an AC voltage may be applied. Any waveform AC voltage may be applied.

The hole injection layer to the cathode of the organic EL element of the present invention are preferably produced together in a single vacuum process; however, the work may be taken out from the process and may be formed in a different process, preferably under a dry inert gas atmosphere.

<<Sealing>>

A sealing used for the present invention is, for example, bonding of a sealing member to an electrode and/or a supporting substrate with adhesives.

A sealing member covers the display area of the organic EL element, and may have a recessed or flat surface. The transparency or electrical insulation therein is not particularly required.

Specific examples include a glass plate, a polymer plate/a film, or a metal plate/a film. Examples of a glass plate include soda-lime glass, barium/strontium-containing glass, lead glass, aluminosilicate glass, borosilicate glass, barium borosilicate glass, and quartz.

Examples of a polymer plate include polycarbonates, acrylics, polyethylene terephthalate, polyether sulfide, and polysulfones. Examples of a metal plate include one or more kinds of metals or alloys selected from the group consisting of stainless steel, iron, copper, aluminum, magnesium, nickel, zinc, chromium, titanium, molybdenum, silicon, germanium, and tantalum.

A polymer film or a metal film is preferred in the present invention for the reason that such a film can reduce the thickness of the organic EL element.

The more preferred is a polymer film having an oxygen permeability of $1\times10^{-3}$ ml/(m$^2$/24 hrs/MPa) or less measured by a testing method in accordance with JIS K 7126-1987, and a water vapor permeability of $1\times10^{-3}$ g/(m$^2$/24 hrs) or less (at 25±0.5° C. and 90±2% relative humidity (RH)) measured by a testing method in accordance with JIS K 7129-1992.

The sealing member is shaped to be recessed in a sand blast process, a chemical etching process, or the like.

Specific examples of the adhesives include photocurable and thermo-curable adhesives having reactive vinyl groups of acrylic or methacrylic oligomer, and moisture-curable adhesives such as 2-cyanoacrylic ester. Thermally and chemically curable adhesives such as epoxy adhesives (mixture of two liquids) may also be included.

Further examples include hot-melt polyamide, polyester, and polyolefin adhesives. Cationically curable ultraviolet-curing epoxy resin adhesives may also be included.

The deterioration of an organic EL element may be caused during a heating process, and thus preferred adhesives are ones which can be bonded and cured at a temperature in the range of room temperature to 80° C. The adhesives may contain a dispersed desiccant. The adhesives may be applied to a bonding portion with a commercially available dispenser, or may be applied by screen printing.

It is also preferable to form, as a sealing film, a layer of inorganic/organic substance on the outside of the electrode which faces the supporting substrate while sandwiching the organic layer, so that the layer of inorganic/organic substance covers the electrode and the organic layer and contacts with the supporting substrate.

In this case, the sealing film may be composed of any material that can prevent the penetration of moisture or oxygen which causes the deterioration of the element. Examples of such materials include silicon monoxide, silicon dioxide, and silicon nitride.

Moreover, the film preferably has a laminated configuration of these inorganic layers and layers composed of organic substances to eliminate the fragility of the film.

The sealing film may be formed by any method, for example, vacuum deposition method, sputtering method, reactive sputtering method, molecular beam epitaxy method, cluster ion beam method, ion plating method, plasma polymerization method, atmospheric pressure plasma polymerization method, plasma CVD method, laser CVD method, thermal CVD method, and coating method.

In the gap between the sealing member and the display area of the organic EL element, there are preferably injected an inert gas such as nitrogen or argon for the vapor phase, or an inactive liquid such as fluorinated hydrocarbon or silicon oil for the liquid phase. The gap may also be evacuated. The gap may also include a hygroscopic compound mounted therein.

Examples of the hygroscopic compound include metal oxides (e.g., sodium oxide, potassium oxide, calcium oxide, barium oxide, magnesium oxide, and aluminum oxide); sulfates (e.g., sodium sulfate, calcium sulfate, magnesium sulfate, and cobalt sulfate); metal halides (e.g., calcium chloride, magnesium chloride, cesium fluoride, tantalum fluoride, cerium bromide, magnesium bromide, barium iodide, and magnesium iodide); and perchlorates (e.g., barium perchlorate and magnesium perchlorate). Sulfates, metal halides, and perchlorates, all of which are preferably anhydrous.

<<Protective Film and Protective Plate>>

A protective film or a protective plate may be provided on the outside of the sealing film or the film for sealing, which faces the supporting substrate while sandwiching the organic layer, to enhance the mechanical strength of the element. In particular, sealing provided by the sealing film is not necessarily meant to have high mechanical strength, and thus is preferable to be protected with a protective film or a protective plate.

Examples of materials for the protective film or plate include a glass plate, a polymer plate/a film, or a metal plate/a film, which are also used for the sealing. Among them, a polymer film is preferred for the reason that it can be formed into a lighter and thinner film.

<<Light Extraction>>

An organic EL element generates light inside a layer having a higher refractive index (refractive index of about 1.7-2.1) than that of air, and, in general, emits merely about 15% to 20% of the generated light. This is because light, which reaches the interface (interface between a transparent substrate and air) at an angle $\theta$ equal to or greater than the critical angle, is totally reflected and thus cannot pass through the element. Light totally reflected at the interface between a transparent electrode or light-emitting layer and a transparent substrate then transversely travels through the transparent electrode or light-emitting layer, and consequently escapes in the lateral direction of the element.

Examples of techniques to enhance the efficiency of light extraction include preventing the total reflection at the interface of a transparent substrate and air by providing an asperity surface to the transparent substrate (U.S. Pat. No. 4,774,435); enhancing the efficiency by a light-harvesting substrate (Japanese Patent Application Laid-open No. 63-314795); providing a reflective surface to the side face etc. of an element (Japanese Patent Application Laid-open No. 1-220394); providing an antireflection film by interposing a planar layer having a low refractive index between a substrate and a light emitter (Japanese Patent Application Laid-open No. 62-172691); providing a planar layer, which is interposed between a substrate and a light emitter, having a lower refractive index than that of the substrate (Japanese Patent Application Laid-open No. 2001-202827); and providing a diffraction grating at any interface of a substrate, a transparent electrode, or a light-emitting layer (including the interface between the substrate and the exterior) (Japanese Patent Application Laid-open No. 11-283751).

In the present invention, these techniques may be employed for the organic EL element of the present invention in any combination. Among them, preferred are the techniques of providing a planar layer, which is interposed between a substrate and a light emitter, having a lower refractive index than that of the substrate, and of providing a grating at any interface of a substrate, a transparent electrode, or a light-emitting layer (including the interface between the substrate and the exterior).

The element having higher luminance and excellent durability is obtainable by incorporating these techniques into the present invention.

If a low refractive index medium interposed between a transparent electrode and transparent substrate has a larger thickness than the wavelength of light, the extraction efficiency of the light emitted from the transparent electrode increases as the refractive index of the medium decreases.

Examples of a low refractive index layer include aerogel, porous silica, magnesium fluoride, and fluorinated polymer. The refractive index of a transparent substrate is typically about 1.5 to 1.7, and thus the refractive index of the low refractive index layer is preferably about 1.5 or less, and more preferably 1.35 or less.

The low refractive index medium has a thickness of, preferably two times larger than the wavelength of light in the medium for the reason that the efficiency of the low refractive index layer is reduced if the thickness of the low refractive index medium is substantially equal with the wavelength of light, at which electromagnetic waves seeping in evanescent penetrate into the substrate.

A technique of introducing a diffraction grating in the interface or any of the media that totally reflects light has high potential for enhancing the efficiency of light extraction. This technique utilizing the property of the diffraction grating that can adjust light to reflect in a specific direction with a diffraction grating by a one- or two-dimensional diffraction phenomenon, so-called Bragg diffraction. This technique diffracts some of the light generated in a light-emitting layer, which is trapped within a layer interface by total reflection, by introducing a diffraction grating in any interface of layers or any media (in a transparent substrate or a transparent electrode) to bring the light out.

A diffraction grating having two-dimensional periodic refractive index is preferably introduced. This is because the light generated in a light-emitting layer is randomly emitted in various directions. A typical one-dimensional diffraction grating having periodic refractive index distribution along only one specific direction, which diffracts only the light emitted in one specific direction, cannot significantly enhance the efficiency of light extraction.

However, if a two-dimensional distribution of refractive index is provided, the efficiency of light extraction can be enhanced by diffracting any light propagating in various directions.

A diffraction grating may be introduced, as described above, in any interface between layers or in any media (in a transparent substrate or a transparent electrode), preferably in the vicinity of an organic light-emitting layer which emits light. In this case, the periodicity of the diffraction grating is preferably around one half to three times the wavelength of light in the medium.

Preferred examples of the structure of the diffraction grating include a square lattice, a triangle lattice, and a honeycomb lattice forming two-dimensional arrays in sequence.

<<Light Condensing Sheet>>

The light emitting side of the substrate of the organic EL element of the present invention may have, for example, a microlens array structure, or be provided with a so-called light condensing sheet, such that the emitted light is condensed in a specific direction, e.g., a vertical direction to the light emitting surface of the element so as to enhance the luminance in a specific direction.

A typical example microlens array contains a two-dimensional array of square pyramids having a base edge length of 30 µm and an apex angle of 90 degree, which is provided over the light emitting side of the substrate. The base edge length is preferably 10 µm to 100 µm. A shorter length than this emits color light due to a diffraction effect, whereas a longer length requires an undesirably thick microlens.

Examples of such light condensing sheet include the one practically used for an LED backlight of a liquid crystal display device, such as "brightness enhancement film (BEF)" manufactured by Sumitomo 3M Limited.

Such a prism sheet may have, for example, triangular prisms, which have an apex angle of 90 degree, placed on a base material with a pitch of 50 µm into stripes. Any other form may also be applied, such as a rounded top or a randomly varied pitch.

A light diffusion plate or film may be used in combination with the prism sheet to control the emission angle of light emitted from the light emitting element. For example, "light diffusion film (LIGHT-UP)" manufactured by KIMOTO, CO., LTD. is applicable.

<<Application>>

The organic EL element of the present invention can be used in display devices, displays, or various light sources. Nonlimiting examples of such light sources include illumination devices (home or car illumination), backlights for clocks/watches or liquid crystal display devices, billboards, traffic signals, light sources of optical storage medium, light sources of electrophotographic copying machines, light sources of optical communication processors, light sources of optical sensors. In particular, the element is effectively used in backlights for liquid crystal display devices and illumination light sources.

A film may be patterned as required through a metal mask or in inkjet printing method to form the organic EL element of the present invention. Such patterning may be applied to only the electrode, to the electrode and the light-emitting layer, or to the entire layers of the element. Any conventionally known procedures may be used for producing the element.

Figure 4:
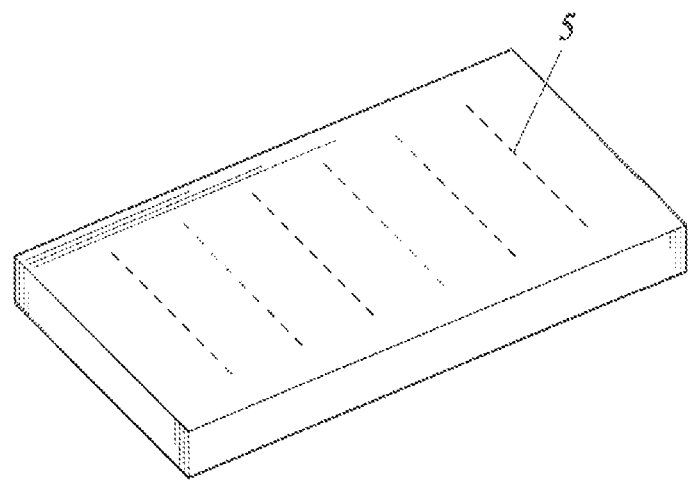
FIG. 4 is a schematic view of a full color display device of a passive matrix system.
Figure 4:
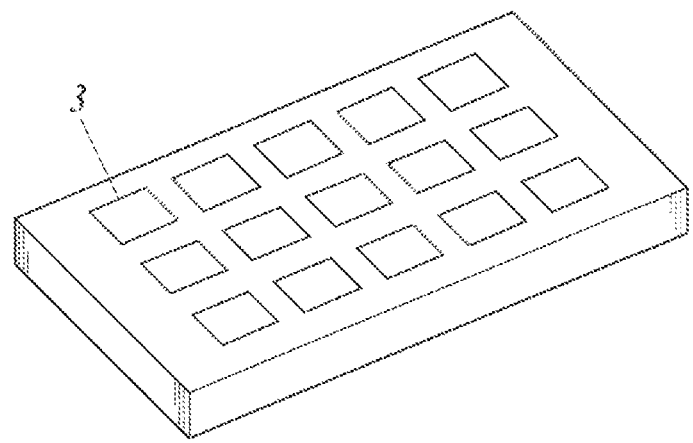
Figure 4:
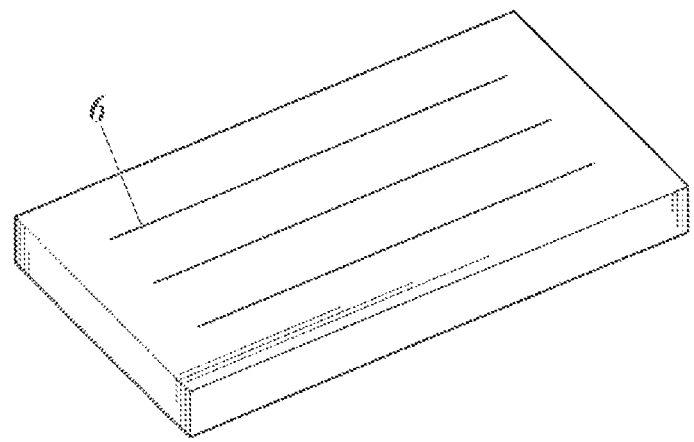

The light emitted from the organic EL element of the present invention and/or the compounds of the present invention was measured by a spectrophotometer CS-1000 (available from KONICA MINOLTA SENSING, INC.), and then the resulting values were defined by the CIE chromaticity coordinates to determine the color of the emitted light as described in Figure 4.16 on page 108 of "Shinpen Shikisai Kgakau Handbook (Revised Color Science Handbook)" (edited by Color Science Association of Japan, University of Tokyo Press, 1985).

In the case that the organic EL element of the present invention is the while element, a while color means that the CIE 1931 chromaticity at 1000 cd/m$^2$ falls in the range of X=0.33±0.07, Y=0.33±0.1 when the luminance at the front surface is measured at a 2-degree field of view by the procedure described above.

<<Display Device>>

The display device of the present invention will now be described. The display device of the present invention is provided with the organic EL element of the present invention.

The display device of the present invention may be either a monochrome or multicolor device. The multicolor display device is described herein.

In the case of the multicolor display device, a film can be formed on one surface by providing a shadow mask only during formation of the light emitting layer, by vapor deposition method, casting method, spin coating method, ink jetting method, or printing method.

If only the light-emitting layer is needed to be patterned, any patterning process may be applied, and vapor deposition method, ink jetting method, spin coating method, or printing method is preferred.

The structure of the organic EL element for the display device is selected from the above-described examples of the organic EL element as required.

The organic EL element is produced by the method as described in one embodiment for producing the organic EL element of the present invention.

The resulting multicolor display device emits light under an applied DC voltage of about 2 V to 40 V between the positive anode and the negative cathode. When the polarity is reversed, no current flows, and no light is emitted. Light is emitted if an AC voltage is applied between the positive anode and the negative cathode. Any waveform of AC voltage may be applied.

The multicolor display device can be used in display devices, displays, or various light sources. Display devices and displays can display full color images when being provided with organic EL elements of three colors (blue, red and green).

Examples of such display devices and displays include televisions, computers, mobile equipment, audio-visual equipment, teletext displays, and in-vehicle information displays. In particular, they may be used as display devices for creating a still or moving picture. The display device used for creating a moving picture may be driven by either simple (passive) or active matrix addressing.

As examples of such light sources, there can be adopted home illumination, car illumination, backlights for clocks/watches or liquid crystal displays, billboards, traffic signals, light sources of optical storage medium, light sources of electrophotographic copying machines, light sources of optical communication processor, light sources of optical sensors, but the present invention is not limited to these.

An example of the display device including the organic EL element of the present invention will now be described with reference to the drawings.

FIG. 1 is a schematic view illustrating an example of the display device including the organic EL element. This is a schematic view of a display of, for example, a cellular phone which displays image information through light emission of the organic EL element.

The display 1 is equipped with a display section A including a plurality of pixels and a control section B performing image scanning of the display section A according to image information.

The control section B is electrically connected to the display section A, sends scanning signals and image data signals to the plural pixels, respectively, based on external image information, and urges the pixels for every scanning line to sequentially emit light by the scanning signals in response to the image data signals to perform image scanning to display image information in the display section A.

Figure 2:
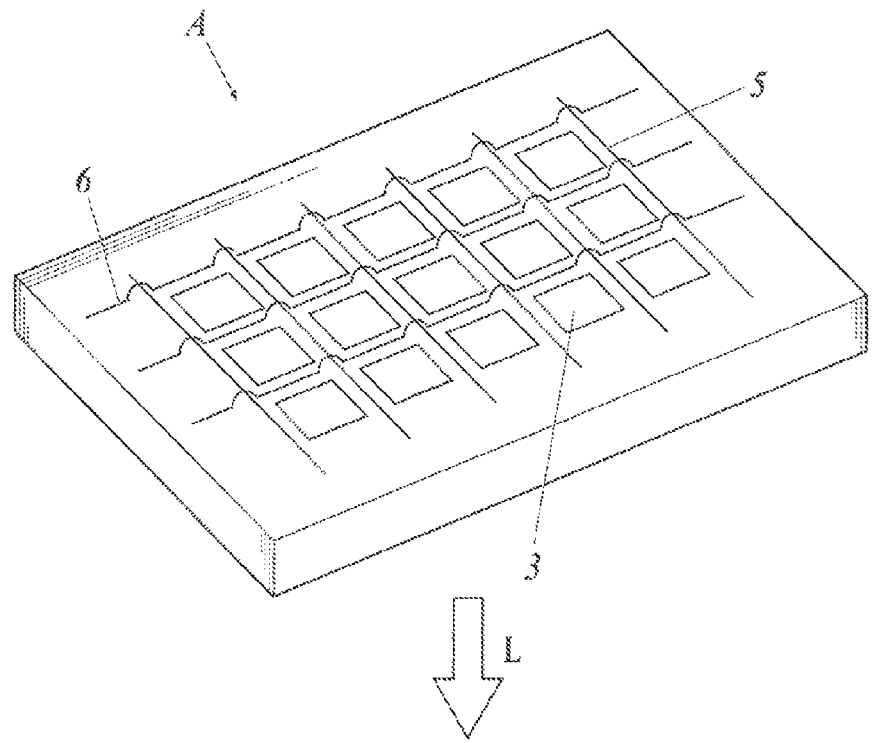
FIG. 2 is a schematic view of a display device A.

FIG. 2 is a schematic view of the display section A.

The display section A includes a wiring section including scanning lines 5 and data lines 6, and a plurality of pixels 3 on a substrate. The main components of the display section A will now be described.

Figure 5:
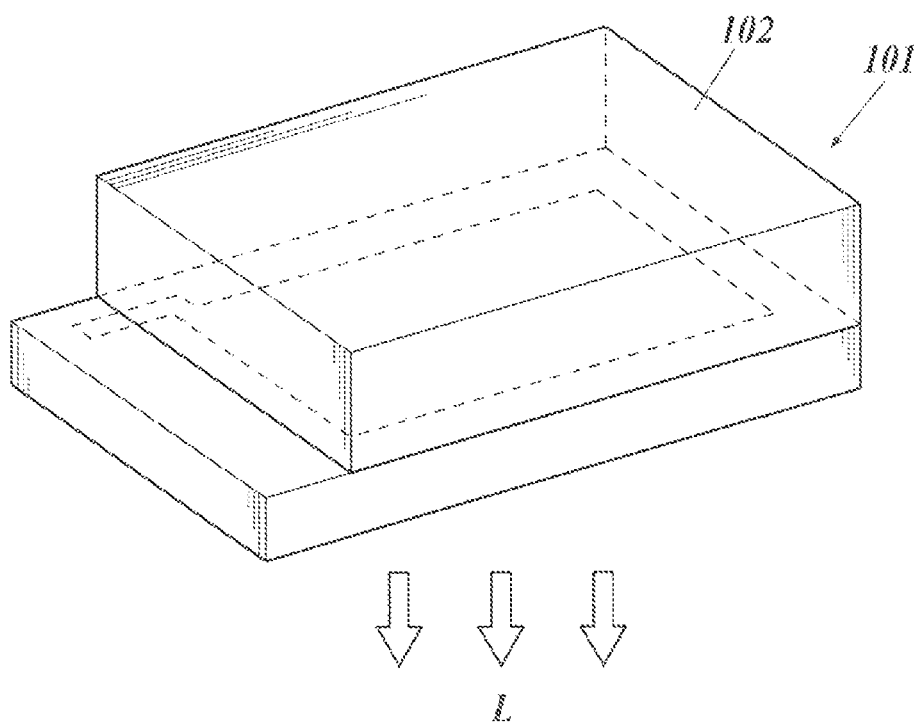
FIG. 5 is an outline drawing of an illumination device.
Figure 6:
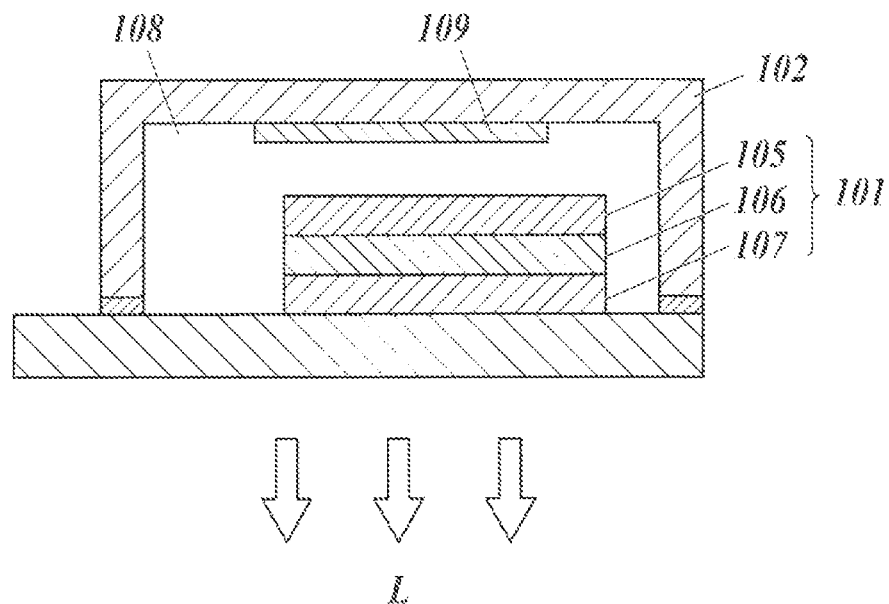
FIG. 6 is a schematic view of an illumination device.

The drawing illustrates that the light emerging from pixels 3 travels in the direction (downward) of the white arrow L, where sign L indicates light (also in FIGS. 5 and 6).

The scanning lines 5 and data lines 6 in the wiring section are composed of conductive materials. The scanning lines 5 and the data lines 6 are orthogonal to each other into a lattice and are connected to the respective pixels 3 at their crosspoints (details are not illustrated).

The pixels 3 receive image data signals from the data lines 6 in response to scanning signals applied to the pixels 3 from the scanning lines 5, and emit light corresponding to the received image data.

Pixels emitting light having a color of red area, pixels emitting light having a color of green area, and pixels emitting light having a color of blue area are appropriately arrayed on a single substrate to display full-color images.

The luminescent process of the pixel will now be described.

Figure 3:
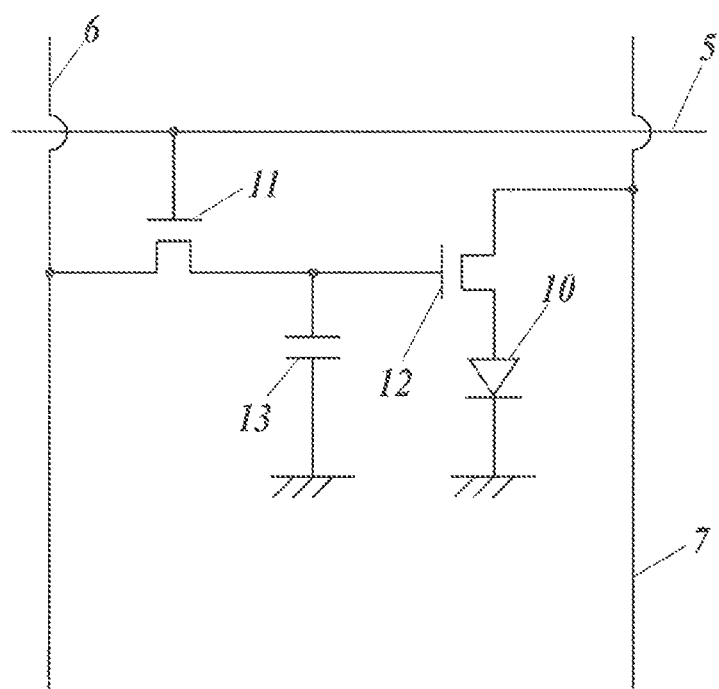
FIG. 3 is a schematic view of an image pixel.

FIG. 3 is a schematic view of a pixel.

The pixel is provided with an organic EL element 10, a switching transistor 11, a driving transistor 12, and a capacitor 13. A plurality of pixels provided with organic EL elements 10 emitting red light, green light, and blue light are arrayed on a single substrate to achieve full-color display.

In FIG. 3, image data signals are applied to the drain of the switching transistor 11 through the data line 6 from the control section B. In response to scanning signals applied to the gate of the switching transistor 11 through the scanning line 5 from the control section B, the switching transistor 11 is driven and the image data signals applied to the drain are transmitted to the capacitor 13 and the gate of the driving transistor 12.

The transmission of the image data signal charges the capacitor 13 in response to the potential of the image data signal and turns on the driving transistor 12. The driving transistor 12 is connected to a power source line 7 at its drain and an electrode of the organic EL element 10 at its source. A current is supplied from the power source line 7 to the organic EL element 10 in response to the potential of the image data signal applied to the gate.

When the scanning signal shifts to the next scanning line 5 upon the sequential scanning operation by the control section B, the switching transistor 11 is turned off.

Since the capacitor 13 maintains the potential of the charged image data signals even after the switching transistor 11 is turned off, the driving transistor 12 is still activated to continue the emission of the organic EL element 10 until a next scanning signal is applied.

When the next scanning signal is applied by the sequential scanning operation, the driving transistor 12 is activated in response to the potential of the next image data signal in synchronization with the scanning signal to urge the organic EL element 10 to emit light.

The light emission of the pixels 3 of the organic EL element 10 is carried out by active elements, i.e., the switching transistor 11 and the driving transistor 12 provided for each of the organic EL element 10 including the pixels 3. Such a luminescent scheme is referred to as an active matrix scheme.

The light emission mode of the organic EL element 10 may be graded light emission with multi-value image data signals having different graded potentials, or binary emission (ON and OFF) with binary image data signals. The potential at the capacitor 13 may be maintained until the application of the next scanning signal or the capacitor 13 may be discharged immediately before the application of the next scanning signal.

The present invention is applicable to not only the active matrix scheme, but also a passive matrix scheme involving light emission of the organic EL element in response to a data signal only during scan by the scanning signal.

FIG. 4 is a schematic view of a passive matrix display device. In FIG. 4, a plurality of scanning lines 5 and a plurality of data lines 6 are orthogonally arrayed into a grid so as to be opposite to each other across the pixels 3.

When scanning signals are applied from a scanning line 5 by a sequential scanning operation, the pixels 3 connected to the active scanning line 5 emit light in response to the image data signals.

The passive matrix scheme, which has no active element in the pixels 3, contributes to a reduction in production cost.

<<Illumination Device>>

An illumination device of the present invention will now be described. The illumination device of the present invention includes the organic EL element. The organic EL element of the present invention may have a resonant structure for use in a light source of an optical storage medium, a light source of an electrophotographic copying machine, a light source of an optical communication apparatus, or a light source of an optical sensor, but the use is not limited to the above. An organic EL element with laser oscillation can also be used in these applications.

The organic EL element of the present invention may be used in the form of a lamp such as a light source for illumination or exposure, in the form of a projection device involving projection of images, or in the form of a display device (display) in which still and/or moving images are visually recognized directly.

The display device may be driven by either a simple matrix (passive matrix) or active matrix scheme for displaying moving images. A full-color display device can be produced with two or more kinds of organic EL elements emitting different colors of the present invention.

The organic EL material of the present invention can be applied to organic EL elements emitting substantially white light as illumination devices. A plurality of luminous materials is used to emit white light as a light mixture of different colors.

A combination of luminescent colors may be a mixture of three maximum wavelengths of light components of three primary colors, i.e., red, green, and blue, or a mixture of two maximum wavelengths of light components of complementary colors, i.e., blue and yellow or bluish green and orange.

Any combination of luminescent materials to produce a plurality of luminescent colors is available, for example, combinations of different phosphorescence or fluorescence emitting materials, and combinations of a fluorescent or phosphorescent emitting material and a dye material that emits light from the luminescent material in the form of excited light. In the white organic EL element of the present invention, a mixture of different luminescent dopants can be effectively used.

Only the light-emitting layer, the hole transport layer, and the electron transport layer are formed through their dedicated masks by coating, and other layers, such as electrode films, can be formed over the entire surface by evaporation method, casting method, spin coating method, ink jetting method, or printing method without a mask at high production efficiency.

According to this method, the element itself can emit white light, unlike a white organic EL device including an array of light emitting elements emitting light of different colors.

Any luminescent materials can be used for the light-emitting layer without restriction. For example, in the case of back lights of liquid crystal display elements, suitable materials can be selected from the metal complex according to the present invention and known luminescent materials to generate white light conforming to the wavelength range corresponding to color filter (CF) characteristics.

<<Embodiment of Illumination Device of the Present Invention>>

An embodiment of the illumination device including the organic EL element of the present invention will now be described.

The non-luminescent surface of the organic EL element of the present invention is covered with a glass case. An epoxy photo-curable adhesive (ARONIX LC0629B available from Toagosei Co., Ltd.) is applied as sealing material onto the periphery of a glass substrate with a thickness of 300 µm as a sealing substrate, and the glass substrate is overlaid on the cathode to be put into tight contact with a transparent substrate and is irradiated with UV light to cure the adhesive and to seal the EL element. Thereby an illumination device is formed as shown in FIGS. 5 and 6.

FIG. 5 is a schematic view of the illumination device. The organic EL element 101 of the present invention is covered with a glass cover 102 (The sealing operation with the glass cover was carried out in a glove box under a stream of high-purity nitrogen (99.999% or more) to avoid exposure of the organic EL element 101 to atmosphere).

FIG. 6 is a cross-sectional view of the illumination device. In FIG. 6, reference numeral 105 represents a cathode, reference numeral 106 represents an organic LE layer, and reference numeral 107 represents a glass substrate provided with a transparent electrode (anode).

The interior of the glass cover 102 is filled with nitrogen gas 108 and provided with a water catching agent 109.

EXAMPLES

The present invention will now be described in further detail by way of nonlimiting examples.

The structure of the compound used in the examples is as follows:

[Chemical Formula 88]

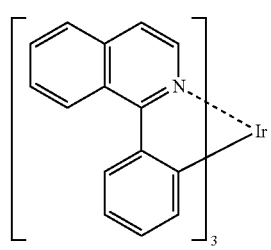

cRD-1

-continued

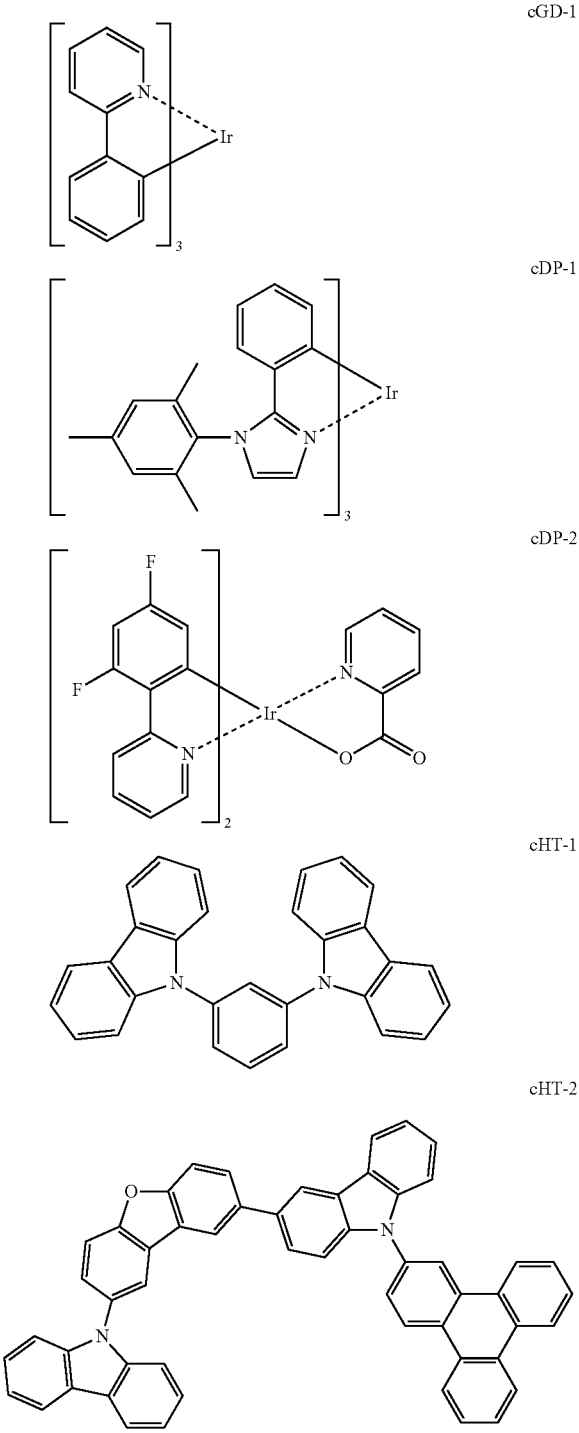

cGD-1 cDP-1 cDP-2 cHT-1 cHT-2

Example 1

<<Preparation of Organic EL Element 1-1>>

A substrate (NA45 available from NH TECHNOGLASS CORPORATION), which was a glass substrate of 100 mm by 100 mm by 1.1 mm thick provided with an anode of a 100 nm thick ITO (indium tin oxide) film thereon, was subjected to patterning. The resulting transparent supporting substrate provided with the transparent ITO electrode was cleaned in isopropyl alcohol with an ultrasonic cleaner, dried with nitrogen gas, and then exposed to UV/ozone for five minutes.

The transparent supporting substrate was fixed on the substrate holder in a commercially available vacuum deposition apparatus. 200 mg of HT-30 was placed in a resistively heated molybdenum boat, 200 mg of HT-2 was placed in another resistively heated molybdenum boat, 200 mg of compound 2-45 was placed in another resistively heated molybdenum boat, 200 mg of HS-1 was placed in another resistively heated molybdenum boat, 200 mg of DP-1 was placed in another resistively heated molybdenum boat, 200 mg of compound 3-7 was placed in another resistively heated molybdenum boat. These were then attached to the vacuum deposition apparatus.

The heated boat containing HT-30 was energized and heated in a vacuum chamber evacuated to a pressure of $4\times10^{-4}$ Pa, and then vapor-deposited on the transparent supporting substrate at a deposition rate of 0.1 nm/sec into a hole injection layer of 10 nm.

The heated boat containing HT-2 was energized and heated, and then vapor-deposited on the hole injection layer at a deposition rate of 0.1 nm/sec into a first hole transport layer (HT1) of 20 nm, and the heated boat containing compound 2-45 was energized and heated and then vapor-deposited on the first hole transport layer at a deposition rate of 0.1 nm/sec into a second hole transport layer (HT2) of 20 nm.

Similarly, the heated boats containing HS-1 and DP-1 were energized and heated, and then co-deposited on the second hole transport layer (HT2) at a deposition rate of 0.1 nm/sec or 0.025 nm/sec, respectively, into a light-emitting layer of 60 nm.

The heated boat containing compound 3-7 was energized and heated, and then vapor-deposited on the light-emitting layer at a deposition rate of 0.1 nm/sec into an electron transport layer (ET) of 20 nm.

Furthermore, a cathode buffer layer of 0.5 nm containing potassium fluoride was vapor-deposited, and a cathode of 110 nm containing aluminum was successively vapor-deposited on the above layers, to produce an organic EL element 1-1.

<<Preparation of Organic EL Elements 1-2 to 1-29>>

Organic EL elements 1-2 to 1-29 were prepared as in organic EL element 1-1 except that HT-2, compound 2-45, HS-1, DP-1, and compound 3-7 respectively were replaced with compounds shown in Tables 1A and 1B.

Tables 1A and 1B show the values of "the highest occupied molecular orbital" HOMO of the hole transport materials used in the first and second hole transport layers (HT1, HT2); the values of |HOMO (HT2)−HOMO HT1)|=ΔHOMO; the excited triplet state energy values (T1) of blue-emitting dopants (D) used for the hole transport materials of the second hole transport layer (HT2), and for the light-emitting layer; the values of |T1 (HT2)−T1(D)|=ΔT1; the values of "the lowest unoccupied molecular orbital" LUMO of the host materials (H) and the electron transport materials (ET); and the values of |LUMO (H)−LUMO (ET)|=ΔLUMO.

<<Evaluation of Organic EL Elements 1-1 to 1-29>>

In order to evaluate the resulting organic EL elements, each non-emitting surface of the produced organic EL elements was covered with a glass cover. The glass cover was bonded to the periphery of the glass substrate placed under the organic EL element with a sealant of a photocurable epoxy adhesive (LUXTRACK LC0629B available from TOAGOSEI CO., LTD.). The resultant was placed over the cathode, bonded to the transparent supporting substrate, and then a portion other than the organic EL element was cured and sealed by UV light from the glass substrate side to form an illumination device shown in FIGS. 5 and 6.

The following items were evaluated, and the results are shown in Table 1C.

(External Fetch Quantum Efficiency (EQE))

Each of the organic EL elements emitted light at room temperature (about 23° C. to 25° C.) under a constant current of 2.5 mA/cm$^2$. The luminance (L) [cd/m$^2$] at a time just started emitting light was measured to calculate the external fetch quantum efficiency (η).

The emission luminance was measured using CS-1000 (available from KONICA MINOLTA SENSING, INC.). The external fetch quantum efficiency was calculated relative to the value (100) of the organic EL element 1-4.

(Service Life of Light Emission)

Each of the organic EL elements continuously emitted light at room temperature under a constant current of 2.5 mA/cm$^2$. The time (τ½) required to reach the half of the original luminance was measured. The ratio of the service life was calculated relative to the value (100) of the organic EL element 1-4.

(Chromatic Stability)

The luminance (1000 cd/m$^2$) at the front surface of each sample before and after the measurement of the service life of light emission was measured, and the resulting values were defined by the CIE 1931 coordinates (x, y values). The maximum color difference (ΔE) was given by the formula below. The ratio was calculated relative to the value (100) of the organic EL element 1-4. The smaller the values, the smaller the variation and the better the chromatic stability. The luminance of the front surface was measured with spectral radiance meter CS-1000 (available from KONICA MINOLTA SENSING, INC.).

$$\Delta E = (\Delta x^2 + \Delta y^2)^{1/2}$$

TABLE 1A

| ORGANIC EL ELEMENT | HT1 COMPOUND | HOMO | HT2 COMPOUND | HOMO | T1 | D COMPOUND | T1 |
|---|---|---|---|---|---|---|---|
| 1-1 | HT-2 | −4.72 | 2-45 | −4.97 | 3.03 | DP-1 | 2.74 |
| 1-2 | HT-2 | −4.72 | 2-45 | −4.97 | 3.03 | cDP-1 | 2.75 |
| 1-3 | HT-2 | −4.72 | 2-45 | −4.97 | 3.03 | cDP-2 | 2.80 |
| 1-4 | HT-2 | −4.72 | NONE | — | — | DP-1 | — |
| 1-5 | HT-2 | −4.72 | NONE | — | — | cDP-1 | — |
| 1-6 | HT-2 | −4.72 | NONE | — | — | cDP-2 | — |
| 1-7 | HT-2 | −4.72 | 2-45 | −4.97 | 3.03 | DP-2 | 2.75 |
| 1-8 | HT-2 | −4.72 | 2-45 | −4.97 | 3.03 | DP-3 | 2.75 |
| 1-9 | HT-2 | −4.72 | 2-45 | −4.97 | 3.03 | DP-5 | 2.70 |
| 1-10 | HT-2 | −4.72 | 2-45 | −4.97 | 3.03 | DP-77 | 2.76 |
| 1-11 | HT-2 | −4.72 | 2-47 | −4.96 | 3.03 | DP-1 | 2.74 |
| 1-12 | HT-2 | −4.72 | 2-49 | −5.03 | 3.02 | DP-1 | 2.74 |
| 1-13 | HT-46 | −4.60 | 2-48 | −4.96 | 3.01 | DP-1 | 2.74 |
| 1-14 | HT-46 | −4.60 | 2-46 | −4.86 | 2.98 | DP-1 | 2.74 |
| 1-15 | HT-46 | −4.60 | 2-45 | −4.97 | 3.03 | DP-1 | 2.74 |
| 1-16 | HT-1 | −4.84 | 2-45 | −4.97 | 3.03 | DP-1 | 2.74 |
| 1-17 | HT-2 | −4.72 | cHT-1 | −5.45 | 3.18 | DP-1 | 2.74 |
| 1-18 | HT-2 | −4.72 | cHT-2 | −5.26 | 2.80 | DP-1 | 2.74 |
| 1-19 | HT-2 | −4.72 | HT-46 | −4.60 | 2.82 | DP-1 | 2.74 |
| 1-20 | HT-2 | −4.72 | 2-45 | −4.97 | 3.03 | DP-1 | 2.74 |
| 1-21 | HT-2 | −4.72 | 2-45 | −4.97 | 3.03 | DP-1 | 2.74 |
| 1-22 | HT-2 | −4.72 | 2-45 | −4.97 | 3.03 | DP-1 | 2.74 |
| 1-23 | HT-2 | −4.72 | 2-45 | −4.97 | 3.03 | DP-1 | 2.74 |
| 1-24 | HT-2 | −4.72 | 2-45 | −4.97 | 3.03 | DP-1 | 2.74 |
| 1-25 | HT-2 | −4.72 | 2-45 | −4.97 | 3.03 | DP-1 | 2.74 |
| 1-26 | HT-2 | −4.72 | 2-45 | −4.97 | 3.03 | DP-1 | 2.74 |
| 1-27 | HT-2 | −4.72 | 2-45 | −4.97 | 3.03 | DP-1 | 2.74 |
| 1-28 | HT-2 | −4.72 | 2-45 | −4.97 | 3.03 | DP-1 | 2.74 |
| 1-29 | HT-2 | −4.72 | 2-45 | −4.97 | 3.03 | DP-1 | 2.74 |

TABLE 1B

| ORGANIC EL ELEMENT | H COMPOUND | LUMO | ET COMPOUND | LUMO | Δ HOMO (HT2-HT1) | Δ T1 (HT2-D) | Δ LUMO (H-ET) |
|---|---|---|---|---|---|---|---|
| 1-1 | HS-1 | −1.01 | 3-7 | −1.07 | −0.25 | 0.29 | 0.06 |
| 1-2 | HS-1 | −1.01 | 3-7 | −1.07 | −0.25 | 0.28 | 0.06 |
| 1-3 | HS-1 | −1.01 | 3-7 | −1.07 | −0.25 | 0.23 | 0.06 |
| 1-4 | HS-1 | −1.01 | 3-7 | −1.07 | — | — | 0.06 |
| 1-5 | HS-1 | −1.01 | 3-7 | −1.07 | — | — | 0.06 |
| 1-6 | HS-1 | −1.01 | 3-7 | −1.07 | — | — | 0.06 |
| 1-7 | HS-1 | −1.01 | 3-7 | −1.07 | −0.25 | 0.28 | 0.06 |
| 1-8 | HS-1 | −1.01 | 3-7 | −1.07 | −0.25 | 0.28 | 0.06 |
| 1-9 | HS-1 | −1.01 | 3-7 | −1.07 | −0.25 | 0.33 | 0.06 |
| 1-10 | HS-1 | −1.01 | 3-7 | −1.07 | −0.25 | 0.27 | 0.06 |
| 1-11 | HS-1 | −1.01 | 3-7 | −1.07 | −0.24 | 0.29 | 0.06 |
| 1-12 | HS-1 | −1.01 | 3-7 | −1.07 | −0.31 | 0.28 | 0.06 |
| 1-13 | HS-1 | −1.01 | 3-7 | −1.07 | −0.36 | 0.27 | 0.06 |

TABLE 1B-continued

| ORGANIC EL ELEMENT | H COMPOUND | LUMO | ET COMPOUND | LUMO | Δ HOMO (HT2-HT1) | Δ T1 (HT2-D) | Δ LUMO (H-ET) |
|---|---|---|---|---|---|---|---|
| 1-14 | HS-1 | −1.01 | 3-7 | −1.07 | −0.26 | 0.24 | 0.06 |
| 1-15 | HS-1 | −1.01 | 3-7 | −1.07 | −0.37 | 0.29 | 0.06 |
| 1-16 | HS-1 | −1.01 | 3-7 | −1.07 | −0.13 | 0.29 | 0.06 |
| 1-17 | HS-1 | −1.01 | 3-7 | −1.07 | −0.73 | 0.44 | 0.06 |
| 1-18 | HS-1 | −1.01 | 3-7 | −1.07 | −0.54 | 0.06 | 0.06 |
| 1-19 | HS-1 | −1.01 | 3-7 | −1.07 | 0.12 | 0.08 | 0.06 |
| 1-20 | HS-2 | −1.15 | 3-16 | −0.85 | −0.25 | 0.29 | −0.30 |
| 1-21 | HS-3 | −1.44 | 3-9 | −1.40 | −0.25 | 0.29 | −0.04 |
| 1-22 | HS-1 | −1.01 | 3-4 | −1.48 | −0.25 | 0.29 | 0.47 |
| 1-23 | HS-1 | −1.01 | 3-2 | −1.72 | −0.25 | 0.29 | 0.71 |
| 1-24 | HS-2 | −1.15 | 4-1 | −1.76 | −0.25 | 0.29 | 0.61 |
| 1-25 | HS-1 | −1.01 | 4-2 | −1.76 | −0.25 | 0.29 | 0.75 |
| 1-26 | HS-201 | −1.44 | 3-7 | −1.07 | −0.25 | 0.29 | −0.37 |
| 1-27 | HS-202 | −1.48 | 4-2 | −1.76 | −0.25 | 0.29 | 0.28 |
| 1-28 | HS-1 | −1.01 | ET-6 | −1.87 | −0.25 | 0.29 | 0.86 |
| 1-29 | HS-2 | −1.15 | ET-1 | −0.73 | −0.25 | 0.29 | −0.42 |

TABLE 1C

| ORGANIC EL ELEMENT | EQE | SERVICE LIFE | CHROMATIC STABILITY | |
|---|---|---|---|---|
| 1-1 | 170 | 200 | 25 | PRESENT INVENTION |
| 1-2 | 110 | 80 | 80 | COMPARATIVE EXAMPLE |
| 1-3 | 60 | 20 | 85 | COMPARATIVE EXAMPLE |
| 1-4 | 100 | 100 | 100 | COMPARATIVE EXAMPLE |
| 1-5 | 85 | 60 | 90 | COMPARATIVE EXAMPLE |
| 1-6 | 30 | 15 | 95 | COMPARATIVE EXAMPLE |
| 1-7 | 160 | 150 | 30 | PRESENT INVENTION |
| 1-8 | 160 | 170 | 30 | PRESENT INVENTION |
| 1-9 | 170 | 170 | 35 | PRESENT INVENTION |
| 1-10 | 170 | 180 | 20 | PRESENT INVENTION |
| 1-11 | 150 | 150 | 30 | PRESENT INVENTION |
| 1-12 | 160 | 180 | 40 | PRESENT INVENTION |
| 1-13 | 170 | 160 | 35 | PRESENT INVENTION |
| 1-14 | 180 | 160 | 35 | PRESENT INVENTION |
| 1-15 | 170 | 170 | 30 | PRESENT INVENTION |
| 1-16 | 160 | 190 | 20 | PRESENT INVENTION |
| 1-17 | 65 | 50 | 80 | COMPARATIVE EXAMPLE |
| 1-18 | 90 | 85 | 100 | COMPARATIVE EXAMPLE |
| 1-19 | 75 | 70 | 120 | COMPARATIVE EXAMPLE |
| 1-20 | 180 | 220 | 25 | PRESENT INVENTION |
| 1-21 | 170 | 190 | 25 | PRESENT INVENTION |
| 1-22 | 175 | 190 | 25 | PRESENT INVENTION |
| 1-23 | 170 | 190 | 30 | PRESENT INVENTION |
| 1-24 | 180 | 220 | 30 | PRESENT INVENTION |
| 1-25 | 180 | 220 | 30 | PRESENT INVENTION |
| 1-26 | 180 | 280 | 20 | PRESENT INVENTION |
| 1-27 | 180 | 300 | 20 | PRESENT INVENTION |
| 1-28 | 150 | 150 | 30 | PRESENT INVENTION |
| 1-29 | 150 | 140 | 30 | PRESENT INVENTION |

Table 1C evidentially demonstrates that the organic EL elements, in which the dopant compounds and specific hole transport layers of the present invention are laminated (HT1, HT2), exhibited excellent efficiency, service life, and chromatic stability compared to the organic EL elements of Comparative Examples. These effects were achieved by the compounds given by General Formula (1) and in the range of −5.4<HOMO (HT2)<−4.9, T1 (HT2)−T1 (D)>0.1. Significant effects were achieved by the materials given by General Formula (2), (3), and (4).

Example 2

<<Preparation of Organic EL Element 2-1>>

A substrate (NA45 available from NH TECHNOGLASS CORPORATION), which was a glass substrate of 100 mm by 100 mm by 1.1 mm thick provided with an anode of a 100 nm thick ITO (indium tin oxide) film thereon, was subjected to patterning. The resulting transparent supporting substrate provided with the transparent ITO electrode was cleaned in isopropyl alcohol with an ultrasonic cleaner, dried with nitrogen gas, and then exposed to UV/ozone for five minutes.

The transparent supporting substrate was fixed on the substrate holder in a commercially available vacuum deposition apparatus. 200 mg of HT-30 was placed in a resistively heated molybdenum boat, 200 mg of HT-2 was placed in another resistively heated molybdenum boat, compound 2-45 was placed in another resistively heated molybdenum boat, 200 mg of HS-1 was placed in another resistively heated molybdenum boat, 200 mg of DP-1 was placed in another resistively heated molybdenum boat, 200 mg of cGD-1 was placed in another resistively heated molybdenum boat, 200 mg of cRD-1 was placed in another resistively heated molybdenum boat, 200 mg of compound 3-7 was placed in another resistively heated molybdenum boat. These were then attached to the vacuum deposition apparatus.

The heated boat containing HT-30 was energized and heated in a vacuum chamber evacuated to a pressure of $4 \times 10^{-4}$ Pa, and then vapor-deposited on the transparent supporting substrate at a deposition rate of 0.1 nm/sec into a hole injection layer of 10 nm.

The heated boat containing HT-2 was energized and heated, and then vapor deposited on the hole injection layer at a deposition rate of 0.1 nm/sec into a first hole transport layer of 20 nm, and the heated boat containing compound 2-45 was energized and heated and then vapor-deposited on the first hole transport layer at a deposition rate of 0.1 nm/sec into a second hole transport layer of 20 nm.

Similarly, the heated boats containing cHS-1, DP-1, cGD-1, and cRD-1 were energized and heated, and then co-deposited on the hole transport layer at a deposition rate of 0.1 nm/sec, 0.025 nm/sec, 0.0007 nm/sec, or 0.0002 nm/sec, respectively, into a light-emitting layer of 60 nm.

The heated boat containing compound 3-7 was energized and heated, and then vapor-deposited on the light-emitting layer at a deposition rate of 0.1 nm/sec into an electron transport layer of 20 nm.

Furthermore, a cathode buffer layer of 0.5 nm containing potassium fluoride and a cathode of 110 nm containing aluminum were successively vapor-deposited on the above layers into an organic EL element 2-1.

<<Preparation of Organic EL Elements 2-2 to 2-15>>

Organic EL elements 2-2 to 2-15 were prepared as in organic EL element 2-1 except that compounds HT-2, 2-45, and DP-1 respectively were replaced with compounds shown in Table 2A.

Tables 2A and 2B show the values of "the highest occupied molecular orbital" HOMO of the hole transport materials used in the first and second hole transport layers (HT1, HT2); the values of |HOMO (HT2)−HOMO (HT1) |=ΔHOMO; the excited triplet state energy values (T1) of blue-emitting dopants (D) used for the hole transport materials of the second hole transport layer (HT2), and for the light-emitting layer; and the values of |T1 (HT2)−T1 (D)|=ΔT1.

<<Evaluation of Organic EL Elements 2-1 to 2-15>>

When evaluating the resulting organic EL element, each organic EL element was sealed as in the organic EL elements 1-1 to 1-29 in Example 1 to form an illumination device, as shown in FIGS. 5 and 6, and evaluated for chromatic stability. The results are shown in Table 2B.

TABLE 2A

| ORGANIC EL ELEMENT | HT1 COMPOUND | HOMO | HT2 COMPOUND | HOMO | T1 | D COMPOUND | T1 |
|---|---|---|---|---|---|---|---|
| 2-1 | HT-2 | −4.72 | 2-45 | −4.97 | 3.03 | DP-1 | 2.74 |
| 2-2 | HT-2 | −4.72 | 2-45 | −4.97 | 3.03 | cDP-1 | 2.75 |
| 2-3 | HT-2 | −4.72 | 2-45 | −4.97 | 3.03 | cDP-2 | 2.80 |
| 2-4 | HT-2 | −4.72 | NONE | — | — | DP-1 | — |
| 2-5 | HT-2 | −4.72 | NONE | — | — | cDP-1 | — |
| 2-6 | HT-2 | −4.72 | NONE | — | — | cDP-2 | — |
| 2-7 | HT-2 | −4.72 | 2-45 | −4.97 | 3.03 | DP-2 | 2.75 |
| 2-8 | HT-2 | −4.72 | 2-45 | −4.97 | 3.03 | DP-77 | 2.76 |
| 2-9 | HT-2 | −4.72 | 2-47 | −4.96 | 3.03 | DP-1 | 2.74 |
| 2-10 | HT-46 | −4.60 | 2-46 | −4.86 | 2.98 | DP-1 | 2.74 |
| 2-11 | HT-46 | −4.60 | 2-45 | −4.97 | 3.03 | DP-1 | 2.74 |
| 2-12 | HT-1 | −4.84 | 2-45 | −4.97 | 3.03 | DP-1 | 2.74 |
| 2-13 | HT-2 | −4.72 | cHT-1 | −5.45 | 3.18 | DP-1 | 2.74 |
| 2-14 | HT-2 | −4.72 | cHT-2 | −5.26 | 2.80 | DP-1 | 2.74 |
| 2-15 | HT-2 | −4.72 | HT-46 | −4.60 | 2.82 | DP-1 | 2.74 |

TABLE 2B

| ORGANIC EL ELEMENT | Δ HOMO (HT2-HT1) | Δ T1 (HT2-D) | EQE | SERVICE LIFE | CHROMATIC STABILITY | |
|---|---|---|---|---|---|---|
| 2-1 | −0.25 | 0.29 | 180 | 200 | 25 | PRESENT INVENTION |
| 2-2 | −0.25 | 0.28 | 115 | 75 | 85 | COMPARATIVE EXAMPLE |
| 2-3 | −0.25 | 0.23 | 55 | 30 | 85 | COMPARATIVE EXAMPLE |
| 2-4 | — | — | 100 | 100 | 100 | COMPARATIVE EXAMPLE |
| 2-5 | — | — | 80 | 55 | 90 | COMPARATIVE EXAMPLE |
| 2-6 | — | — | 35 | 15 | 90 | COMPARATIVE EXAMPLE |
| 2-7 | −0.25 | 0.28 | 165 | 155 | 25 | PRESENT INVENTION |
| 2-8 | −0.25 | 0.27 | 180 | 185 | 20 | PRESENT INVENTION |
| 2-9 | −0.24 | 0.29 | 155 | 150 | 35 | PRESENT INVENTION |
| 2-10 | −0.26 | 0.24 | 185 | 165 | 25 | PRESENT INVENTION |
| 2-11 | −0.37 | 0.29 | 175 | 180 | 30 | PRESENT INVENTION |
| 2-12 | −0.13 | 0.29 | 160 | 195 | 30 | PRESENT INVENTION |
| 2-13 | −0.73 | 0.44 | 65 | 50 | 85 | COMPARATIVE EXAMPLE |
| 2-14 | −0.54 | 0.06 | 85 | 80 | 105 | COMPARATIVE EXAMPLE |
| 2-15 | 0.12 | 0.08 | 70 | 70 | 125 | COMPARATIVE EXAMPLE |

Table 2B evidentially demonstrates that the organic EL elements of the present invention exhibit excellent efficiency, service life, and chromatic stability compared to the organic EL elements of Comparative Examples. The white element also exhibits the same effects as those in Example 1.

Example 3

<<Preparation of Organic EL Element 3-1>>

A substrate (NA45 available from NH TECHNOGLASS CORPORATION), which was a glass substrate of 100 mm by 100 mm by 1.1 mm thick provided with an anode formed of a 100 nm thick ITO (indium tin oxide) film thereon, was subjected to patterning. The resulting transparent supporting substrate provided with the transparent ITO electrode was cleaned in isopropyl alcohol with an ultrasonic cleaner, dried with nitrogen gas, and then subjected to UV/ozone cleaning for five minutes.

The transparent supporting substrate was fixed on the substrate holder in a commercially available vacuum deposition apparatus. 200 mg of HT-30 was placed in a resistively heated molybdenum boat, 200 mg of HT-2 was placed in another resistively heated molybdenum boat, 200 mg of compound 2-45 was placed in another resistively heated molybdenum boat, 200 mg of HS-1 was placed in another resistively heated molybdenum boat, 200 mg of DP-1 was placed in another resistively heated molybdenum boat, 200 mg of HS-2 was placed in another resistively heated molybdenum boat, 200 mg of cGD-1 was placed in another resistively heated molybdenum boat, 200 mg of cRD-1 was placed in another resistively heated molybdenum boat, 200 mg of compound 4-1 was placed in another resistively heated molybdenum boat. These were then attached to the vacuum deposition apparatus.

The heated boat containing HT-30 was energized and heated in a vacuum chamber evacuated to a pressure of $4 \times 10^{-4}$ Pa, and then vapor-deposited on the transparent supporting substrate at a deposition rate of 0.1 nm/sec into a hole injection layer of 10 nm.

The heated boat containing HT-2 was energized and heated, and then vapor deposited on the hole injection layer at a deposition rate of 0.1 nm/sec into a first hole transport layer of 20 nm, and the heated boat containing compound 2-45 was energized and heated and then vapor-deposited on the first hole transport layer at a deposition rate of 0.1 nm/sec into a second hole transport layer of 20 nm.

Similarly, the heated boats containing HS-1 and DP-1 were energized and heated, and then co-deposited on the second hole transport layer at a deposition rate of 0.1 nm/sec or 0.02 nm/sec, respectively, into a first light-emitting layer of 30 nm, and the heated boats containing HS-2, cGD-1, and cRD-1 were energized and heated, and then co-deposited on the first light-emitting layer at a deposition rate of 0.1 nm/sec, 0.012 nm/sec or 0.002 nm/sec, respectively, into a second light-emitting layer of 30 nm.

The heated boat containing compound 4-1 was energized and heated, and then vapor-deposited on the second light-emitting layer at a deposition rate of 0.1 nm/sec into an electron transport layer of 25 nm.

Furthermore, a cathode buffer layer of 0.5 nm containing potassium fluoride and a cathode of 110 nm containing aluminum were successively vapor-deposited on the above layers into an organic EL element 3-1.

<<Preparation of Organic EL Elements 3-2 to 3-9>>

Organic EL elements 3-2 to 3-9 were prepared as in the organic EL element 3-1 except that compounds 2-45, DP-1, and HS-1 respectively were replaced with compounds shown in Table 3A.

Tables 3A and 3B show the values of "the highest occupied molecular orbital" HOMO of the hole transport materials used in the first and second hole transport layers (HT1, HT2); the values of |HOMO (HT2)–HOMO (HT1)|=ΔHOMO; the excited triplet state energy values (T1) of blue-emitting dopants (D) used for the hole transport materials of the second hole transport layer (HT2), and for the first light-emitting layer (EML 1); and the values of |T1 (HT2)–T1 (D)|=ΔT1, the values of "the lowest unoccupied molecular orbital" LUMO of the host compounds of the second light-emitting layer (EML 2) and the electron transport materials for the electron transport layer (ET); and the values of |LUMO (H)–LUMO (ET)|. Table 3A also shows the excited triplet state energy values (T1) of the host compounds of the first light-emitting layer (EML 1).

<<Evaluation of Organic EL Elements 3-1 to 3-9>>

Each of the resulting organic EL elements was sealed as in the organic EL elements 1-1 to 1-29 in Example 1 to form an illumination device, as shown in FIGS. 5 and 6, and evaluated for chromatic stability. The results are shown in Table 3B.

TABLE 3A

| ORGANIC EL ELEMENT | HT1 COMPOUND | HT1 HOMO | HT2 COMPOUND | HT2 HOMO | HT2 T1 | FIRST EML LAYER D COMPOUND | FIRST EML LAYER D T1 | FIRST EML LAYER H COMPOUND | FIRST EML LAYER H LUMO | SECOND EML LAYER H COMPOUND | SECOND EML LAYER H LUMO |
|---|---|---|---|---|---|---|---|---|---|---|---|
| 3-1 | HT-2 | −4.72 | 2-45 | −4.97 | 3.03 | DP-1 | 2.74 | HS-1 | −1.01 | HS-2 | −1.15 |
| 3-2 | HT-2 | −4.72 | 2-45 | −4.97 | 3.03 | DP-2 | 2.75 | HS-1 | −1.01 | HS-2 | −1.15 |
| 3-3 | HT-2 | −4.72 | 2-45 | −4.97 | 3.03 | DP-77 | 2.76 | HS-1 | −1.01 | HS-2 | −1.15 |
| 3-4 | HT-2 | −4.72 | 2-47 | −4.96 | 2.98 | DP-1 | 2.74 | HS-1 | −1.01 | HS-2 | −1.15 |
| 3-5 | HT-2 | −4.72 | 2-45 | −4.97 | 3.03 | DP-1 | 2.74 | HS-2 | −1.15 | HS-2 | −1.15 |
| 3-6 | HT-2 | −4.72 | cHT-1 | −5.45 | 3.18 | DP-1 | 2.74 | HS-1 | −1.01 | HS-2 | −1.15 |
| 3-7 | HT-2 | −4.72 | cHT-2 | −5.26 | 2.80 | DP-1 | 2.74 | HS-1 | −1.01 | HS-2 | −1.15 |
| 3-8 | HT-2 | −4.72 | HT-46 | −4.60 | 2.82 | DP-1 | 2.74 | HS-1 | −1.01 | HS-2 | −1.15 |
| 3-9 | HT-2 | −4.72 | NONE | — | — | DP-1 | — | HS-1 | −1.01 | HS-2 | −1.15 |

TABLE 3B

| ORGANIC EL ELEMENT | ET COMPOUND | LUMO | Δ HOMO (HT2-HT1) | Δ T1 (HT2-D) | Δ LUMO (EML2-ET) | EQE | SERVICE LIFE | CHROMATIC STABILITY | |
|---|---|---|---|---|---|---|---|---|---|
| 3-1 | 4-1 | −1.76 | −0.25 | 0.29 | 0.61 | 175 | 210 | 25 | PRESENT INVENTION |
| 3-2 | 4-1 | −1.76 | −0.25 | 0.28 | 0.61 | 165 | 165 | 25 | PRESENT INVENTION |
| 3-3 | 4-1 | −1.76 | −0.25 | 0.27 | 0.61 | 175 | 200 | 25 | PRESENT INVENTION |
| 3-4 | 4-1 | −1.76 | −0.24 | 0.24 | 0.61 | 165 | 180 | 30 | PRESENT INVENTION |
| 3-5 | 4-1 | −1.76 | −0.25 | 0.29 | 0.61 | 155 | 225 | 25 | PRESENT INVENTION |
| 3-6 | 4-1 | −1.76 | −0.73 | 0.44 | 0.61 | 60 | 60 | 80 | COMPARATIVE EXAMPLE |
| 3-7 | 4-1 | −1.76 | −0.54 | 0.06 | 0.61 | 80 | 90 | 105 | COMPARATIVE EXAMPLE |
| 3-8 | 4-1 | −1.76 | 0.12 | 0.08 | 0.61 | 70 | 75 | 115 | COMPARATIVE EXAMPLE |
| 3-9 | 4-1 | −1.76 | — | — | 0.61 | 100 | 100 | 100 | COMPARATIVE EXAMPLE |

Table 3B evidentially demonstrates that the organic EL elements of the present invention exhibit excellent efficiency, service life, and chromatic stability compared to the organic EL elements of Comparative Examples. The same effects as those in Example 1 were also achieved for the cases of the elements composed of two light-emitting layers, and of the two light-emitting layers containing either the same or different host compounds.

INDUSTRIAL APPLICABILITY

The organic electroluminescence element of the present invention exhibits superior properties in chromatic stability over time, efficiency, and service life, and thus is suitably used of illumination devices and display devices.

REFERENCE NUMERAL LIST

1 Display
3 Pixel
5 Scanning line
6 Data line
7 Power source line
10 Organic EL element
11 Switching transistor
12 Driving transistor
13 Capacitor
A Display section
B Control section
101 Organic EL element
102 Glass cover
105 Cathode
106 Organic EL layer
107 Glass substrate provided with transparent electrode
108 Nitrogen gas
109 Water catching agent

The invention claimed is:

1. An organic electroluminescent element comprising a hole injection layer containing a hole injection material (HI), a first hole transport layer containing a first hole transport material (HT1), a second hole transport layer containing a second hole transport material (HT2), and a light-emitting layer containing a host compound (H) and a phosphorescence emitting dopant compound (D), which are laminated in this order, between an anode and a cathode,
  wherein the phosphorescence emitting dopant compound has a partial structure represented by Formula (1),
  the "highest occupied molecular orbital" HOMO of the second hole transport material satisfies the expression: −5.40<HOMO (HT2)<−4.80, and
  the relationship of triplet excitation energies (T1) between the phosphorescence emitting dopant compound and the second hole transport material satisfies the expression: T1 (HT2)−T1 (D)>0.1:

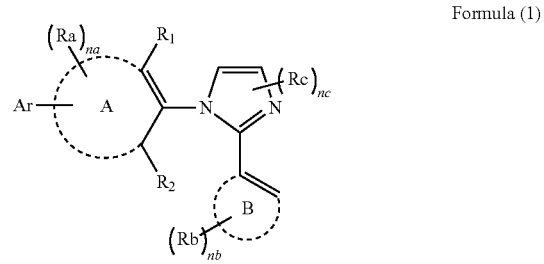

Formula (1)

where Ring A and Ring B each represent a five- or six-membered aromatic cyclic hydrocarbon or aromatic heterocycle; Ar represents an aromatic cyclic hydrocarbon, an aromatic heterocycle, a non-aromatic cyclic hydrocarbon, or a non-aromatic heterocycle; $R_1$ and $R_2$ each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group; the groups may each have a substituent; at least one of $R_1$ and $R_2$ is an alkyl group having 2 or more carbon atoms or a cycloalkyl group;
  Ra, Rb and Rc each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group, or a non-aromatic heterocycle group; the groups may each have a substituent; na and nc each represent 1 or 2; and nb represents an integer of 1 to 4.

2. The organic electroluminescent element of claim 1, wherein the relationship of the HOMOs between the first hole transport material (HT1) and the second hole transport material (HT2) satisfies the expression: −0.50<HOMO (HT2)−HOMO (HT1)<−0.10.

3. The organic electroluminescent element of claim 1, wherein the second hole transport material is represented by Formula (2):

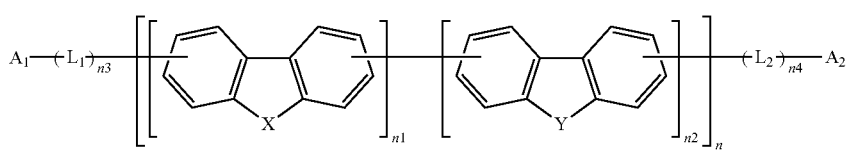

Formula (2)

where X and Y each represent O, S, or N—R (R represents a hydrogen atom or a substituent), $A_1$ and $A_2$ each represent a hydrogen atom or a substituent, $L_1$ and $L_2$ each represent a divalent linking group, n represents an integer of 1 or more, n1 and n2 represent an integer 0 or more, and n3 and n4 each represent 0 or 1 (where n1+n2≥2).

4. The organic electroluminescent element of claim 1, further comprising an electron transport layer containing an electron transport material (ET) provided at least between the light-emitting layer and the cathode,
    wherein the relationship of the "lowest unoccupied molecular orbit" LUMOs between the host compound and the electron transport material satisfies the expression: −0.40<LUMO (H)−LUMO (ET)<0.80.

5. The organic electroluminescent element of claim 4, wherein the electron transport material is represented by Formula (3):

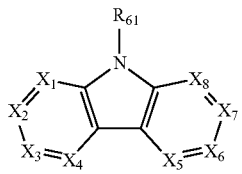

Formula (3)

where $R_{61}$ represents a hydrogen atom, an alkyl group, an aryl group, or a heteroaryl group, and $X_1$ to $X_8$ each represent N or —$CR_{62}$, and $R_{62}$ represents a hydrogen atom, an alkyl group, an aryl group, or a heteroaryl group.

6. The organic electroluminescent element of claim 4, wherein the electron transport material is represented by Formula (4):

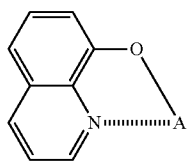

Formula (4)

where A represents Li, Be or Al.

7. The organic electroluminescent element of claim 1, wherein $R_1$ and $R_2$ in Formula (1) each represent an alkyl group having 2 or more carbon atoms or a cycloalkyl group.

8. The organic electroluminescent element of claim 1, wherein at least one of $R_1$ and $R_2$ in Formula (1) is a branched alkyl group having 3 or more carbon atoms.

9. The organic electroluminescent element of claim 1, wherein $R_1$ and $R_2$ each in Formula (1) represent a branched alkyl group having 3 or more carbon atoms.

10. The organic electroluminescent element of claim 1, wherein Ring B in Formula (1) is a benzene ring.

11. The organic electroluminescent element of claim 1, wherein Ar in Formula (1) is a benzene ring.

12. The organic electroluminescent element of claim 1, wherein Formula (1) is represented by Formula (1-1):

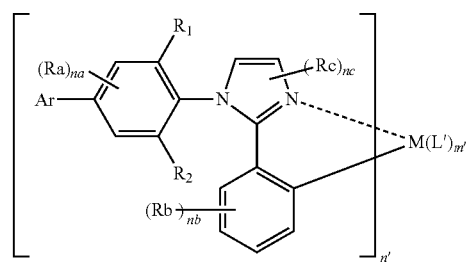

Formula (1-1)

where Ar represents an aromatic cyclic hydrocarbon, aromatic heterocycle, non-aromatic cyclic hydrocarbon or non-aromatic heterocycle; $R_1$ and $R_2$ each independently represent a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group or a non-aromatic heterocycle group; the groups may each have a substituent; at least one of $R_1$ and $R_2$ is an alkyl group having 2 or more carbon atoms or a cycloalkyl group;

Ra, Rb and Rc each independently represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic cyclic hydrocarbon group or a non-aromatic heterocycle group, the groups may each have a substituent; na and nc represent 1 or 2, and nb represents an integer of 1 to 4;

L' represents one or more monoanionic bidentate ligands which are coordinated with M; M represents a transition metal atom having an atomic number of 40 or more and belonging to groups 8 to 10 in the periodic table; m' represents an integer of 0 to 2, n' represents at least 1, and m'+n' is equal to 2 or 3.

13. The organic electroluminescent element of claim 1, wherein the organic electroluminescent element emits white light.

* * * * *